(12) United States Patent  
Limberg

(10) Patent No.: US 8,781,010 B2  
(45) Date of Patent: Jul. 15, 2014

(54) UTILIZATION OF REED-SOLOMON CODING IN MOBILE/HAND-HELD DIGITAL TELEVISION RECEIVERS

(76) Inventor: Allen LeRoy Limberg, Port Charlotte, FL (US)

(*) Notice: Subject to any disclaimer, the term of this patent is extended or adjusted under 35 U.S.C. 154(b) by 761 days.

(21) Appl. No.: 13/065,245

(22) Filed: Mar. 17, 2011

(65) Prior Publication Data

US 2011/0235723 A1    Sep. 29, 2011

Related U.S. Application Data

(60) Provisional application No. 61/340,957, filed on Mar. 25, 2010.

(51) Int. Cl.  
*H04L 5/12* (2006.01)  
*H04L 27/06* (2006.01)

(52) U.S. Cl.  
USPC .......................................... 375/262; 375/341

(58) Field of Classification Search  
USPC .................... 375/260, 262, 270, 321, 341  
See application file for complete search history.

(56) References Cited

U.S. PATENT DOCUMENTS 7,636,391 B2 * 12/2009 Choi et al. ............... 375/240.01  
7,856,651 B2 * 12/2010 Choi et al. ..................... 725/136

* cited by examiner

*Primary Examiner* — Don N Vo

(57) ABSTRACT

Receivers for recovering ancillary data from parallel concatenated convolutional coding. (PCCC) imbedded in digital television (DTV) signals can utilize the non-systematic (207, 187) Reed-Solomon (RS) codewords included in the DTV signals to facilitate DTV receivers already in the field to continue being able to receive main-service transmissions. Such a receiver attempts to decode each non-systematic (207, 187) RS codeword in a time slot selected for reception. If such RS decoding is successful, indication of such success is used to verify the correctness of bits of the ancillary data or correct them when turbo decoding the PCCC encoding ancillary data in the time slot selected for reception. The updating of ancillary data bits during cycles of turbo decoding updates the non-systematic (207, 187) RS codewords in the time slot selected for reception, increasing the likelihood of RS decoding of those RS codewords being successful during subsequent cycles of turbo decoding. If all the non-systematic (207, 187) RS codewords in the time slot selected for reception are successfully decoded before reaching a prescribed maximum number of cycles of turbo decoding, turbo decoding can be discontinued early to conserve operating power.

23 Claims, 32 Drawing Sheets

Fig. 33 A First Embodiment of the Information-exchange Unit 180

Fig. 34 A Second Embodiment of the Information-exchange Unit 180

UTILIZATION OF REED-SOLOMON CODING IN MOBILE/HAND-HELD DIGITAL TELEVISION RECEIVERS

This application claims the benefit of the filing date of provisional U.S. Pat. App. Ser. No. 61/340,957 filed 25 Mar. 2010.

The invention relates to mobile and hand-held receivers for digital television (DTV) signals broadcast over the air broadcasting, commonly referred to collectively as "M/H" receivers.

BACKGROUND OF THE INVENTION

The Advanced Television Systems Committee (ATSC) published a Digital Television Standard in 1995 as Document A/53, hereinafter referred to simply as "A/53" for sake of brevity. Annex D of A/53 titled "RF/Transmission Systems Characteristics" is of particular relevance to this specification, defining many of the terms employed herein. In the beginning years of the twenty-first century, efforts were made to provide for more robust transmission of data over broadcast DTV channels without unduly disrupting the operation of so-called "legacy" DTV receivers already in the field. These efforts culminated in an ATSC standard directed to broadcasting data to mobile receivers being adopted on 15 Oct. 2009. This standard, referred to as "A/153" herein, is also relevant to this specification, defining many of the terms employed herein. The data for concatenated convolutional coding are commonly referred to as "M/H data" in reference to the mobile and handheld receivers that will receive such data.

Both A/53 and A/153 are directed to 8-VSB signals being used in DTV broadcasting. A radio-frequency (RF) 8-VSB signal is transmitted by vestigial-sideband amplitude modulation of a single carrier wave in accordance with an 8-level modulating signal that encodes 3-bit symbols descriptive of 2-bit symbols of the digital data to be transmitted. The three bits in the 3-bit symbols are referred to as Z-sub-2, Z-sub-1 and Z-sub-0 bits. The initial and final bits of each successive 2-bit symbol of the digital information are referred to as an X-sub-2 bit and as an X-sub-1 bit, respectively. The X-sub-2 bits are subjected to interference-filter pre-coding to generate the Z-sub-2 bits, which Z-sub-2 bits can be post-comb filtered in a DTV receiver to recover the X-sub-2 bits. The Z-sub-1 bits correspond to the X-sub-1 bits. The Z-sub-0 bits are redundant bits resulting from one-half-rate convolutional coding of successive X-sub-1 bits to provide two-thirds-rate trellis coding as prescribed by A/53.

A/53 prescribes (207, 187) Reed-Solomon forward-error-correction (RS FEC) coding of data followed by convolutional byte interleaving before two-thirds-rate trellis coding that employs one-half-rate convolutional coding of the less significant bits of successive two-bit symbols of data. It is a common practice in the digital coding arts to precede convolutional coding by RS FEC coding and byte interleaving of the RS FEC codewords. In a receiver the decoding of the convolutional coding is apt to contain burst errors caused by the decoding procedures stretching response to bit errors. De-interleaving the burst errors breaks protracted burst errors up into isolated byte errors that can often be corrected in reliance upon the RS FEC coding. Usual practice is to complete decoding of the convolutional coding before subsequent de-interleaving, to break up burst errors into isolated byte errors, and decoding of the RS FEC coding, to correct the isolated byte errors if there are not too many per RS FEC codeword.

A/153 prescribes serial concatenated convolutional coding (SCCC) of data transmitted to mobile receivers, which SCCC uses one-half-rate outer convolutional coding upon such data followed by symbol-interleaving and two-thirds-rate trellis coding similar to that prescribed by A/53. The one-half-rate convolutional coding incorporated within the two-thirds-rate trellis coding serves as one-half-rate inner convolutional coding in the SCCC. A/153 further prescribes additional forward-error-correction coding of the data transmitted to mobile receivers, which additional FEC coding comprises transverse Reed-Solomon (TRS) coding combined with lateral cyclic-redundancy-check (CRC) codes which an M/H can use to locate byte errors for the TRS coding. The principal design task for the transverse Reed-Solomon (TRS) coding used in the RS Frames prescribed by A/153 is overcoming drop-outs in received strength caused by reception nulls when the receiver is moved through an electromagnetic field subject to multipath signal propagation. The strongest TRS codes prescribed by A/153 can overcome momentary drop-outs in received signal strength that are as long as four tenths of a second. Furthermore, the shortened 255-byte Reed-Solomon (RS) codes used for TRS coding are very powerful codes for correcting shorter burst errors, especially when used together with codes for locating byte-errors.

A/153 prescribes that the M/H-service information be subjected to outer convolutional coding and symbol interleaving before encapsulation in 188-byte transport-stream (TS) packets called "MHE packets" that are subjected to non-systematic (207, 187) Reed-Solomon coding to generate selected segments of 8-VSB data fields. These segments of 8-VSB data fields are time-division multiplexed with other segments generated by systematic (207, 187) Reed-Solomon coding of 188-byte TS packets of main-service information. The bytes of the resulting 8-VSB data fields are convolutionally interleaved before being subjected to the 2/3 trellis coding that functions as inner convolutional coding of the SCCC used for transmissions to M/H receivers. All the segments of 8-VSB data fields have (207, 187) Reed-Solomon coding to insure that DTV receivers already in the field continue usefully to receive main-service information.

Some of those "legacy" DTV receivers place themselves in a "sleeping" mode if their decoders for (207, 187) R-S coding find a large enough portion of the segments of 8-VSB data fields to contain byte errors that cannot be corrected. The parity bytes of non-systematic (207, 187) Reed-Solomon coding of MHE packets was originally regarded to be a loss of digital payload that was unfortunately necessitated to accommodate these "legacy" DTV receivers. U.S. patent application Ser. No. 12/931,688 filed 8 Feb. 2011 by A. L. R. Limberg and titled "Utilization of non-systematic (207, 187) Reed-Solomon coding in mobile/handheld digital television receivers" describes the non-systematic (207, 187) Reed-Solomon coding being utilized during the turbo decoding of SCCC to recover M/H-service data.

U.S. patent application Ser. No. 12/928,186 filed 6 Dec. 2010 by A. L. R. Limberg and titled "Broadcasting of concatenated-convolutional-coded data by one or more digital television transmitters for diversity reception" advocates that the M/H-service signals be composed of X-sub-2, Z-sub-1 and Z-sub-2 bits. This, rather than being composed of Z-sub-2, Z-sub-1 and Z-sub-2 bits. The interference-filter pre-coding of the X-sub-2 bits to generate Z-sub-2 bits that A/53 and A/153 prescribe is selectively discontinued during the concatenated convolutional coding (CCC) used for transmission of M/H-service signals. This permits parallel concatenated convolutional coding (PCCC) of data transmitted to M/H receivers. This PCCC uses one-half-rate outer convolutional coding of M/H data followed by symbol-interleaving and two-thirds-rate trellis coding similar to that prescribed by A/53. The Z-sub-1 bits convey the M/H data in the PCCC. The X-sub-2 bits provide one of the two sets of parity bits for the PCCC, and the Z-sub-0 bits provide the other set of parity bits for the PCCC.

U.S. patent application Ser. No. 12/928,186 describes the X-sub-2 bits in the final 185 bytes of the MHE packets as not being subjected to interference-filter pre-coding. Just the X-sub-2 bits in the initial two bytes of the MHE packets are subjected to interference-filter pre-coding. This enables legacy DTV receivers to identify the MHE packets as being of a type those receivers are to disregard when assembling a transport stream (TS) of MPEG-2 data packets.

Utilization of the non-systematic (207, 187) RS coding during turbo decoding to recover M/H-service data from PCCC described in U.S. patent application Ser. No. 12/928, 186 presents a different problem than its utilization to recover M/H-service data from SCCC, as prescribed by A/153. This is because the X-sub-2 bits in the MHE data packet are not subjected to interference-filter pre-coding to generate Z-sub-2 bits, when generating PCCC as described in U.S. patent application Ser. No. 12/928,186. So, contrary to what is described in U.S. patent application Ser. No. 12/931,688, the M/H receivers described in U.S. patent application Ser. No. 12/928,186 do not employ post-comb filtering of the baseband 8-VSB signal supplied for turbo decoding. Accordingly, M/H Group data temporarily stored in memory to support decoding of the inner convolutional coding of CCC, cannot be scanned with suitable addressing to supply useful input signal to a decoder for non-systematic (207, 187) RS coding. The problem is not with generating suitable addressing to supply byte de-interleaved bytes of input signal to the decoder for non-systematic (207, 187) RS coding. The problem is that signal read from the memory has not been post-comb filtered, as it would be post-comb filtered in a legacy DTV receiver. The signal will not comprise a series of non-systematic (207, 187) RS codewords susceptible of being decoded by the decoder for non-systematic (207, 187) RS coding.

Supposing that the decoder for non-systematic (207, 187) RS coding were supplied a series of non-systematic (207, 187) RS codewords susceptible of being decoded, a further problem is presented that does not arise when non-systematic (207, 187) RS coding is utilized during turbo decoding to recover M/H-service data from PCCC. This further problem concerns how to over-write the memory, supposing that the decoder for non-systematic (207, 187) RS coding is able to correct one or more erroneous bytes in a non-systematic (207, 187) RS codeword. This problem arises because the non-systematic (207, 187) RS codewords are recoverable from post-comb filtered baseband 8-VSB signal after its being de-interleaved in the receiver to complement the convolutional byte interleaving performed at the transmitter. However, the memory to support turbo decoding to recover M/H-service data from PCCC temporarily stores symbols of baseband 8-VSB signal that have not been post-comb filtered in the receiver, not needing to have been since there was no interference-filter pre-coding of the MHE packets at the transmitter.

SUMMARY OF THE INVENTION

The inventor has perceived that the non-systematic (207, 187) Reed-Solomon codewords contain valuable information concerning the correctness of the outer convolutional coding of the parallel concatenated convolutional coding (PCCC) that U.S. patent application Ser. No. 12/928,186 describes for transmitting M/H-service data. In M/H receivers embodying aspects of the invention the results of decoding non-systematic (207, 187) Reed-Solomon coded MHE packets are used to influence the soft decisions concerning bits of the PCCC that arise during PCCC decoding procedures. In M/H receivers embodying one aspect of the invention, the non-systematic (207, 187) Reed-Solomon coded MHE packets are decoded before turbo decoding the PCCC concerning the M/H service data. In M/H receivers embodying another aspect of the invention, the non-systematic (207, 187) Reed-Solomon coded MHE packets are decoded during turbo decoding the PCCC concerning the M/H service data. In M/H receivers embodying yet another aspect of the invention, the results of decoding non-systematic (207, 187) Reed-Solomon coded MHE packets are employed to stop iterative PCCC decoding procedures when satisfactory decoding results are achieved before having performed a prescribed maximum number of iterations. In M/H receivers embodying still another aspect of the invention, the results of decoding non-systematic (207, 187) Reed-Solomon coded MHE packets are employed to correct errors in the PCCC. Yet another aspect of the invention is the use of a banked turbo decoder memory for communicating information between the various components of the turbo decoding apparatus.

BRIEF DESCRIPTION OF THE DRAWINGS

FIG. 10 is a drawing showing that a gated trellis decoder operative only during PCCC signaling can replace the cascade connection of trellis decoder and PCCC gate in the FIG. 2 portion of M/H receiver apparatus.

FIG. 11 is a schematic diagram of a gated trellis decoder operative only during PCCC signaling, which gated trellis decoder is used in a modification of the FIG. 2 portion of M/H receiver apparatus.

FIG. 12 is a schematic diagram of a modification of the FIG. 3 turbo decoding apparatus in which the results of decoding CRC codes are used to adjust the confidence levels of soft M/H data bits prior to decoding outer convolutional coding during each cycle of decoding SCCC.

DETAILED DESCRIPTION

Figure 1:
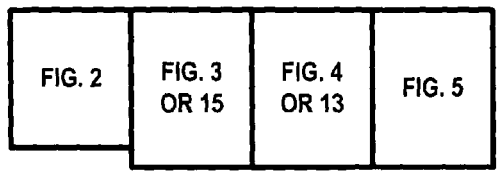
FIG. 1 is an assembly drawing that shows how FIG. 2, FIG. 3 or 6, FIG. 4 or 7, and FIG. 5 combine to provide various schematic diagrams of M/H receiver apparatuses for receiving M/H transmissions sent over the air as PCCC portions of an 8-VSB signal as used in digital television broadcasting, each which receiver apparatus is novel and embodies aspects of the invention.

FIG. 1 is an assembly drawing that shows how FIG. 2, FIG. 3 or 15, FIG. 4 or 7, and FIG. 5 combine to provide detailed schematic diagrams of various DTV receiver apparatuses for receiving M/H transmissions sent over the air as PCCC portions of an 8-VSB signal as used in digital television broadcasting. These transmissions are as described in detail by U.S. patent application Ser. No. 12/928,186 titled "Broadcasting of concatenated-convolutional-coded data by one or more digital television transmitters for diversity reception" and also by U.S. patent application Ser. No. 12/928,187 titled "Coding and decoding of 8-VSB digital television signals for mobile/handheld receivers", both filed 6 Dec. 2010 by A. L. R. Limberg.

Figure 2:
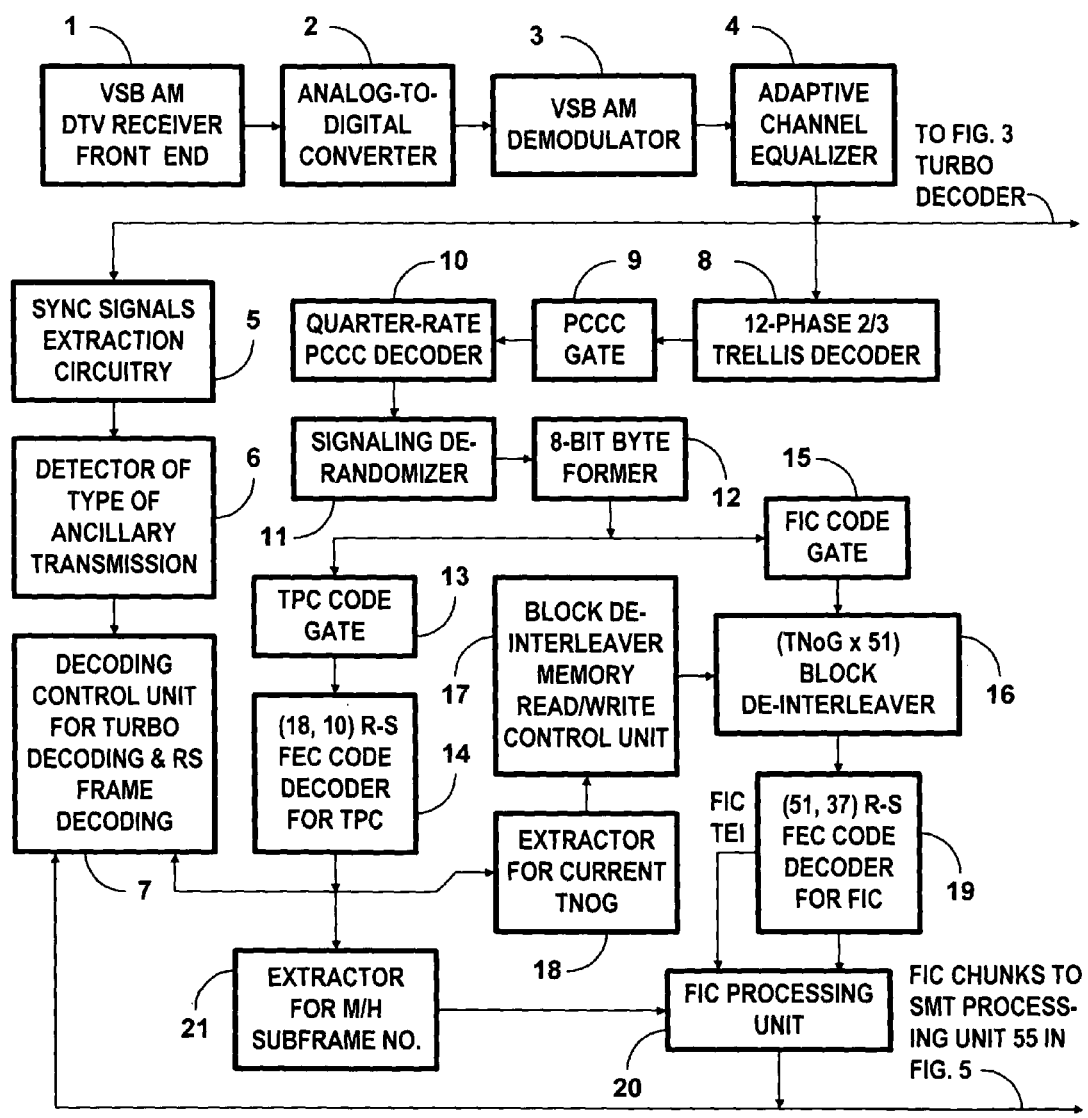
FIG. 2 is a schematic diagram of portions of M/H receiver apparatus to recover baseband digital television signal, transmission parameter channel (TPC) signal and fast information channel (FIC) signal.

The FIG. 2 portion of DTV receiver apparatus includes a vestigial-sideband amplitude-modulation (VSB AM) DTV receiver front-end 1 for selecting a radio-frequency (RF) DTV signal for reception, converting the selected RF DTV signal to an intermediate-frequency (IF) DTV signal, and for amplifying the IF DTV signal. An analog-to-digital converter 2 is connected for digitizing the amplified IF DTV signal supplied from the DTV receiver front-end 1. A demodulator 3 is connected for demodulating the digitized VSB AM IF DTV signal to generate a digitized baseband DTV signal. The receiver front-end 1, the ADC converter 2, and the VSB AM demodulator 3 combine to provide conversion apparatus for receiving a selected 8VSB signal as transmitted in 8VSB modulation of an RF carrier wave within a respective frequency channel and converting it to digital samples of a baseband signal. (Equivalent circuitry that digitizes baseband signal after analog demodulation of VSB AM signal is used in alternative embodiments of the DTV receiver apparatus.) The VSB AM demodulator 3 is connected to supply digital samples of a baseband signal to an adaptive channel-equalizer 4 for equalization of channel response. Synchronization signals extraction circuitry 5 is connected for receiving the response of the adaptive channel-equalizer 4. Responsive to data-field-synchronization (DFS) signals, the sync extraction circuitry 5 detects the beginnings of data frames and fields. Responsive to data-segment-synchronization (DSS) signals, the sync extraction circuitry 5 detects the beginnings of data segments. The FIG. 1 DTV receiver apparatus uses the DSS and DFS signals for controlling its operations similarly to the way this is conventionally done in DTV receivers. None of FIGS. 2, 3, 4 and 5 explicitly shows the circuitry for effecting these operations.

A decoder 6 for detecting the type of ancillary transmission responds to 8-bit sequences contained in final portions of the reserved portions of DFS signals separated by the sync extraction circuitry 5. The decoder 6 is connected for indicating the type of ancillary transmission to a decoding control unit 7 that controls turbo decoding of PCCC and plural-dimensional decoding of RS Frames in the FIG. 1 DTV receiver apparatus. The type of ancillary transmission that the decoder 6 detects is apt to be one that conditions the decoder 6 to extract further information concerning the ancillary transmission from the initial portions of the reserved portions of DFS signals separated by the sync extraction circuitry 5. The decoder 6 is connected for supplying such further information to the decoding control unit 7. Most of the connections of the decoding control unit 7 to the elements involved in these decoding procedures are not explicitly shown in FIGS. 2, 3 and 4, so as to keep those figures from being too cluttered to be understood readily.

FIG. 2 shows a 12-phase trellis decoder 8 connected for receiving the response of the channel equalizer 4. The 12-phase trellis decoder 8 is connected for supplying trellis-decoding results to a PCCC gate 9 connected for extracting the PCCC'd signaling within each Group and reproducing the PCCC'd signaling for application as input signal to a decoder 10 for quarter-rate PCCC. The decoder 10 reproduces randomized signaling decoded (possibly with some errors) from the quarter-rate PCCC supplied thereto and is connected for supplying that randomized signaling as input signal to a signaling de-randomizer 11. The signaling de-randomizer 11 is connected for supplying de-randomized signaling to an 8-bit byte former 12. A TPC code gate 13 is connected for extracting bytes of TPC code from bytes of the de-randomized signaling supplied by the byte former 12 and supplying those extracted bytes of TPC code as input signal to a decoder 14 for (18, 10) Reed-Solomon coding. The decoder 14 recovers TPC information and is connected for supplying the TPC information to the decoding control unit 7 and to other elements of the receiver apparatus. The decoding control unit 7 is able to respond to the TPC information to control selection of the type of outer convolutional decoding to be used on SCCC portions of each M/H Group.

FIG. 2 shows an FIC code gate 15 connected for extracting byte-interleaved FIC code bytes from the bytes of de-randomized signaling supplied by the byte former 12 and reproducing those extracted bytes for application as input signal to a block de-interleaver 16. The block de-interleaver 16 is of matrix type and complements the block interleaving done at the transmitter, as prescribed in A/153. In this specification (over)writing refers both to memory writing procedures in which storage locations are empty of content when written by new content and to memory writing procedures in which storage locations have their original contents overwritten by new content. The block de-interleaver 16 is essentially a byte-organized random access memory (RAM) with byte-storage locations arrayed in rows and columns to be (over)written and read in accordance with addressing and read/write control signals supplied from a block de-interleaver memory read/write control unit 17. The byte-storage locations are arrayed in 51-byte rows for being (over)written by RS-coded FIC data from respective Groups within each M/H subFrame. The memory read/write control unit 17 needs to know the total number of Groups, TNoG, within each M/H subFrame in order to know the number of these 51-byte rows. The memory read/write control unit 17 uses this knowledge to control the addressing of successive columns of TNoG byte-storage locations when writing to them. An extractor 18 is connected to extract TNoG for the current M/H subFrame (current_TNoG) from the response of the decoder 14 of the (18, 10) Reed-Solomon coded TPC data. The value of current_TNoG appears NoG times in the TPC data recovered by the decoder 14 from the previous M/H Sub-Frame. The extractor 18 selects from the TPC data those bit sequences descriptive of current_TNoG estimates and decides the value of current_TNoG based on the majority of concurring estimates. The extractor 18 is connected to supply that value of current_TNoG to the memory read/write control unit 17.

After the final Group of each M/H subFrame concludes, the memory read/write control unit 17 generates read addresses for reading rows of 35×TNoG bytes from the RAM in the block de-interleaver 16. The reading is completed before the initial Group of the next M/H Sub-Frame begins and the contents of the memory in the block de-interleaver 16 will be overwritten. The block de-interleaver 16 is connected for supplying its de-interleaved FIC code response as input signal to a decoder 19 for (51, 37) Reed-Solomon coding. The decoder 19 recovers FIC information and is connected for supplying that FIC information to an FIC processing unit 20 together with a respective FIC Transport Error Indication (TEI) bit concerning each (51, 37) Reed-Solomon codeword. The FIC TEI bit generated by the decoder 19 is a ONE whenever byte error(s) that cannot be corrected are detected within a (51, 37) Reed-Solomon codeword, but is a ZERO if such byte error(s) are not detected. E. g., an FIC TEI bit is likely to be generated if there is a momentary fade in received radio-frequency signal strength.

An extractor 21 extracts the current Sub-Frame number from the response of the decoder 14 of the (18, 10) Reed-Solomon coded TPC data and supplies that M/H Sub-Frame number to the FIC-Chunk processing unit 20. The current M/H subFrame number appears NoG times in the TPC data recovered by the decoder 14 from the current M/H Sub-Frame. The extractor 21 selects from the TPC data those bit sequences descriptive of current M/H subFrame number estimates and decides the value of current M/H Sub-Frame number based on the majority of concurring estimates. The current M/H Sub-Frame number aids the FIC-Chunk processing unit 20 in its parsing of FIC Chunks, particularly the extended FIC Chunks, that the decoder 19 for (51, 37) Reed-Solomon coding supplies. The FIC-Chunk processing unit 20 is connected for supplying processed FIC Chunks to the decoding control unit 7. (FIG. 2 indicates that processed FIC Chunks from the FIC-Chunk processing unit 20 are supplied to an SMT-MH processing unit 55 shown in FIG. 5, where they are integrated with SMT-MH information during the generation of Service Map Data written to a memory 56 for temporary storage therewithin.)

Figure 3:
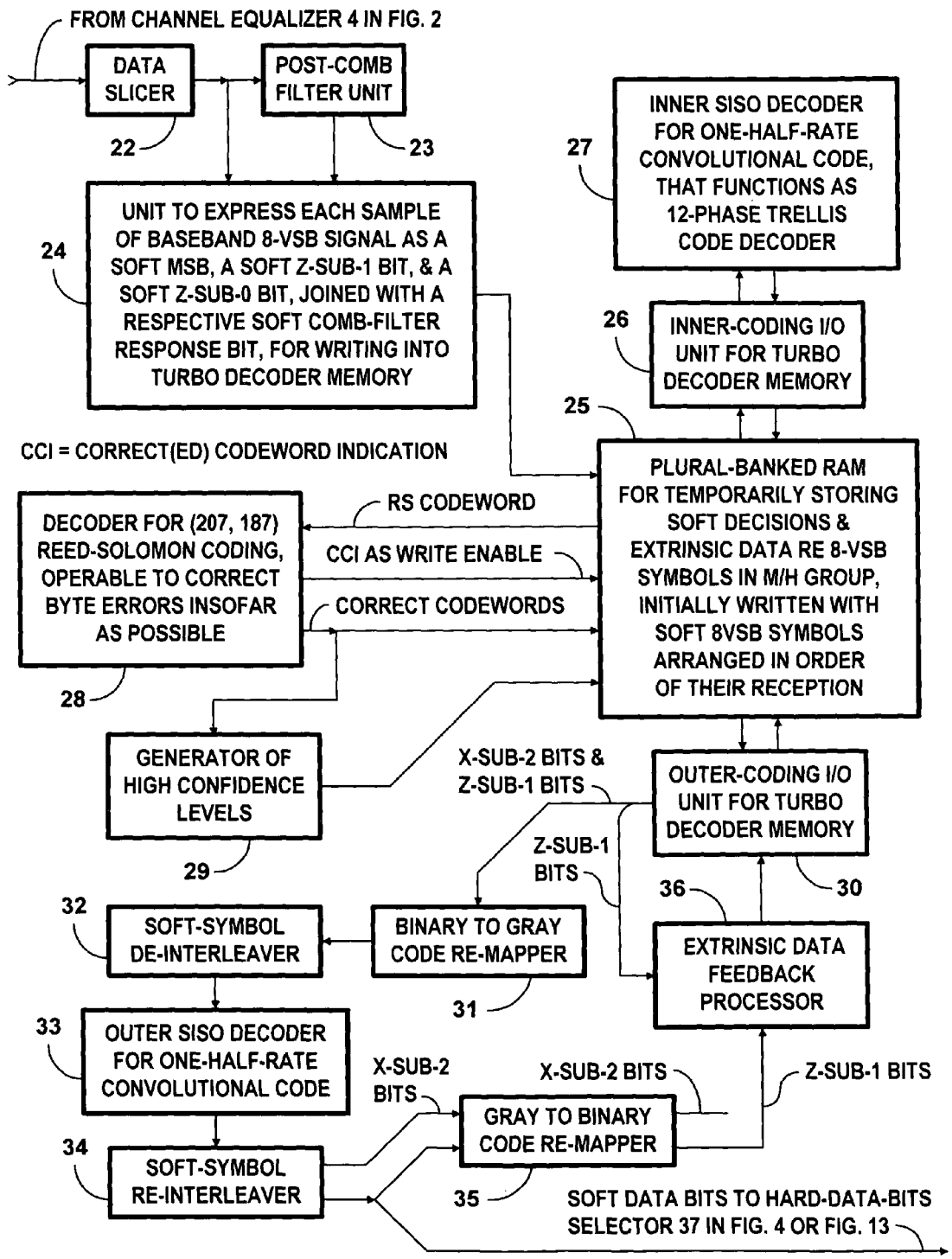
FIG. 3 is a schematic diagram of a novel portion of M/H receiver apparatus for turbo decoding PCCC portions of baseband 8-VSB digital television signal to recover portions of transverse Reed-Solomon (TRS) codewords, which FIG. 3 portion of the M/H receiver apparatus provides improved turbo decoding in accordance with aspects of the invention.

FIG. 3 shows the turbo decoding circuitry for PCCC transmissions that transmit M/H-service data at one-half the code rate of the 2/3 trellis coding of ordinary 8-VSB DTV data. The soft-input/soft-output (SISO) decoders used in the turbo decoding preferably use the sliding-window log-MAP algorithm. The term "log-MAP" is short for " logarithmic maximum a posteriori". The underlying turbo decoding procedure that is modified as disclosed herein was described by M. C. Valenti and J. Sun in a paper titled "The UMTS Turbo Code and an Efficient Decoder Implementation Suitable for Software-Defined Radios" in International Journal of Wireless Information Networks, Vol. 8, No. 4, October 2001, pp. 203-215. The FIG. 3 turbo decoding circuitry employs a novel turbo decoder memory for mediating the flow of information between the SISO decoder used for decoding the inner convolutional coding of the PCCC and the SISO decoder used for decoding the outer convolutional coding of the PCCC. In accordance with a principal aspect of the invention disclosed herein, this turbo decoder memory also supports the interchange of information contained in non-systematic (207, 187) RS codewords with a decoder for such RS codewords.

The adaptive channel-equalizer 4 in FIG. 2 is connected to supply its response at Nyquist rate to the input port of a data slicer 22 in FIG. 3. The output port of the data slicer 22 is connected for supplying a response therefrom to the input port of a post-comb filter unit 23. The output port of the data slicer 22 is also connected to a first input port of a unit 24 for expressing each sample of baseband 8-VSB signal as three soft bits supplied in parallel with a respective soft bit of post-comb filter unit 23 response. FIG. 3 shows a second input port of the unit 24 connected for receiving soft bit of post-comb filter unit 23 response from the output port of the post-comb filter unit 23. The unit 24, which essentially is just a set of wired connections, supplies four parallel streams of soft bits for writing a random-access memory 25 via respective random-access ports thereof. A first stream of soft bits in the unit 24 response is composed of soft most significant bits (MSBs) of 8-VSB symbols, as determined by the data slicer 22. The soft MSBs in this first stream that are from the third through 187th bytes of an MHE packet will be soft X-sub-2 bits. The other soft MSBs in this first stream that are from the initial two bytes of MHE packets, from MPEG-2 data packets other than MHE packets and from parity bytes of RS coding will be soft Z-sub-2 bits resulting from interference-filter pre-coding at the 8-VSB transmitter. A second stream of soft bits in the unit 24 response is composed of soft Z-sub-1 bits as determined by the data slicer 22. A third stream of soft bits in the unit 24 response is composed of soft Z-sub-0 bits as determined by the data slicer 22. A fourth stream of soft bits in the unit 24 response is composed of soft bits of post-comb filter unit 23 response.

The RAM 25 used as turbo decoder memory has a banked structure with respective banks for temporarily storing different types of digital information, the banks having respective addressable storage locations which are addressed in common with each other. Each bank has a respective random-access port, and it is convenient for certain of the banks to be plural-ported with at least one respective serial-output port. A first bank of the RAM 25 temporarily stores the most significant bits (MSBs) concerning all of the Nyquist-rate baseband samples in at least the 170 data segments of a single M/H Slot. (These 170 data segments are referred to collectively as an "M/H Slot" in this specification, besides "M/H Slot" describing the time interval occupied by those 170 data segments.) A second bank of the RAM 25 temporarily stores Z-sub-1 soft bits concerning all of the Nyquist-rate baseband samples in at least the 170 data segments of a single M/H Slot. A third bank of the RAM 25 temporarily stores Z-sub-0 soft bits concerning all of the Nyquist-rate baseband samples in at least the 170 data segments of the single M/H Slot. A fifth bank of the RAM 25 temporarily stores soft bits of comb-filter response to the most significant bits (MSBs) of the Nyquist-rate baseband samples in at least the 170 data segments of a single M/H Slot. A fourth bank of the RAM 25 temporarily stores soft extrinsic data concerning the soft Z-sub-1 bits in the outer convolutional coding of the PCCC in the single M/H Slot. Those soft Z-sub-1 bits not included in the outer convolutional coding of the PCCC in the single M/H Slot will never have respective extrinsic data associated therewith, so the fourth bank of the RAM 25 can have all-zero data permanently stored in storage locations for the addresses associated with those soft Z-sub-1 bits. Alternatively, those storage locations can temporarily store all-zero data entered during a bulk erasure of the turbo decoder memory contents before an M/H Slot is selected for reception.

During an initial portion of each cycle of turbo decoding, an inner-coding input/output unit 26 selectively connects the RAM 25 with an inner soft-input/soft-output decoder 27 for one-half-rate convolutional coding. The RAM 25 reads the soft Z-sub-1 bits and the soft Z-sub-1 bits of the 170 successive convolutionally byte-interleaved data segments of an M/H Group to the inner-coding I/O unit 26, which responds to supply input signal to the SISO decoder 27. Paired soft Z-sub-1 bits and soft Z-sub-0 bits from each 8-VSB symbol are read from the RAM 25 in the order they were originally received, together with most significant bit (MSB) of the 8-VSB symbol being read to the input port of the post-comb filter unit 23. The SISO decoder 27 decodes the one-half-rate convolutional coding used in the two-thirds-rate trellis coding of main-service data and used as the inner convolutional coding of the PCCC transmitting M/H-service data. (The intermixture of coding for main-service data with the inner convolutional coding of the PCCC presents a decoding problem peculiar to the transmission of M/H-service data time-division multiplexed with main-service data in 8-VSB DTV broadcasting.) The 2-bit symbols of the inner convolutional coding, each composed of respective Z-sub-1 and Z-sub-0 soft bits, are read from the RAM 25 along with any extrinsic data concerning the soft Z-sub-1 bits. Any extrinsic data concerning the soft Z-sub-1 bits in PCCC transmission are additively combined with the soft Z-sub-1 bits in the inner-coding I/O unit 26 to generate adjusted soft Z-sub-1 bits. The inner-coding I/O unit 26 supplies these adjusted soft Z-sub-1 bits, along with Z-sub-0 soft bits as read from the RAM 25, in a stream of soft 2-bit symbols supplied to the SISO decoder 27 as input signal. The SISO decoder 27 is connected to supply at least the soft Z-sub-1 bits in its decoding results to the inner-coding I/O unit 26. The inner-coding I/O unit 26 applies these soft Z-sub-1 bits to the random-access port of the RAM 25 as at least part of a write input signal that over-writes the Z-sub-1 bits previously stored in the RAM 25.

In accordance with an aspect of the invention, during at least some cycles of turbo decoding the M/H Group, preferably including the initial cycle of turbo decoding the M/H Group, sequences of 1656 soft bits apiece that are temporarily stored in the RAM 25, which sequences respectively relate to ones of the 118 non-systematic (207, 187) RS codewords of an M/H Group, are read from the RAM 25 to an RS decoder 28 for those codewords before proceeding to decoding the outer convolutional coding. Each sequence of 1656 bits is composed of bits of post-comb filter response to soft MSBs of a non-systematically Reed-Solomon coded MHE packet alternating with soft Z-sub-1 bits of that non-systematically Reed-Solomon coded MHE packet. The scanning of the addressable storage locations in the RAM 25 during this reading to the RS decoder 28 for non-systematic (207, 187) RS codewords is such as to de-interleave the convolutional byte interleaving of these codewords that was done at the 8-VSB transmitter. Reading is from selected storage locations in the second and fifth banks of addressable storage locations in the RAM 25 that store soft bits related to non-systematic (207, 187) RS codewords.

The RS decoder 28 is associated with a generator 29 of high confidence levels for the bits of correct(ed) non-systematic (207, 187) RS codewords. The generator 29 generates a high confidence level, at least the leading bits of which are ONEs, responsive to each ONE in an RS codeword corrected by the RS decoder 28. The generator 29 generates a high confidence level, at least the leading bits of which are ZEROes, responsive to each ZERO in an RS codeword corrected by the RS decoder 28. The generator 29 is connected for supplying these high confidence levels as write input signal to the RAM 25 concurrently with the bits of the RS codeword that governed the generation of these confidence levels. This writing over-writes the selected storage locations in the second and fifth banks of addressable storage locations in the RAM 25 for storing Z-sub-1 bits and soft bits of comb-filter response to MSBs, respectively, that are related to non-systematic (207, 187) RS codewords. This writing is done via the respective random-access input ports of those second and fifth banks of addressable storage locations.

If the RS decoder 28 finds a non-systematic (207, 187) RS codeword to contain few enough byte errors that they can be corrected, the byte errors in the RS codeword are corrected. Correct or corrected RS codewords are referred to generically as correct(ed) RS codewords in this specification and its claims. After attempting to decode each non-systematic (207, 187) RS codeword read thereto from the RAM 25, the RS decoder 28 generates a respective bit indication as to whether or not that RS codeword is correct or has been corrected. This bit indication is referred to as a "correct(ed) codeword indication" or "CCI" in this specification. This bit indication is referred to as "CCI" in FIGS. 3 and 15 of the accompanying drawing. The CCI bit is the complement of the transfer error indication (TEI) bit commonly associated with the decoding of Reed-Solomon-coded MPEG-2 packets, but unlike the TEI bit is not included in a data packet. The CCI bit is applied to the RAM 25 as a selective WRITE ENABLE signal for the second and fifth banks of memory that respectively store Z-sub-1 bits and soft bits of comb-filter response to MSBs. If the RS decoder 28 was able to correct the non-systematic (207, 187) RS codeword or found the codeword already to be correct, the CCI bit is a ONE. This ONE conditions the second and fifth banks of memory that respectively store Z-sub-1 bits and soft bits of comb-filter response to MSBs to be over-written by updating Z-sub-1 bits and by updating bits of comb-filter response, respectively. The hard-decision bits of the updating soft Z-sub-1 bits and the updating soft Z-sub-1 bits are supplied from the RS decoder 28, and each of these hard-decision bits is accompanied by further bits supplied the generator 29 of high confidence levels. The WRITE ENABLE signal is maintained a ONE for a long enough time for the RS decoder 28 to write a correct(ed) non-systematic (207, 187) RS codeword back to the RAM 25. If the RS decoder 28 found the non-systematic (207, 187) RS codeword to contain too many erroneous bytes to be susceptible of correction, the CCI bit is a ZERO. This ZERO conditions the second and fifth banks of memory that respectively store Z-sub-1 bits and soft bits of comb-filter response to MSBs not to be over-written by updating Z-sub-1 bits and by updating bits of comb-filter response.

The scanning of the addressable storage locations in the RAM 25 during the writing back of correct(ed) non-systematic (207, 187) RS codewords and high confidence levels for each of their bits is such as to re-interleave these codewords and restore the convolutional byte interleaving of them that was done at the 8-VSB transmitter. The CCI bit is a ONE providing WRITE ENABLE signal to the second and fifth banks of addressable storage locations in the RAM 25 during this updating procedure.

The replacement of the non-systematic (207, 187) RS codeword previously stored in the RAM 25 with a corrected codeword updates supposedly erroneous comb-filtered X-sub-2 parity bits of the PCCC used to transmit M/H-service data. These bits by reason of their being comb-filtered are not useful in turbo decoding procedures, at least not directly. Accordingly, in a preferred variation of what is described supra, the contents of the fifth bank of addressable storage locations in the RAM 25 are not updated as a result of the decoding procedures performed by the RS decoder 28. This saves some operating power and reduces heating of an integrated-circuit chip in which the RAM 25 is located. Updating of the contents of the fifth bank of addressable storage locations in the RAM 25 can be forestalled simply by not supplying the CCI bit to that bank as a WRITE ENABLE signal.

When the CCI bit is a ZERO, withholding WRITE ENABLE signal from the RAM 25, it is simplest for the addressable storage locations in the RAM 25 still to be scanned as though they were to be updated. That is, scanning is such as would re-interleave the uncorrected RS codewords and restore the convolutional byte interleaving of them that was done at the 8-VSB transmitter. In sophisticated designs the scanning of the addressable storage locations in the RAM 25 for each uncorrected non-systematic (207, 187) RS codeword can skipped responsive to the CCI bit being a ZERO.

The outer convolutional coding of the PCCC used to transmit M/H service data is decoded subsequent to each procedure for decoding the Z-sub-1 and Z-sub-0 bits of (inner) convolutional coding in the 170-data-segment M/H Slot that contains an M/H Group. Decoding of the outer convolutional coding is deferred in at least some cycles of turbo decoding an M/H Group until the completion of an intervening procedure for decoding the 118 non-systematic (207, 187) RS codewords of the M/H Group. In any cycle that skips such intervening procedure, decoding of the outer convolutional coding of the M/H Group proceeds immediately following the completion of decoding the Z-sub-1 and Z-sub-0 bits of (inner) convolutional coding in the M/H Slot selected for reception.

Outer coding input/output circuitry 30 is used for accessing selected portions of the RAM 25 that contain soft-decisions related to the interleaved outer convolutional coding of the PCCC. Responsive to control by the decoding control unit 7, the input/output circuitry 30 is operable to read soft symbols of the reproduced symbol-interleaved outer convolutional coding of the PCCC from the RAM 25 to the input port of a binary-to-Gray code re-mapper 31. Soft MSBs that are soft X-sub-2 bits are read from selected portions of the first bank of addressable storage locations in the RAM 25, and soft Z-sub-1 bits are read from selected portions of the second bank of addressable storage locations in the RAM 25. U.S. patent application Ser. No. 12/928,187 discloses a preferred structure for a binary-to-Gray code re-mapper in reference to FIGS. 38 and 39 of its drawing. The binary-to-Gray code re-mapper 31 converts the outer convolutional coding of the PCCC as transmitted in accordance with natural binary code to the reflected binary code described by Gray, which can be decoded with fewer adjacent-bin errors. FIG. 3 shows the output port of the binary-to-Gray code re-mapper 31 connected to the input port of a soft-symbol de-interleaver 32. Each of these soft symbols is composed of a respective soft X-sub-2 bit and a respective soft least significant bit (LSB). The soft LSBs relate to the data bits of the PCCC, and the soft X-sub-2 bits relate to the parity bits in the outer convolutional coding of the PCCC.

FIG. 3 shows the soft-symbol de-interleaver 32 connected for de-interleaving the symbol-interleaved one-half-rate outer convolutional coding of the PCCC and supplying soft-decisions related to the de-interleaved outer convolutional coding to an outer SISO decoder 33 to be decoded. FIG. 3 shows the SISO decoder 33 connected for supplying the soft symbols of its decoding results to a soft-symbol re-interleaver 34, which is complementary to the soft-symbol de-interleaver 32. FIG. 3 shows the output port of the soft-symbol re-interleaver 34 connected for supplying re-interleaved soft symbols to the input port of a Gray-to-binary code re-mapper 35. The Gray-to-binary code re-mapper 35 converts the SISO decoder 33 decoding results, as symbol-interleaved by the re-interleaver 34, from the Gray-code regime back to the natural coding regime associated with the inner convolutional coding and with the non-systematic (207, 187) RS coding. FIG. 3 shows the output port of the soft-symbol re-interleaver 34 connected for supplying Gray-coded Z-1 bits as data bits for application to a hard-data-bits selector 37 shown in FIG. 4.

In actual practice the soft-symbol de-interleaver 32 and the soft-symbol re-interleaver 34 will usually be subsumed into local memory associated with the outer SISO decoder 33. Suitable write addressing of this local memory during its being written from the output port of the binary-to-Gray code re-mapper 31 provides for symbol de-interleaving. Suitable read addressing of this local memory during its being read to the input port of the Gray-to-binary code re-mapper 35 provides for symbol re-interleaving.

The output port of the Gray-to-binary code re-mapper 35 is connected for supplying soft Z-sub-1 bits to an input port of an extrinsic-data-feedback processor 36 operable for comparing these soft Z-sub-1 bits with soft Z-sub-1 bits read from the RAM 25 via the outer-coding I/O unit 30. Such comparison generates extrinsic data concerning those of the soft Z-sub-1 bits that are temporarily stored in the second bank of addressable storage locations in the RAM 25, as part of the PCCC used to transmit M/H-service data. The extrinsic data feedback processor 36 is connected to feed this extrinsic data back through the outer-coding I/O unit 30 to replace any previous extrinsic data that is temporarily stored in the fourth bank of addressable storage locations in the RAM 25.

Figure 4:
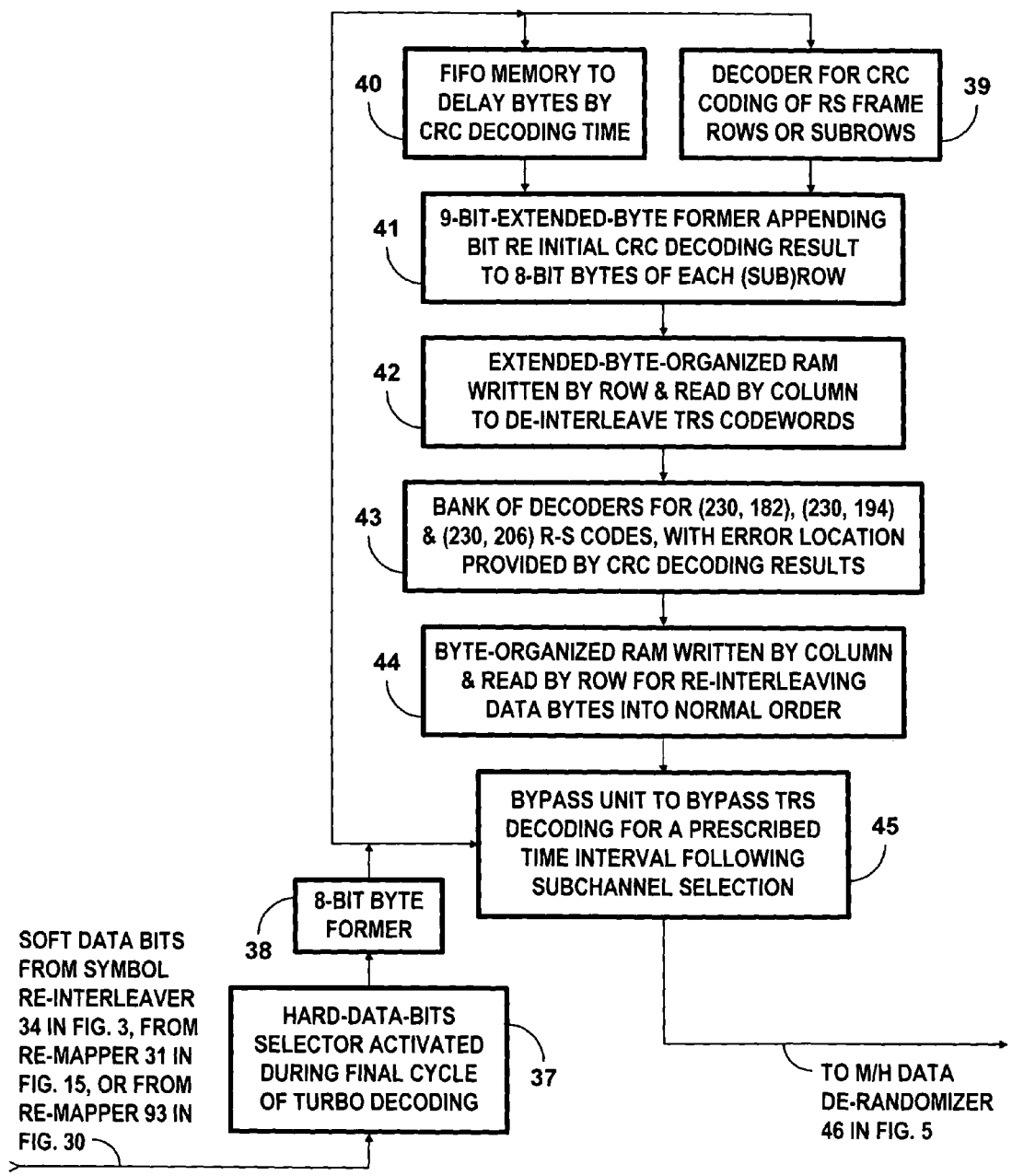
FIG. 4 is a schematic diagram of a portion of M/H receiver apparatus for decoding cyclic redundancy check (CRC) codes in the turbo decoding results and decoding TRS codewords using the results of CRC decoding to locate byte errors for TRS decoding.

FIG. 4 shows the hard-data-bits selector 37 to have an input port connected for receiving soft data bits from the output port of the soft-symbol re-interleaver 34 and to have an output port connected for supplying an 8-bit-byte former 38 with hard data bits selected from respective ones of the soft X-sub-2 data bits. In its response the 8-bit-byte former 38 forms the hard X-sub-2 data bits received from the hard-data-bits selector 37 into eight-bit bytes.

Successions of these 8-bit bytes that will be used for reproducing respective rows of bytes in RS Frames are supplied to a decoder 39 for cyclic-redundancy-check (CRC) coding and to a byte-organized first-in, first-out memory 40. Each row or subrow of bytes for an RS Frame has a 2-byte checksum appended to the conclusion thereof, thus to form a CRC codeword. After the decoder 39 has received each complete CRC codeword, the decoder 39 generates a bit indicating whether or not it found the row or subrow of bytes for an RS Frame contained within the CRC codeword to contain error. The FIFO memory 40 reproduces each successive row or subrow of bytes for an RS Frame it receives, as delayed for the duration of the CRC codeword containing that row or subrow of bytes, and supplies those delayed 8-bit bytes to a nine-bit-extended-byte former 41. The extended-byte former 41 appends to each of the 8-bit bytes the bit indicating whether or not the decoder 39 found the CRC codeword that it was contained in to contain error.

Figure 19:
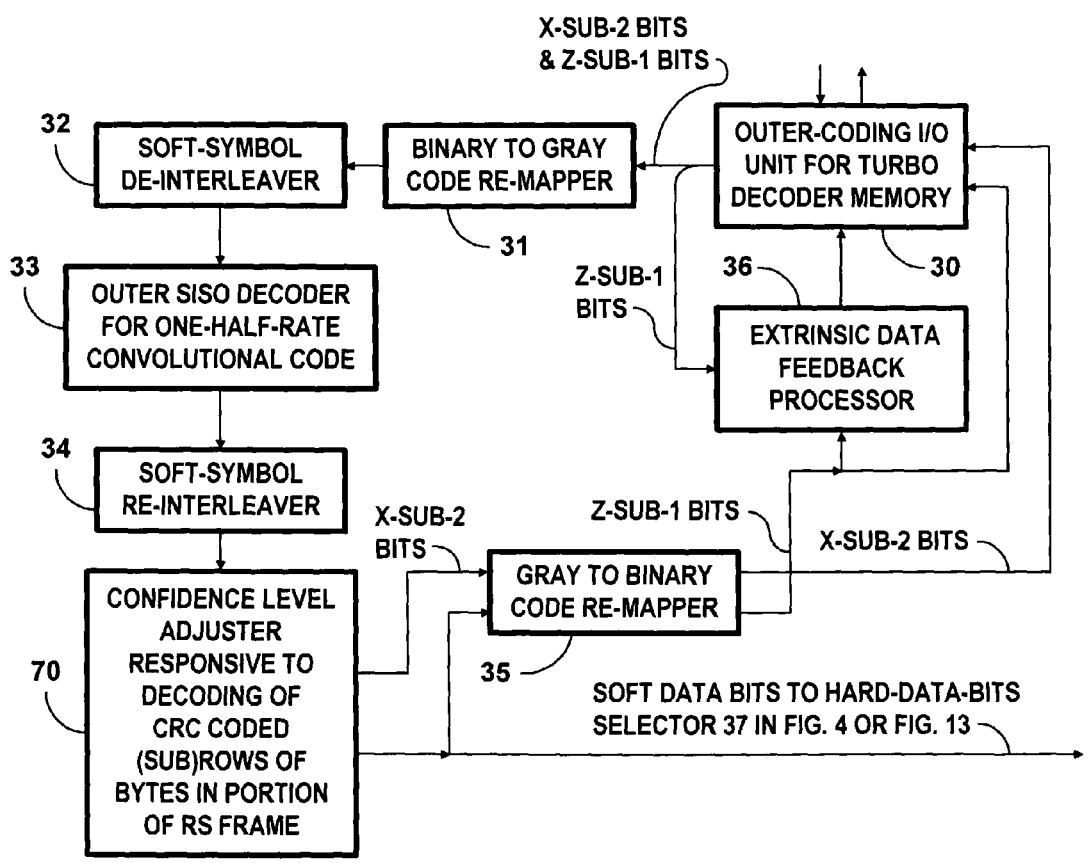
FIG. 19 is a schematic diagram of a modification of the FIG. 15 turbo decoding apparatus in which the results of decoding CRC codes are used to adjust the confidence levels of soft M/H data bits subsequent to decoding outer convolutional coding during each cycle of SCCC decoding.

The resulting extended bytes are written row by row or subrow by subrow into respective rows of extended-byte storage locations in a random-access memory 42 operated to perform the matrix-type block de-interleaving procedure that is a first step of the TRS decoding routine. The RAM 42 is subsequently read one column of 9-bit extended bytes at a time to a selected one of a bank 43 of decoders for (230, 182), (230, 194) and (230, 206) Reed-Solomon codes, respectively. The decoding control unit 7 selects the appropriate decoder in response to information extracted from the TPC. The extension bits accompanying the 8-bit bytes of the TRS coding are used to help locate byte errors for decoding the TRS coding, as is described in further detail in the published patent application US-2010-0293433-A1, with reference to FIG. 36 of its drawings. Such previous location of byte errors facilitates successful use of a Reed-Solomon algorithm capable of correcting more byte errors than an algorithm that must locate byte errors as well as correct them. The 8-bit data bytes that have been corrected insofar as possible by the selected one of the RS decoders in the bank 43 are written, column by column, into respective columns of byte-storage locations of a random-access memory 44. The RAM 44 is operated to perform the matrix-type block re-interleaving procedure for data in further steps of the TRS decoding routine. In a final step of the TRS decoding routine, the byte-storage locations in the RAM 44 are read from row-by-row for supplying reproduced randomized M/H data to a bypass unit 45. The bypass unit 45 usually relays this reproduced randomized M/H data to an M/H data de-randomizer 46 shown in FIG. 5. The bypass unit 45 is connected to bypass TRS decoding for a prescribed time interval following selection of a new sub-channel for reception, however, supplying the data de-randomizer 46 with bytes of randomized M/H data taken directly from the response of the byte former 38. A representative construction of the bypass unit 45 is shown in FIG. 19 of patent application US-2010-0100793-A1 of A. L. R. Limberg published 22 Apr.

2010 and titled "Digital television systems employing concatenated convolutional coded data".

Figure 5:
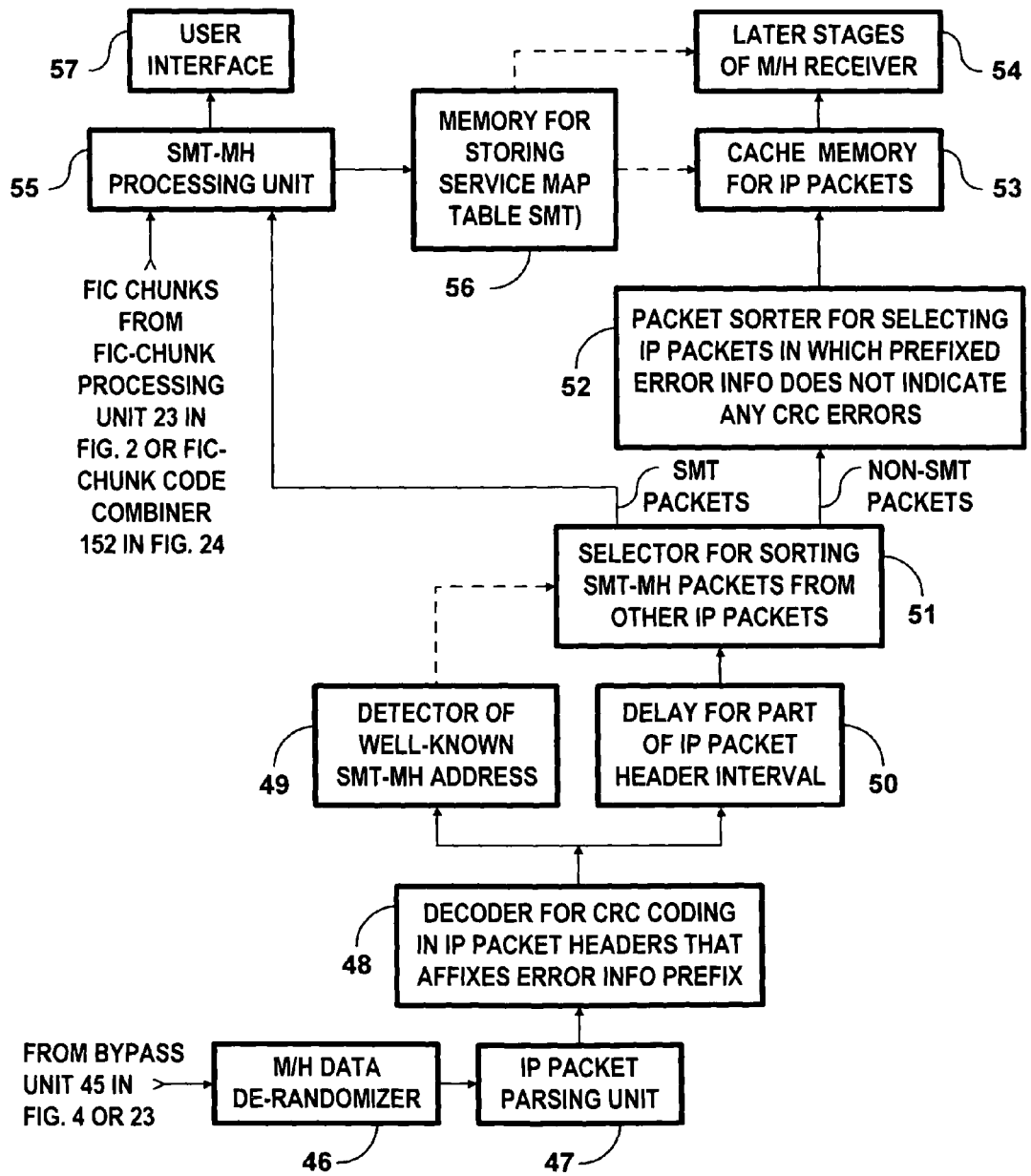
FIG. 5 is a schematic diagram of a portion of M/H receiver apparatus for de-randomizing the TRS decoding results to recover a transport stream of MPEG-2 data packets and parsing data from the transport stream of MPEG-2 data packets to recover a transport stream of internet-protocol (IP) data packets.

Referring now to FIG. 5, the M/H data de-randomizer 46 is connected for receiving the output signal from the bypass unit 45 in FIG. 4. The M/H data de-randomizer 46 de-randomizes the bytes of that signal by converting them to serial-bit form and exclusive-ORing the bits with a pseudo-random bit sequence prescribed in A/153. The M/H data de-randomizer 46 converts the de-randomized bits into bytes of M/H data and supplies those bytes to a parsing unit 47 for parsing the data stream into internet-protocol (IP) packets. The IP-packet parsing unit 47 performs this parsing responsive to two-byte row headers respectively transmitted at the beginning of each row of IP data in the RS Frame. This row header indicates where the earliest start of an IP packet occurs within the row of IP data bytes within the RS Frame. If a short IP packet is completely contained within a row of the RS Frame, the IP-packet parsing unit 47 calculates the start of a later IP packet proceeding from the packet length information contained in the earlier IP packet within that same row of the RS Frame.

The IP-packet parsing unit 47 is connected for supplying IP packets to a decoder 48 for cyclic-redundancy-check coding within the IP packets. Each IP packet contains a two-byte, 16-bit checksum for CRC coding that IP packet. The decoder 48 is constructed to preface each IP packet that it reproduces with a prefix bit indicating whether or not error has been detected in that IP packet. The decoder 48 is connected to supply these IP packets as so prefaced to a detector 49 of a "well-known" SMT-MH address and to a delay unit 50. The delay unit 50 delays the IP packets supplied to a packet selector 51 for selecting SMT-MH packets from other IP packets. The delay unit 50 provides delay of a part of an IP packet header interval, which delay is long enough for the detector 49 to ascertain whether or not the "well-known" SMT-MH address is detected.

If the detector 49 does not detect the "well-known" SMT-MH address in the IP packet, the detector 49 output response conditions the packet selector 51 to reproduce the IP packet for application to a packet sorter 52 as input signal thereto. The packet sorter 52 sorts out those IP packets in which the preface provides no indication of CRC coding error for writing to a cache memory 53 for IP packets. The prefatory prefix bit before each of the IP packets indicating whether there is CRC code error in its respective bytes is omitted when writing the cache memory 53. The cache memory 53 temporarily stores at least those IP packets not determined to contain CRC code error for possible future reading to the later stages 54 of the receiver. These later stages 54 of the receiver are sometimes referred to as the "upper layers" of the receiver.

If the detector 49 does detect the "well-known" SMT-MH address in the IP packet, establishing it as an SMT-MH packet, the detector 49 output response conditions the packet selector 51 to reproduce the SMT-MH packet for application to an SMT-MH processing unit 55, which includes circuitry for generating control signals for the later stages 54 of the M/H receiver. FIG. 5 shows the SMT-MH processing unit 55 connected for receiving FIC information from the FIC processing unit 20 in FIG. 2. The SMT-MH processing unit 55 integrates this FIC information with information from SMT-MH packets during the generation of Service Map Data. The Service Map Data generated by the SMT-MH processing unit 55 is written into memory 56 for temporary storage therewithin and subsequent application to the later stages 54 of the M/H receiver. The SMT-MH processing unit 55 relays those SMT-MH packets that have bit prefixes that do not indicate error in the packets to a user interface 57, which includes an Electronic Service Guide (ESG) and apparatus for selectively displaying the ESG on the viewing screen of the M/H receiver. Patent application US-2010-0061465-A1 of A. L. R. Limberg published 11 Mar. 2010 and titled "Sub-channel acquisition in a digital television receiver designed to receive Mobile/Handheld signals" provides more detailed descriptions of the operations of the portion of an M/H receiver shown in FIG. 5. The description with reference to the drawing FIGS. 12, 13 and 14 of that application describe operations relying on the SMT-MH tables available in A/153.

Figure 6:
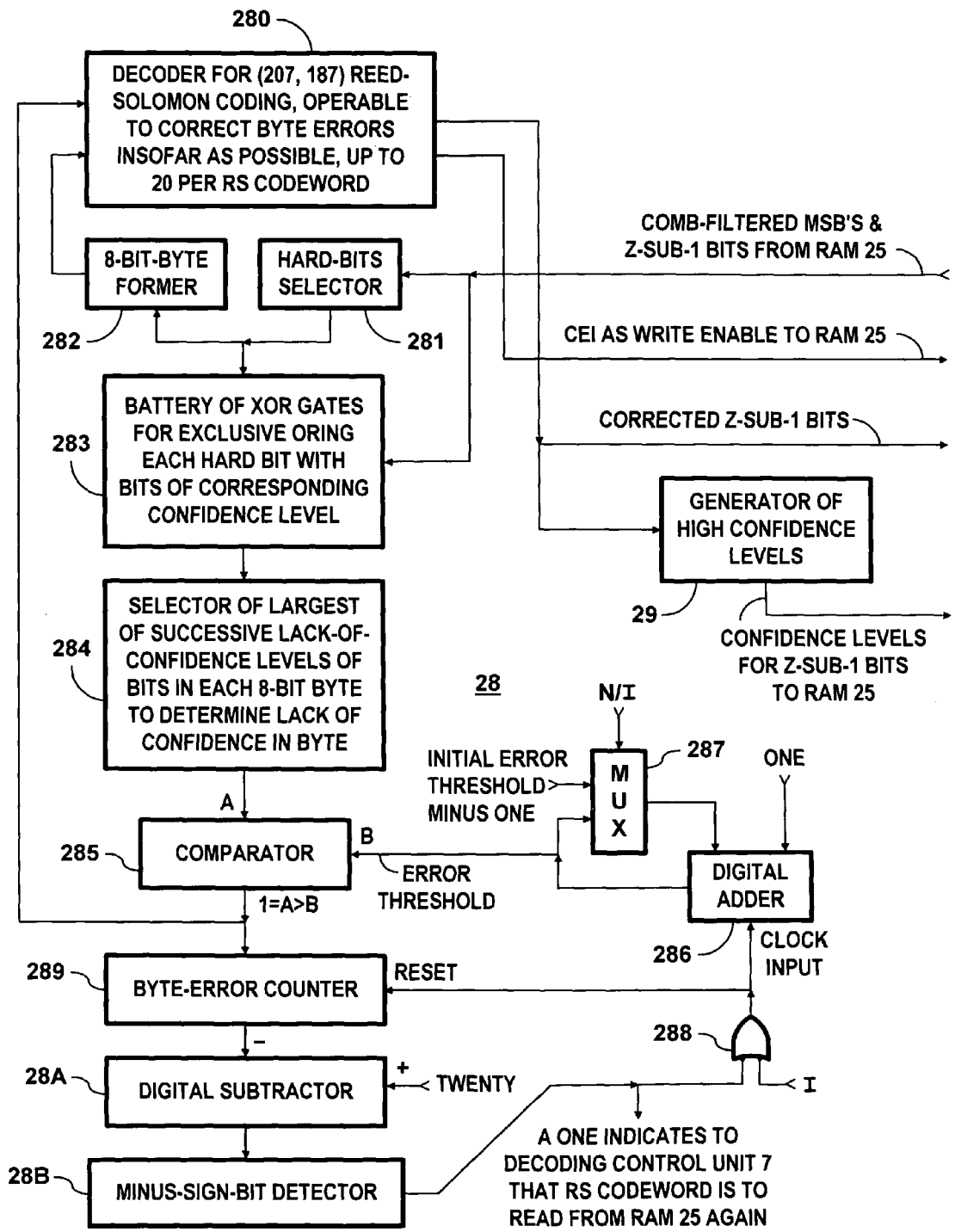
FIG. 6 is a schematic diagram showing in more detail a preferred structure of a decoder for non-systematic (207, 187) Reed-Solomon coding, which decoder is included in the FIG. 3 portion of an M/H receiver apparatus or in an alternative FIG. 15 portion of an M/H receiver apparatus.
Figure 15:
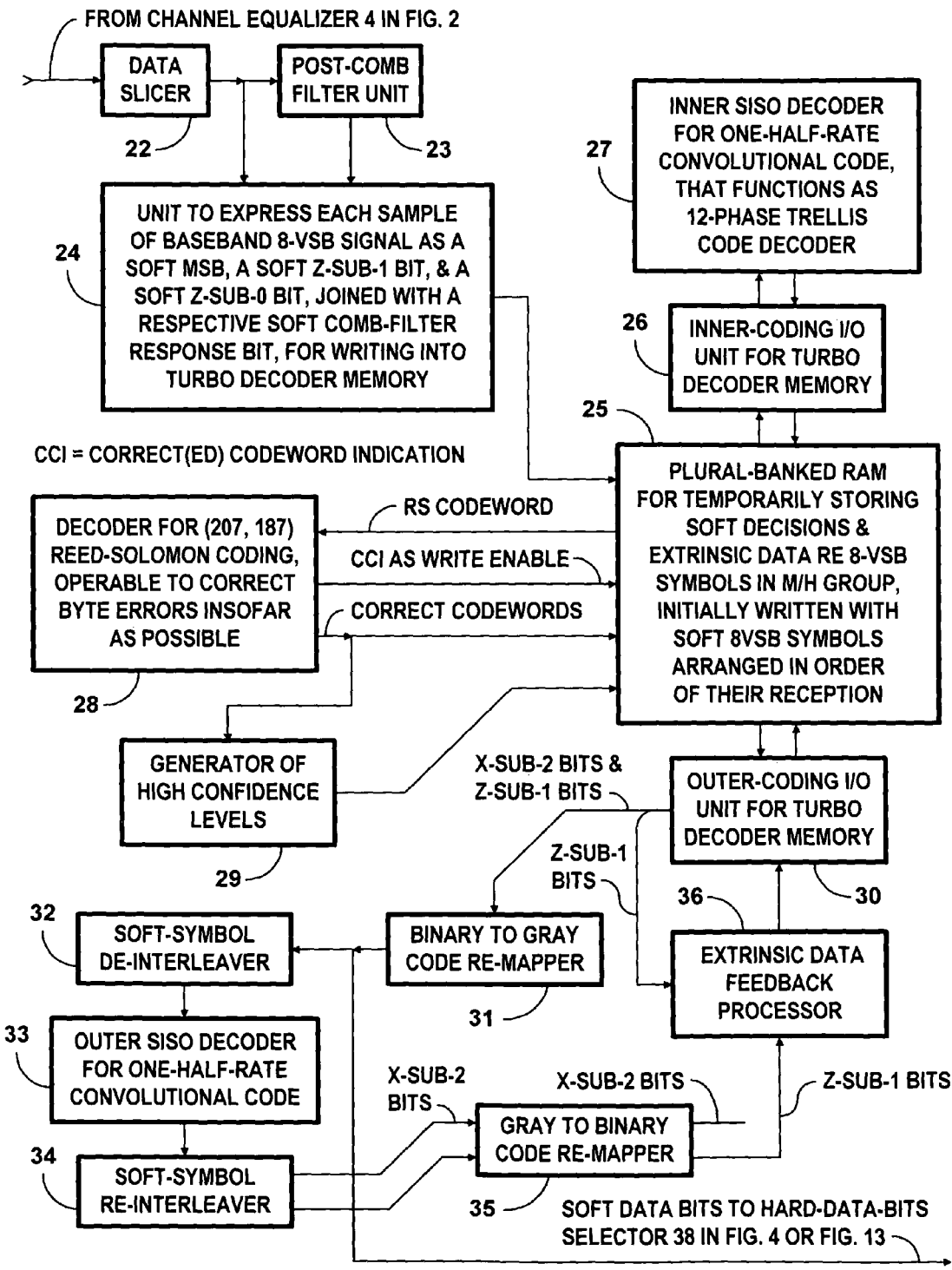
FIG. 15 is a schematic diagram showing a modification of the FIG. 3 portion of M/H receiver apparatus for turbo decoding baseband digital television signal, wherein soft data bits of turbo decoding results are extracted before symbol de-interleaving and decoding outer convolutional coding, rather than after decoding outer convolutional coding and symbol re-interleaving.
Figure 21:
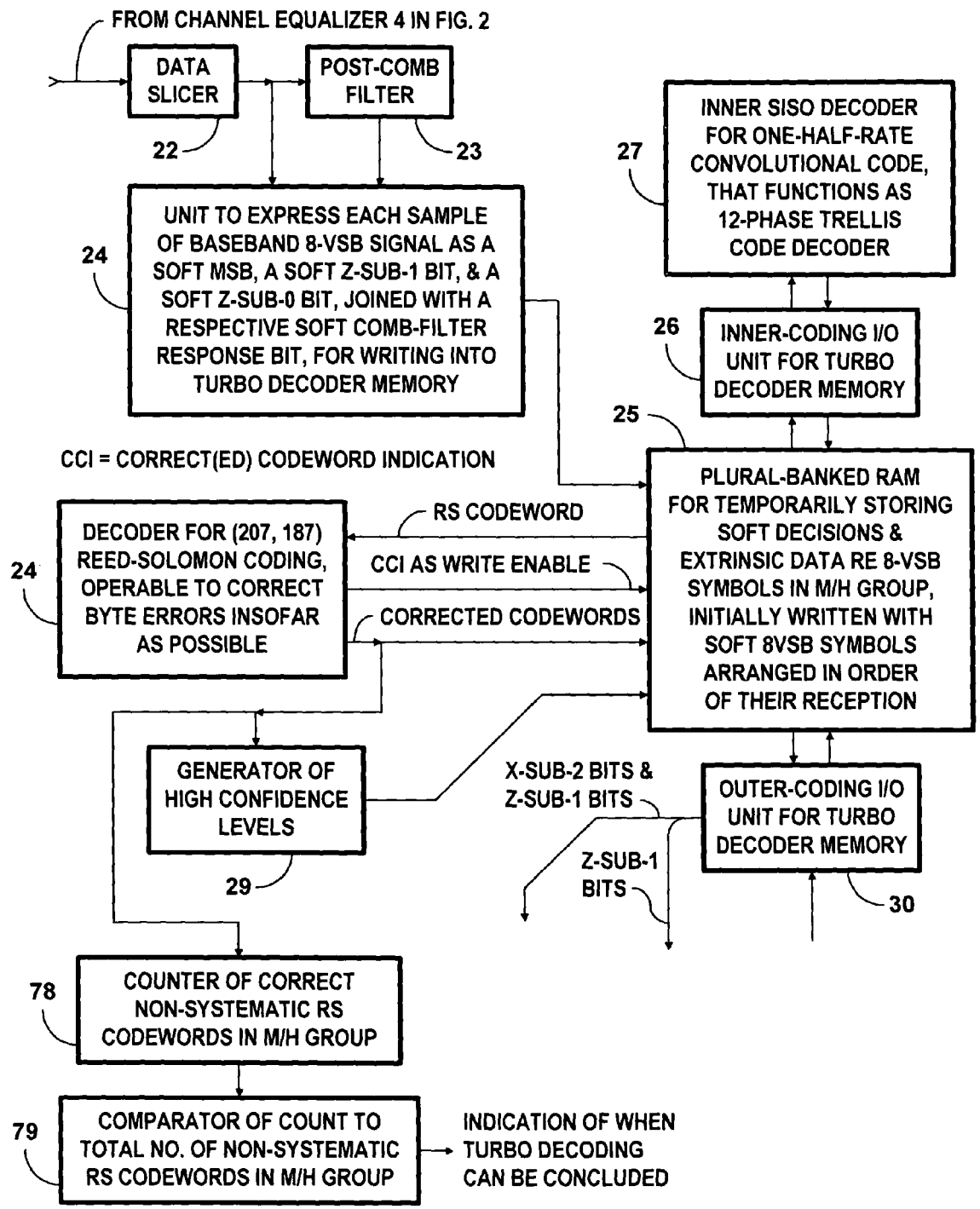
FIG. 21 is a schematic diagram showing a modification of the FIG. 3 or FIG. 15 turbo decoding apparatus, which modification provides for turbo decoding sometimes to be discontinued before a specified maximum number of iterations is reached.

FIG. 6 shows in more detail a preferred structure of the RS decoder 28 shown in FIG. 3 (and in FIGS. 15 and 21). A Reed-Solomon decoder 280 capable of correcting up to twenty erroneous bytes in a non-systematic (207, 187) Reed-Solomon codeword is the core of the FIG. 6 structure. The RS decoder 280 employs a known decoding algorithm that corrects up to as many byte errors per RS codeword as there are parity bytes, but depends upon the locations of those byte errors being determined other than from analysis of the RS codeword itself. (A decoding algorithm that must itself locate byte errors can only correct half so many byte errors per RS codeword.) In the FIG. 6 structure the locations of byte errors are determined by analyzing the confidence levels of the comb-filtered soft MSBs and the soft Z-sub-1 bits read from the RAM 25 during the procedures for decoding non-systematic (207, 187) RS codewords.

A hard-bits selector 281 is connected for reproducing hard-decision bits selected from the comb-filtered soft MSBs and the soft Z-sub-1 bits read thereto from the RAM 25. The hard-decision bits reproduced by the hard-bits selector 281 are supplied to the input port of an 8-bit-byte former 282 and to a single-bit-wide input port of a battery 283 of 2-input exclusive-OR gates. The output port of the 8-bit-byte former 282 is connected for supplying successive bytes of successive non-systematic (207, 187) RS codewords to an input port of the RS decoder 280 to be decoded. The RS codewords are parsed with regard to the scanning of addressable storage locations within the RAM 25.

A plural-bit-wide input port of the battery 283 of 2-input XOR gates is connected for receiving the plural-bit confidence levels of each successive soft bit, the hard-decision bit of which successive soft bit is included within one of the successive non-systematic (207, 187) RS codewords. Respective first input connections to the 2-input XOR gates in the battery 283 of them are arranged to receive respective bits of the plural-bit confidence levels of each successive soft bit. The respective second input connections to the 2-input XOR gates in the battery 283 of them are connected for receiving the hard-decision bits reproduced by the hard-bits selector 281, as supplied via the single-bit-wide input port of the battery 283 of XOR gates. The respective output connections from the XOR gates in the battery 283 of XOR gates are connected for supplying a plural-bit lack-of-confidence level at a plural-bit-wide output port of the battery 283 of XOR gates. A selector 284 is connected for reproducing at its output port the largest of the lack-of-confidence levels regarding the eight hard-decision bits in each successive byte of the successive non-systematic (207, 187) RS codewords, which largest lack-of-confidence level is then ascribed to that successive byte en toto.

The output port of the selector 284 is connected for supplying lack-of-confidence levels for successive bytes of non-systematic (207, 187) RS codewords to first of two input ports of a comparator 285, the second input port of which is connected for receiving an adjustable error threshold. The adjustable error threshold, like each of the lack-of-confidence levels, is a binary number. So, the comparator 285 can be a simple digital subtractor connected for receiving the selector 284 response as minuend, for receiving the adjustable error threshold as subtrahend, and for supplying a difference response that locates byte errors for the RS decoder 280. When the lack-of-confidence level in regard to a current byte exceeds the adjustable error threshold, the comparator 285 signals the erroneous byte by supplying a ONE to the RS decoder 280 for indicating that the current byte contains bit error. When the lack-of-confidence level in regard to a current byte is below the adjustable error threshold, the comparator 285 signals the presumably error-free byte by supplying a ZERO to the RS decoder 280.

FIG. 6 shows the sum output signal from a clocked digital adder 286 supplied to the comparator 285 as the adjustable error threshold. The value of the error threshold is initialized in the following way at the outset of each non-systematic (207, 187) RS codeword being read from the RAM 25. A two-input multiplexer 287 is connected to supply its response as a first of two summand signals supplied to the adder 286, the second summand signal being arithmetic one. The sum output signal from the clocked adder 286 is applied as one of two input signals to the multiplexer 287, and an initial error threshold value one is applied as the other input signal to the multiplexer 287. Just before each non-systematic (207, 187) RS codeword is read from the RAM 25 a respective pulsed logic ONE is generated by the decoding control unit 7. The pulsed logic ONE is applied as control signal to the multiplexer 287, conditioning it to reproduce the initial error threshold value less one in its response supplied to the adder 286 as a summand input signal. The clocked adder 286 receives its clock signal from an OR gate 288 connected to receive the pulsed logic ONE at one of its input connections. The OR gate 288 reproduces the pulsed logic ONE in its response that clocks an addition by the adder 286. The adder 286 adds its arithmetic one summand input signal to the initial error threshold value less one summand input signal received from the multiplexer 287, generating the initial error threshold value as its sum output signal supplied to the comparator 285.

The pulsed logic ONE also resets to arithmetic zero the binary-number output count from a byte-error counter 289 that is connected for counting the number of logic ONEs that the comparator 285 generates during the decoding of each non-systematic (207, 187) RS codeword. This binary-number output count is applied as subtrahend input signal to a digital subtractor 28A, the minuend input signal of which is twenty expressed as a binary number. A minus-sign-bit detector 28B is connected for responding to the sign bit of the difference output signal from the subtractor 28A. The minus-sign-bit detector 28B generates a logic ONE if and when the number of byte errors in a non-systematic (207, 187) RS codeword counted by the counter 289 exceeds twenty. This logic ONE is supplied to the decoding control unit 7 as an indication that the current non-systematic (207, 187) RS codeword is to be read from the RAM 25 again. This logic ONE is supplied to the OR gate 288 as an input signal thereto. The OR gate 288 responds with a logic ONE that resets the counter 289 to zero output count and that clocks the clocked digital adder 286. Normally, the multiplexer 287 reproduces the error threshold supplied as sum output from the adder 286. This reproduced error threshold is applied to the adder 286 as a summand input signal, connecting the clocked adder 286 for clocked accumulation of arithmetic ones in addition to the previous error threshold. The logic ONE from the OR gate 288 causes the error threshold supplied as sum output from the adder 286 to be incremented by arithmetic one. This tends to reduce the number of erroneous bytes located within the non-systematic (207, 187) RS codeword upon its being read again from the RAM 25. If and when the number of erroneous bytes located in the non-systematic (207, 187) RS codeword is twenty or less, the decoding control unit 7 will cause the next non-systematic (207, 187) RS codeword in the M/H Group to be processed, if such next RS codeword there be.

Figure 7:
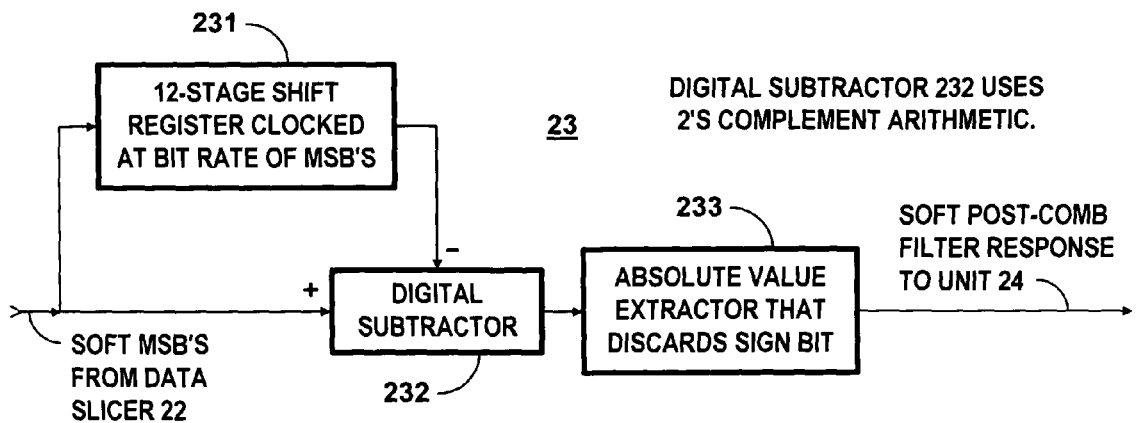
FIG. 7 is a schematic diagram of a simple embodiment of the post-comb filter unit included in the FIG. 3 portion of an M/H receiver apparatus or in the alternative FIG. 15 portion of an M/H receiver apparatus.

FIG. 7 shows a simple embodiment of the post-comb filter unit 23 included in the FIG. 3 portion of an M/H receiver apparatus and in the alternative FIG. 15 portion of an M/H receiver apparatus. This embodiment of the post-comb filter unit 23 comprises a 12-stage shift register 231, a digital subtractor 232 and an absolute value extractor 233 responsive to difference output signal from the digital subtractor 232. An input port of the post-comb filter unit 23 is connected for receiving soft MSBs of 8-VSB symbols read thereto from the RAM 25 and applying those soft MSBs to the serial-input port of the shift register 231 and to the minuend input port of the subtractor 232. The serial-output port of the shift register 231 connects to the subtrahend input port of the subtractor 232. The difference output port of the subtractor 232 is connected to an output port of the post-comb filter unit 23 via the absolute value extractor 233, which discards the sign bit of the difference output signal generated the subtractor 232. The output port of the filter unit 23 is connected for writing delayed soft bits of post-comb filter response to the RAM 25 via the random-access port of its fifth bank of addressable storage locations for temporarily storing soft bits of post-comb filter response.

Figure 8:
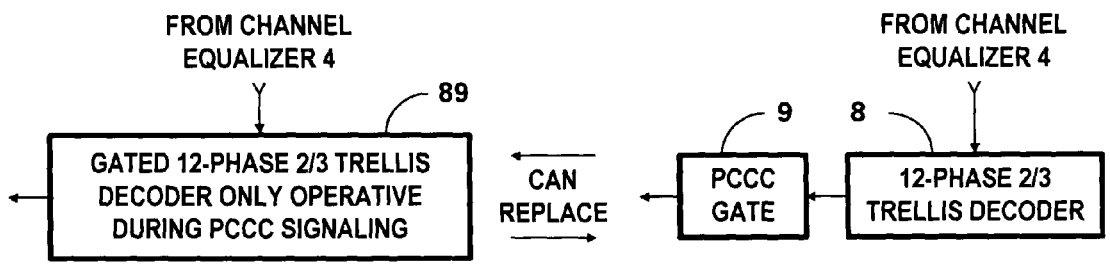
FIG. 8 is a drawing showing that a gated trellis decoder operative only during PCCC signaling can replace the cascade connection of trellis decoder and PCCC gate in the FIG. 2 portion of M/H receiver apparatus.

FIG. 8 shows a gated trellis decoder 89 operative only during PCCC signaling that can replace the cascade connection of the trellis decoder 8 and the PCCC gate 9 in the FIG. 2 portion of M/H receiver apparatus. The gated trellis decoder 89 is powered only during PCCC signaling, so there is less power drain from a battery supplying operating power than there is with a trellis decoder 9 that is powered continuously during 8-VSB signal reception.

Figure 9:
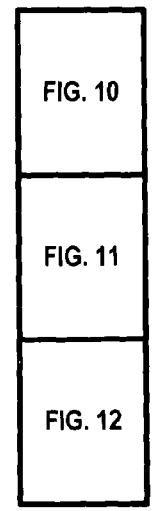
FIG. 9 is an assembly drawing that shows how
Figure 10:
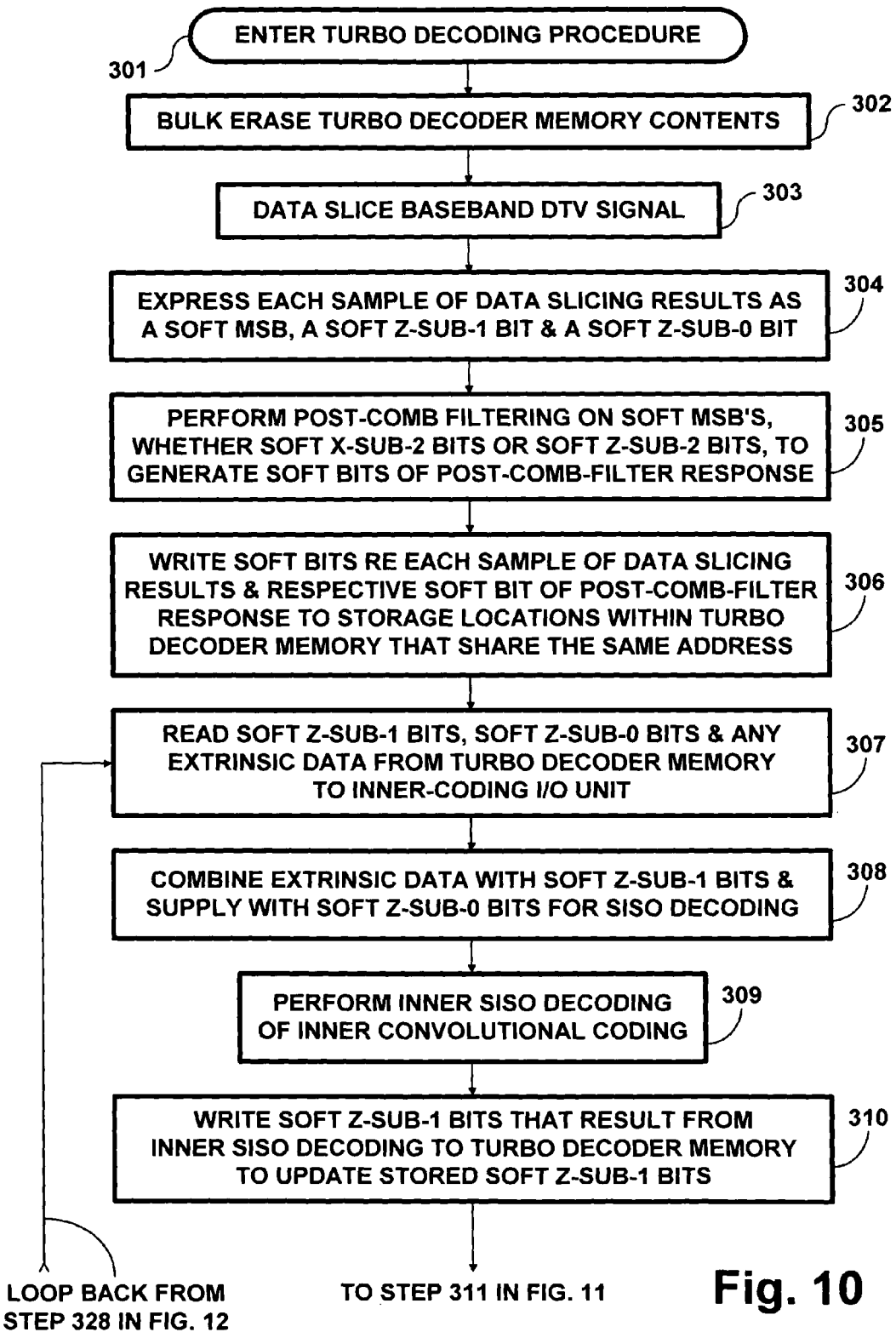
FIGS. 10, 11 and 12 are connected to provide a flow chart of operation in the FIG. 3 portion of M/H receiver apparatus.
Figure 11:
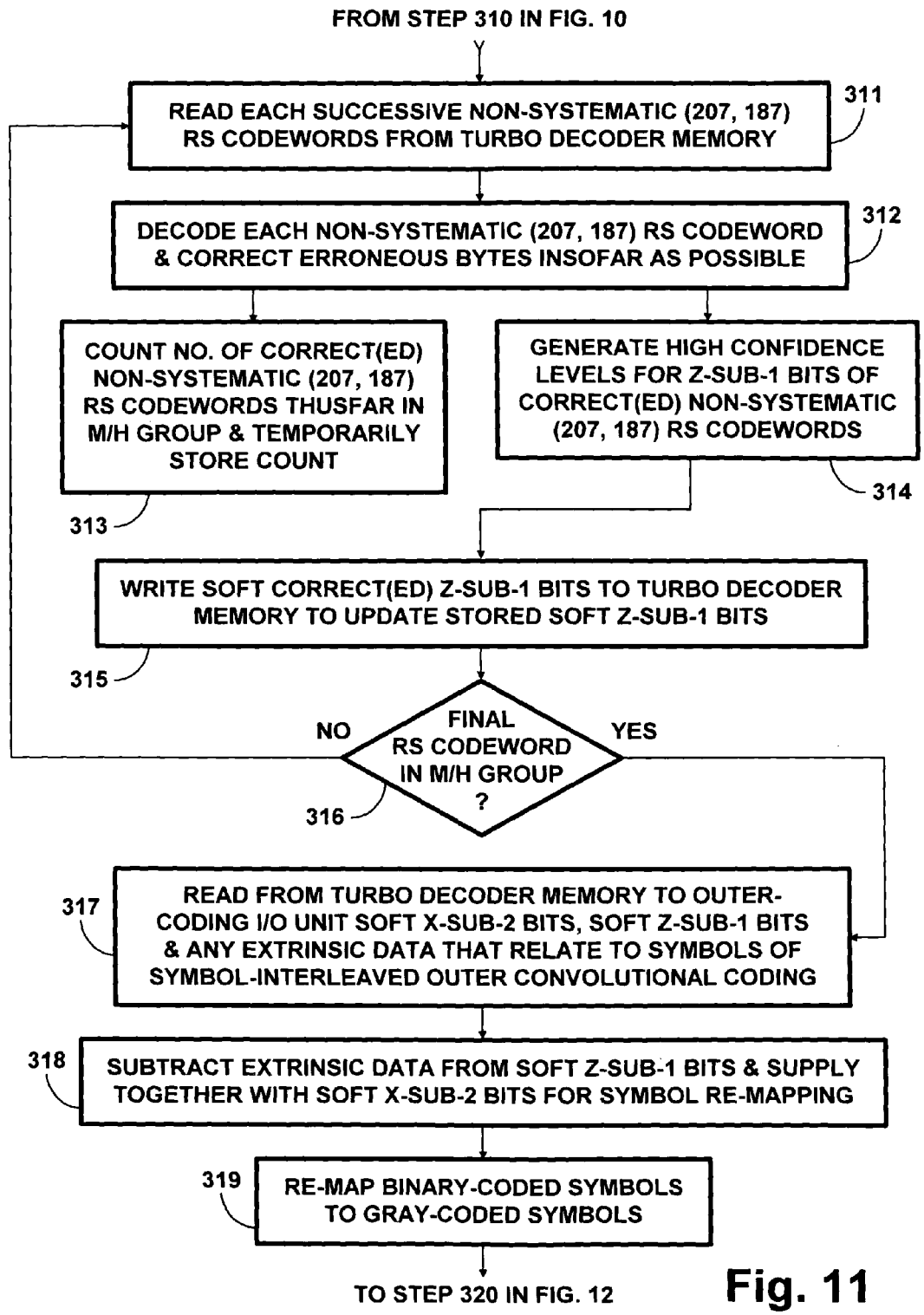
Figure 12:
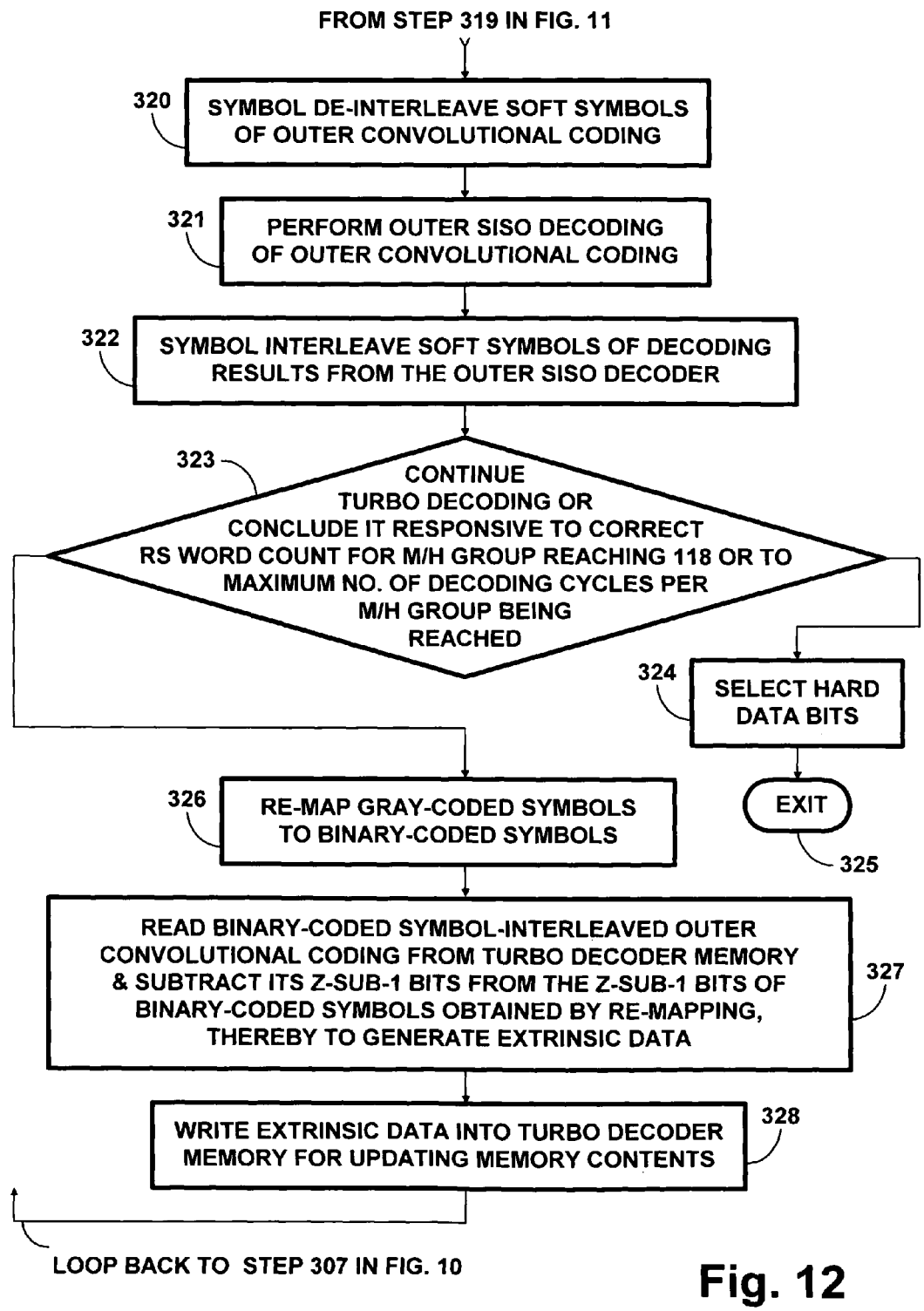

FIG. 9 is an assembly drawing that shows how FIG. 10, FIG. 11 and FIG. 12 connect to provide a flow chart of operation in the FIG. 3 portion of M/H receiver apparatus. Operation of the FIG. 3 portion of M/H receiver apparatus is broken down into twenty-eight steps 301-328 associated with the decoding of parallel concatenated convolutionally coded M/H-service data embedded in 2/3 trellis-coded main-service data. FIG. 10 shows steps 301-310 of this operation; FIG. 11 shows steps 311-319 of this operation; and FIG. 12 shows steps 320-328 of this operation.

Steps 301-306 concern a subroutine for initially loading the turbo decoder memory with information concerning the 170 data segments of a most recently received M/H Slot containing an M/H Group of M/H-service samples. The turbo decoding procedure is entered in the step 301, followed by step 302 in which the turbo decoder memory is bulk erased to replace temporarily stored contents in addressable storage locations with all-ZERO contents. The step 302 of bulk erasure of the turbo decoder memory precedes a step 303 of data-slicing the baseband DTV signal. The step 303 is performed by the data-slicer 22 responding to baseband DTV signal from the adaptive channel equalizer 4 shown in FIG. 2. A subsequent step 304 of expressing each sample of baseband 8-VSB signal as a soft most significant bit (MSB), a soft Z-sub-1 bit and a soft Z-sub-0 bit is performed by the unit 24. The soft MSBs are soft X-sub-2 bits, if from the third through 187th bytes of an MHE packet, and otherwise are soft Z-sub-2 bits. In step 305 these soft MSBs are post-comb filtered to generate soft bits of comb-filter response. The post-comb filter unit 23 responding to soft MSBs from the data-slicer 22 performs step 305. In step 306 the soft MSB, the soft Z-sub-1 bit and the soft Z-sub-0 bit regarding each sample of dataslicing results from the data-slicer 22, together with a respective soft bit of comb-filter response are written to storage locations within the turbo decoder memory that share the same address. In apparatus per FIG. 3 the step 306 is performed through the agency of the unit 24 in writing to banks of addressable storage locations within the RAM 25. The step 306 concludes the subroutine for loading the turbo decoder memory with its initial contents concerning the M/H Group most recently received.

Steps 307-310 concern a subroutine for decoding the inner convolutional coding of M/H-service samples interspersed with the trellis coding of main-service samples. In step 307 the soft Z-sub-1 bits, the soft Z-sub-0 bits and any extrinsic data regarding the soft Z-sub-1 bits are read from the turbo decoder memory 25 to the inner-coding I/O unit 26. These samples are read from the turbo decoder memory 25 either in the order in which they were originally written to the turbo decoder memory 25 or in reverse of that order. Then, in step 308 the inner-coding I/O unit 26 additively combines the soft Z-sub-1 bits with any extrinsic data regarding them, supplying the inner SISO decoder 27 the soft Z-sub-1 bits as so adjusted together with related soft Z-sub-0 bits. In the next step 309 the inner SISO decoder 27 decodes the inner convolutional coding composed of the adjusted soft Z-sub-1 bits and the related soft Z-sub-0 bits. In the following step 310 the soft Z-sub-1 bits resulting from the step 309 decoding procedures performed by the inner SISO decoder 27 are written back into the turbo decoder memory 25 via the inner-coding I/O unit 26. The inner-coding I/O unit 26 applies the soft Z-sub-1 bits resulting from the step 309 decoding procedures to the random-access port of the bank of the RAM 25 for temporarily storing soft Z-sub-1 bits. In step 310 the soft Z-sub-1 bits previously stored in that bank are over-written by updating soft Z-sub-1 bits resulting from the step 309 decoding procedures, thereby updating the stored contents of the RAM 25.

Steps 311-316 shown in FIG. 11 concern a subroutine for decoding the non-systematic (207, 187) RS codewords in the M/H Group, which is an aspect of the invention disclosed herein. Steps 311-316 are in a loop for successively processing each one of the non-systematic (207, 187) RS codewords in the M/H Slot temporarily stored in the turbo decoder memory, the RAM 25 in FIG. 3. In each step 311 one of the non-systematic (207, 187) RS codewords from that M/H Slot is read to the decoder 28 for such codewords. In each subsequent step 312 the decoder 28 decodes that non-systematic (207, 187) RS codeword and if the codeword is found to be in error corrects it if possible. The decoder 28 generates an indication of when that non-systematic (207, 187) RS codeword is found correct after decoding, the CCI bit, which is supplied to the counter 78 shown in FIG. 21 that counts such indications. In each subsequent step 313 such indication advances by one the count of the number of correct non-systematic (207, 187) RS codewords in the M/H Group thusfar found to be correct after decoding. Each step 312 of decoding a non-systematic (207, 187) RS codeword is also followed by a respective step 314 in which high confidence levels are generated for the Z-sub-1 bits of each non-systematic (207, 187) RS codeword found to be correct after decoding. Each of the steps 314 is performed by the generator 29 of high confidence levels. Each of the steps 314 is followed by a respective step 315 in which correct(ed) soft Z-sub-1 bits are written into the turbo decoder memory, the RAM 25 in FIG. 3. In the FIG. 3 turbo decoding apparatus this writing of the RAM 25 is controlled by the CCI bit being supplied as WRITE ENABLE signal to the bank of memory that temporarily stores soft Z-sub-1 bits. FIG. 11 shows each step 315 in which correct(ed) soft Z-sub-1 bits are written into the turbo decoder memory followed by a respective decision step 316 in which the decision is predicated on whether or not the final one of the non-systematic (207, 187) RS codewords being successively processed in the M/H Group has just been processed. If not, operation loops back to step 311 being repeated for the next non-systematic (207, 187) RS codeword to be processed. If the final one of the non-systematic (207, 187) RS codewords being successively processed in the M/H Group has just been processed, operation proceeds to step 317 at the beginning of a subroutine for decoding of the outer convolutional coding of M/H-service samples. In actuality, the 118 non-systematic (207, 187) RS codewords in the M/H Group most recently received are processed seriatim in prescribed order. The decision step 316 is simply an artifice used in the flow chart to condense the depiction of the subroutine for decoding the 118 non-systematic (207, 187) RS codewords from the M/H Group.

Steps 317-325 concern a subroutine for decoding the outer convolutional coding of M/H-service samples. In step 317 the soft X-sub-2 bits, selected ones of the soft Z-sub-1 bits included in the outer convolutional coding of the PCCC'd M/H-service data and any extrinsic data regarding those soft Z-sub-1 bits are read from the turbo decoder memory 25 to the outer-coding I/O unit 30. These samples are read from the turbo decoder memory 25 either in the order in which they were originally written to the turbo decoder memory 25 or in reverse of that order, but addresses not associated with the PCCC'd M/H-service data are skipped over during reading. Then, in step 318 any extrinsic data regarding those soft Z-sub-1 bits read from the turbo decoder memory 25 in the immediately preceding step 317 are differentially combined with those soft Z-sub-1 bits within the outer-coding I/O unit 30. In a subsequent step 319 the re-mapper 31 converts the soft binary-coded symbols, each composed of a soft X-sub-2 bit and a soft Z-sub-1 bit as adjusted by the outer-coding I/O unit 30, to soft Gray-coded symbols. Each soft Gray-coded symbol is composed of a soft X-sub-2 bit and a soft bit of M/H-service data. Then, in a subsequent step 320 shown in FIG. 12 the Gray-coded symbols are symbol de-interleaved preparatory to a respective step 321 in which the outer SISO decoder 33 decodes the outer convolutional coding composed of the symbol de-interleaved soft Gray-coded symbols. The step 321 is followed by a respective step 322 of symbol re-interleaving of the Gray-coded symbols, each composed of a soft X-sub-2 bit and a soft bit of M/H-service data, supplied from the outer SISO decoder 33 as soft decoding results. This step 322 restores the symbols to the order of transmission, placing the soft bits of M/H-service data in the order bits of M/H-service data were originally in before their coded (or "implied") symbol interleaving. FIG. 12 shows the step 322 followed by a decision step 323 for deciding whether to continue turbo decoding for another cycle or, instead, to conclude turbo decoding and accept the M/H-service data as currently recovered.

FIG. 12 shows the decision to conclude turbo decoding being made when a prescribed number of cycles of turbo decoding an M/H Group have occurred, but being made earlier if the number of non-systematic (207, 187) RS codewords in the M/H Group found to be correct reaches 118. Alternatively or additionally, an earlier decision to conclude turbo decoding could be based on the results of decoding cyclic redundancy check (CRC) codes. If in a decision step 323 the decision is to conclude turbo decoding, then in a succeeding step 324 hard data bits are selected from the soft bits of M/H-service data before a step 325 of exiting turbo decoding of the M/H Group. The hard-data-bits selector 37 shown in FIG. 4 or in FIG. 13 performs the step 324 of selecting hard data bits from the soft bits of M/H-service data.

Steps 326-328 concern a subroutine for generating extrinsic data to be used for turbo feedback, which subroutine is used when turbo decoding is to continue for another cycle. If in a decision step 323 the decision is to continue turbo decoding, then in a following step 326 the Gray-coded symbols as re-interleaved in the step 322 are re-mapped to binary-coded symbols. The Gray-to-binary-code re-mapper 35 in FIG. 3 does this re-mapping. A step 327 of generating extrinsic data follows, which is carried out by the extrinsic data feedback processor 36 in FIG. 3. This step 327 includes substeps of reading binary-coded symbol-interleaved outer convolutional coding from the turbo decoder memory, RAM 25, and differentially combining soft Z-sub-1 bits read therefrom with the soft Z-sub-1 bits obtained in the step 322 of re-mapping Gray-coded symbols to binary-coded symbols. This step 327 is followed by a respective step 328 of writing the extrinsic data into the turbo decoder memory, RAM 25, for updating the extrinsic data temporarily stored therein. Operation then loops back to step 307 shown in FIG. 10 for beginning another cycle of turbo coding.

Embodiments of the FIG. 3 turbo decoding apparatus can operate somewhat differently from what the flow chart of FIGS. 10, 11 and 12 illustrates. E. g., the subroutine for initially loading the turbo decoder memory per steps 301-306 can be immediately followed by the subroutine for decoding the non-systematic (207, 187) RS codewords from the M/H Group per steps 311-316. The turbo decoding loop is entered at a point after, rather than before, the subroutine for decoding the inner convolutional coding per steps 307-310. If reception conditions are very favorable, turbo decoding may be earlier discontinued using this operating procedure. Usually reception conditions are less favorable, such that some decoding of convolutional coding will have to be done to reduce errors sufficiently that RS decoding can succeed for one or a few of the non-systematic (207, 187) RS codewords from the M/H Group. Then, the high confidence levels attached to bits of correct(ed) non-systematic (207, 187) RS codewords will benefit the SISO decoding of the outer convolutional coding and the SISO decoding of the inner convolutional coding. Decoding of the PCCC is still the principal procedure for recovering data bits. The decoding of the non-systematic (207, 187) RS codewords aids this principal procedure, helps avoid the onset of BER floor problem, and signals when turbo decoding can be discontinued early.

Entering the turbo decoding loop at a point after the subroutine for SISO decoding of the inner convolutional coding, but before the subroutine for SISO decoding of the outer convolutional coding, is advantageous in the following respect. The values of the X-sub-2 bits providing redundancy for data bits in the outer convolutional coding can be determined with better confidence than the values of the Z-sub-0 bits providing redundancy for Z-sub-1 bits in the inner convolutional coding. The stronger SISO decoding procedure for the outer convolutional coding improves the succeeding weaker SISO decoding procedure for the inner convolutional coding, so earlier ones of the decoding procedures for the inner convolutional coding are more likely to make meaningful contributions to the turbo decoding.

Figure 13:
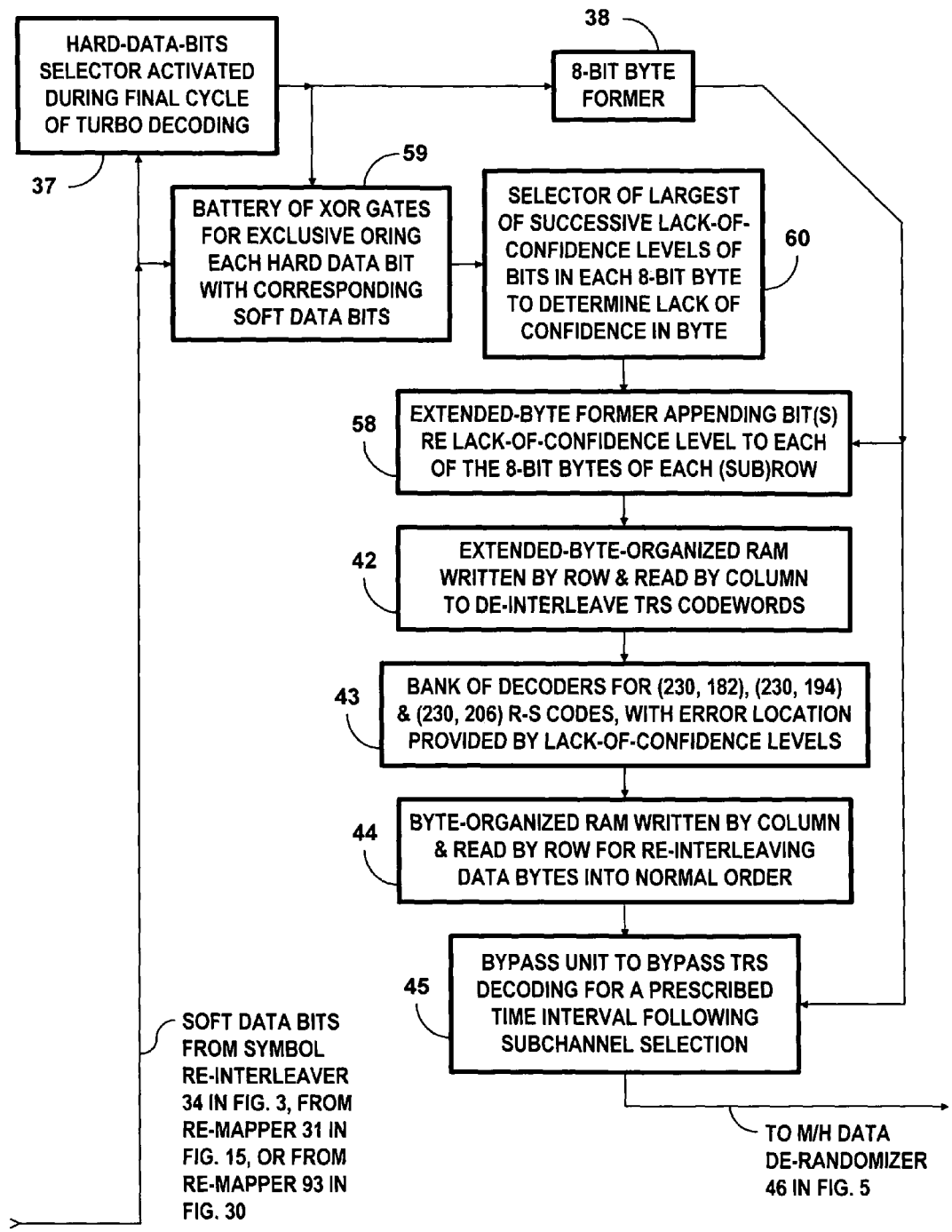
FIG. 13 is a schematic diagram of a portion of M/H receiver apparatus for decoding TRS codewords, which FIG. 13 portion of M/H receiver apparatus is alternative to that shown in FIG. 4 and uses the confidence levels of soft turbo decoding results to locate byte errors for TRS decoding.

FIG. 13 shows the hard-data-bits selector 37 connected for receiving soft X-sub-2 bits descriptive of M/H-service data, as supplied from the soft-symbol re-interleaver 34. The hard-data-bits selector 37 is connected for supplying the 8-bit-byte former 38 with hard data bits selected from the bits of the soft X-sub-2 bits. The 8-bit-byte former 38 is operable to form eight-bit bytes responsive to successive hard data bits received from the hard-data-bits selector 37. The output port of the 8-bit-byte former 38 is connected for supplying these 8-bit bytes to a first input port of an extended-byte former 58. The extended-byte former 58 is operable to append to each 8-bit byte a bit or bits supplied to a second input port thereof, which bit or bits regard a respective lack-of-confidence level for that particular 8-bit byte. An output port of the extended-byte former 58 is connected to supply extended bytes, 8-bit portions of which describe bytes of TRS coding, for being written in rows of bytes within RS Frames temporarily stored in the RAM 42. After the writing of each RS Frame concludes, columns of bytes in that RS Frame that is temporarily stored in the RAM 42 define respective TRS codewords. The RAM 42 is operable for successively reading these columns of bytes to the bank 43 of decoders for TRS codewords, which are selectively connected for supplying their decoding results to be written into the byte-organized RAM 44. The RAM 44 is operable for re-interleaving data bytes into normal order for application to a first input port of the bypass unit 45, the second input port of which is connected for receiving 8-bit data bytes directly from the output port of the 8-bit-byte former 38. The output port of the bypass unit 45 is connected for supplying the 8-bit data bytes reproduced therefrom to the input port of the M/H data de-randomizer 46 shown in FIG. 5. The connections and operation of the elements 42-45 in the portion of M/H receiver apparatus shown in FIG. 13 are essentially the same as in the portion of M/H receiver apparatus shown in FIG. 4.

FIG. 13 shows a battery 59 of exclusive-OR gates connected to receive soft X-sub-2 data bits supplied from the soft-symbol re-interleaver 34 shown in any one of the FIGS. 3, 11 and 15. These XOR gates exclusive-OR the bits of each soft X-sub-2 data bit with a corresponding hard data bit supplied from the hard-data-bits selector 37. The response from the battery 59 of XOR gates provides successive plural-bit indications each defining a normalized lack-of-confidence level regarding a respective soft X-sub-2 data bit. A selector 60 is operable to reproduce at an output port thereof the largest of the normalized lack-of-confidence levels for each consecutive non-overlapping set of eight soft X-sub-2 data bits, which lack-of-confidence level is to be ascribed to a corresponding 8-bit byte supplied by the 8-bit-byte former 38. The output port of the selector 60 is connected to supply the successive plural-bit lack-of-confidence levels reproduced thereat to the second input port of the extended-byte former 58 to be appended to the corresponding 8-bit byte supplied by the 8-bit-byte former 38.

Figure 14:
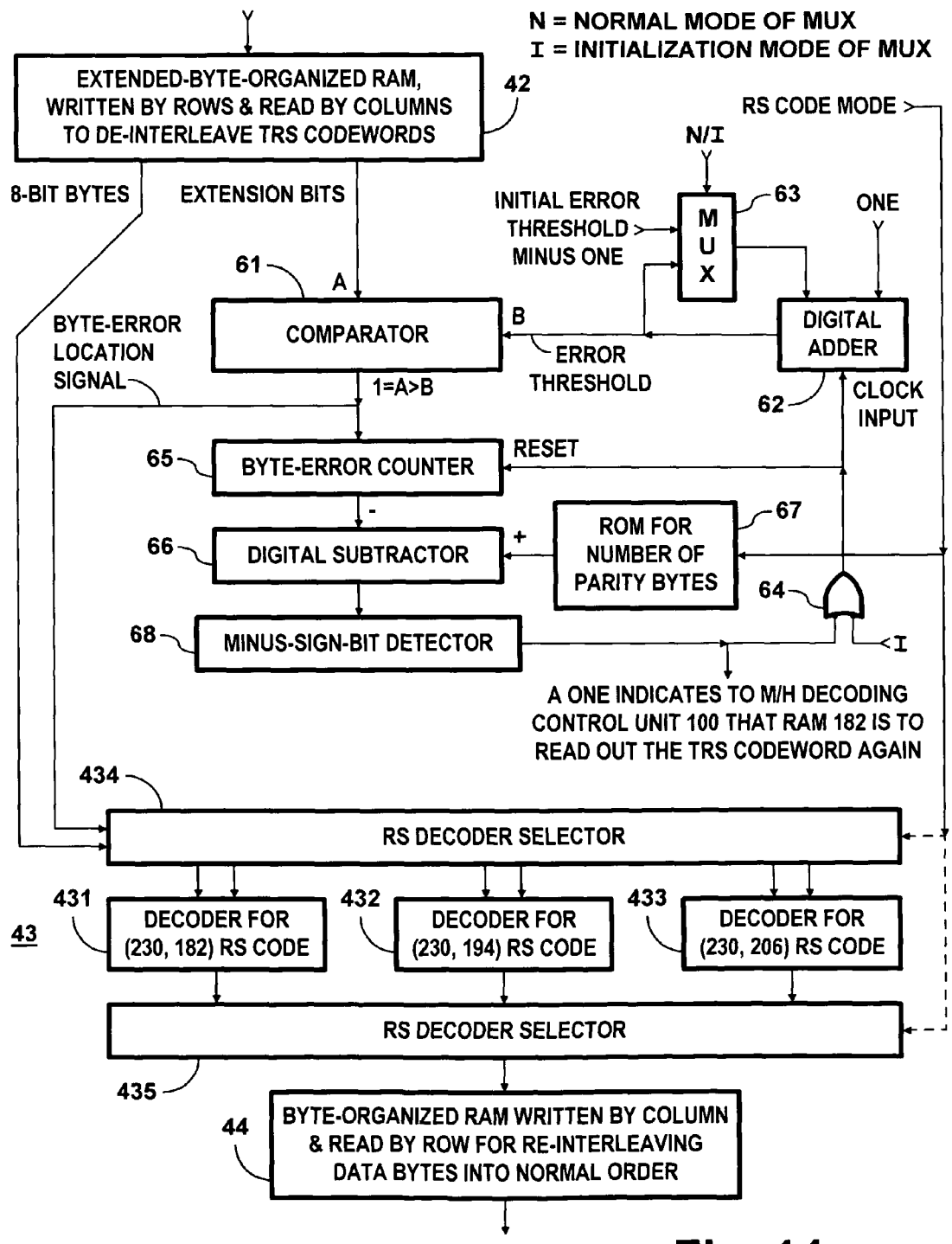
FIG. 14 is a schematic diagram showing in more detail the circuitry for decoding TRS codewords in the FIG. 13 portion of the alternative M/H receiver apparatus, including a further part of the circuitry for processing turbo decoding results in order to locate byte errors for TRS decoding.

FIG. 14 shows in more detail the bank 43 of RS decoders that the FIG. 13 portion of the FIG. 8 M/H receiver apparatus uses for decoding TRS, including structure to locate byte errors for TRS decoding. The bank 43 of RS decoders is shown as comprising a decoder 431 for (230, 182) RS code, a decoder 432 for (230, 194) RS code, a decoder 433 for (230, 206) RS code, and RS decoder selectors 434 and 435. The RS decoder selector 434 is connected for applying the TRS codeword read from the preceding RAM 42 to one of the decoders 431, 432 and 433 as selected responsive to an RS CODE MODE pair of bits. The RS decoder selector 435 is connected for applying to the succeeding RAM 44 the error-corrected results from the one of the decoders 431, 432 and 433 as selected responsive to the RS CODE MODE pair of bits. The RS CODE MODE pair of bits is generated by the decoding control unit 7 responsive to the RS_code_mode bits in the TPC signals decoded by the decoder 14 for (18, 10) RS FEC code.

The one of decoders 431, 432 and 433 selected for operation initially attempts to correct the TRS codeword using a byte-error-location-and-correction decoding algorithm. If the TRS codeword has too many byte errors to be corrected by this algorithm, the selected decoder then resorts to a byte-error-correction-only decoding algorithm. The RS decoder selector 434 is connected for forwarding indications of byte errors to the selected one of the decoders 431, 432 and 433 together with the bytes of each TRS codeword. The extension bits accompanying each successive 8-bit byte of a TRS codeword from the RAM 42 are supplied to a comparator 61 used as a threshold detector. The extension bits indicate the likelihood that the 8-bit byte is in error, and comparator 61 compares them to an error threshold. If the likelihood that the 8-bit byte is in error exceeds the error threshold, the comparator 61 responds with a logic ONE indicative that the byte is presumably in error. Otherwise, the comparator 61 responds with a logic ZERO indicative that the byte is presumably correct.

FIG. 14 shows the sum output signal from a clocked digital adder 62 supplied to the comparator 61 as the error threshold. The value of the error threshold is initialized in the following way at the outset of each TRS codeword being read from the RAM 42. A two-input multiplexer 63 is connected to supply its response as a first of two summand signals supplied to the adder 62, the second summand signal being arithmetic one. The sum output signal from the clocked adder 62 is applied as one of two input signals to the multiplexer 63, and an initial error threshold value less one is applied as the other input signal to the multiplexer 63. Just before each TRS codeword is read from the RAM 42 a respective pulsed logic ONE is generated by the decoding control unit 7. The pulsed logic ONE is applied as control signal to the multiplexer 63, conditioning it to reproduce the initial error threshold value less one in its response supplied to the adder 62 as a summand input signal. The clocked adder 62 receives its clock signal from an OR gate 64 connected to receive the pulsed logic ONE at one of its input connections. The OR gate 64 reproduces the pulsed logic ONE in its response that clocks an addition by the adder 62. The adder 62 adds its arithmetic one summand input signal to the initial error threshold value less one summand input signal received from the multiplexer 63, generating the initial error threshold value as its sum output signal supplied to the comparator 61.

The pulsed logic ONE also resets to arithmetic zero the output count from a byte-error counter 65 that is connected for counting the number of logic ONEs that the comparator 61 generates during each TRS codeword. This output count is applied as subtrahend input signal to a digital subtractor 66. A read-only memory 67 responds to the RS CODE MODE pair of bits to supply the number of parity bytes in the TRS codewords, which number is supplied as minuend input signal to the subtractor 66. A minus-sign-bit detector 68 is connected for responding to the sign bit of the difference output signal from the subtractor 66. The minus-sign-bit detector 68 generates a logic ONE if and when the number of byte errors in a TRS codeword counted by the counter 65 exceeds the number of parity bytes in a TRS codeword. This logic ONE is supplied to the decoding control unit 7 as an indication that the current TRS codeword is to be read from the RAM 42 again. This logic ONE is supplied to the OR gate 64 as an input signal thereto. The OR gate 64 responds with a logic ONE that resets the counter 65 to zero output count and that clocks the clocked digital adder 62. Normally, the multiplexer 63 reproduces the error threshold supplied as sum output from the adder 62. This reproduced error threshold is applied to the adder 62 as a summand input signal, connecting the clocked adder 62 for clocked accumulation of arithmetic ones in addition to the previous error threshold. The logic ONE from the OR gate 64 causes the error threshold supplied as sum output from the adder 62 to be incremented by arithmetic one, which tends to reduce the number of erroneous bytes located within the TRS codeword upon its being read again from the RAM 42.

If and when the number of erroneous bytes located in the TRS codeword is fewer than the number of parity bytes that the ROM 67 indicates that the TRS codeword should have, the decoding control unit 7 will cause the next TRS codeword in the RS Frame to be processed if such there be. The decoding control unit 7 will begin reading such next TRS codeword from the RAM 42 to the bank 43 of RS decoders and writing the RS decoding results into the RAM 44.

FIG. 15 shows a modification that can be made to the FIG. 3 portion of M/H receiver apparatus for turbo decoding baseband digital television signal, in which modification soft data bits of turbo decoding results are extracted after binary-to-Gray-code re-mapping, but before symbol de-interleaving and decoding outer convolutional coding. This is done rather than extracting soft data bits of turbo decoding results after decoding outer convolutional coding and symbol re-interleaving, but before Gray-to-binary-code re-mapping.

Figure 16:
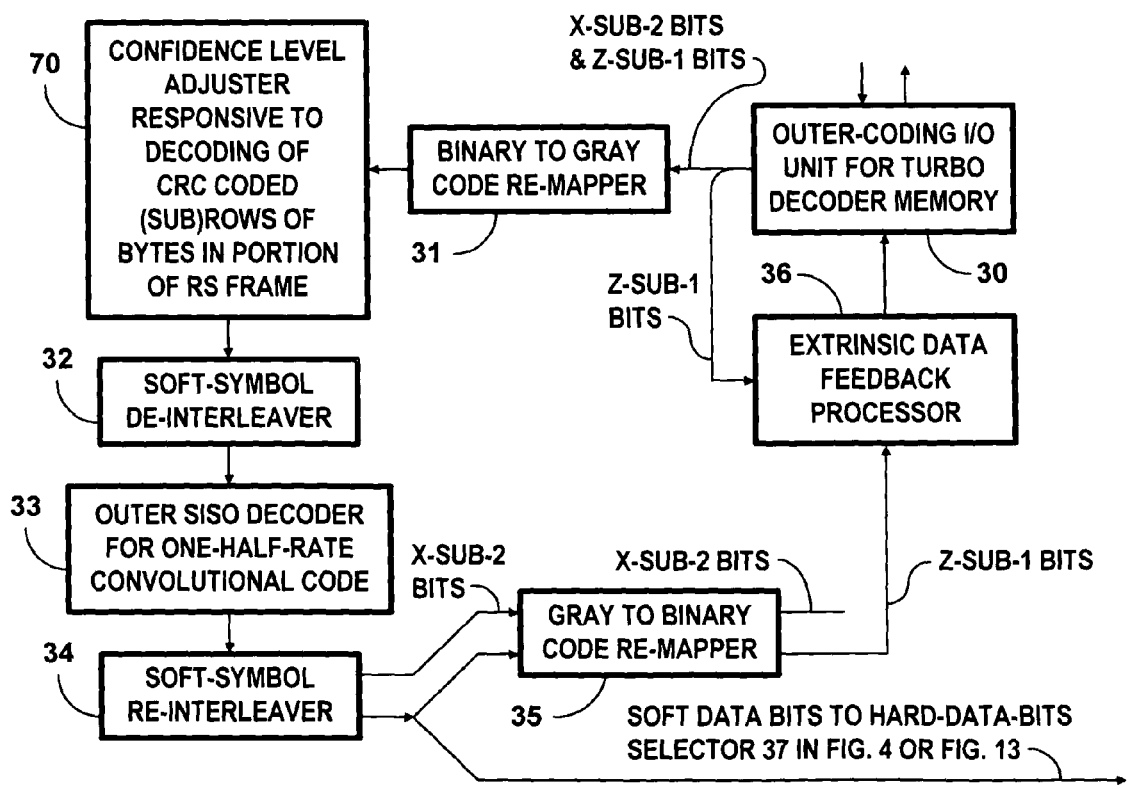
FIG. 16 is a schematic diagram of a modification of the FIG. 3 turbo decoding apparatus in which the results of decoding CRC codes are used to adjust the confidence levels of soft M/H data bits prior to decoding outer convolutional coding during each cycle of decoding SCCC.

FIG. 16 shows a modification of the FIG. 3 turbo decoding apparatus in which the results of decoding CRC codes are used to adjust the confidence levels of soft M/H data bits prior to decoding outer convolutional coding during each cycle of turbo decoding PCCC. The turbo decoding apparatus shown in FIG. 16 differs in the following way from that shown in FIG. 3. A confidence-level adjuster 70 for processing data bits is interposed between the output port of the binary-to-Gray re-mapper 31 and the input port of the soft-symbol de-interleaver 32.

Figure 17:
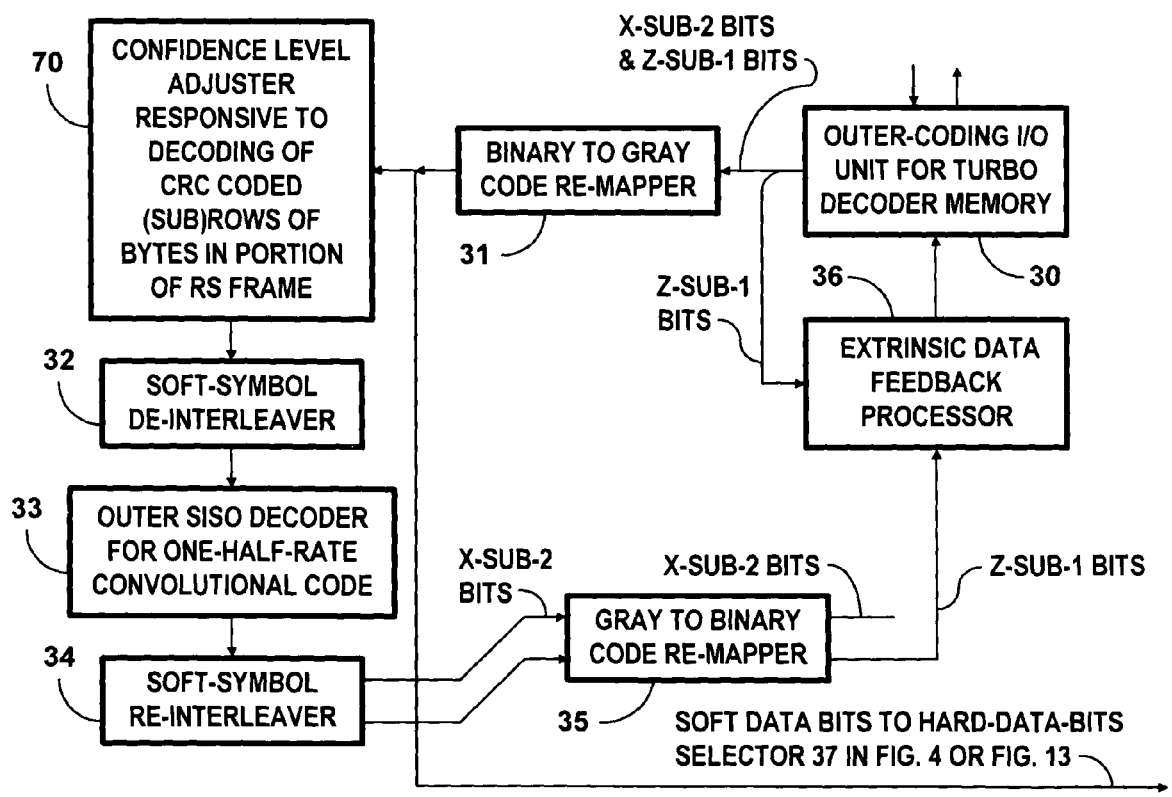
FIG. 17 is a schematic diagram of a modification of the FIG. 15 turbo decoding apparatus in which the results of decoding CRC codes are used to adjust the confidence levels of soft M/H data bits prior to decoding outer convolutional coding during each cycle of decoding SCCC.

FIG. 17 shows a modification of the FIG. 15 turbo decoding apparatus in which the results of decoding CRC codes are used to adjust the confidence levels of soft M/H data bits prior to decoding outer convolutional coding during each cycle of turbo decoding PCCC. The turbo decoding apparatus shown in FIG. 17 differs in the following way from that shown in FIG. 15. A confidence-level adjuster 70 for processing data bits is interposed between the output port of the binary-to-Gray re-mapper 31 and the input port of the soft-symbol de-interleaver 32.

Figure 18:
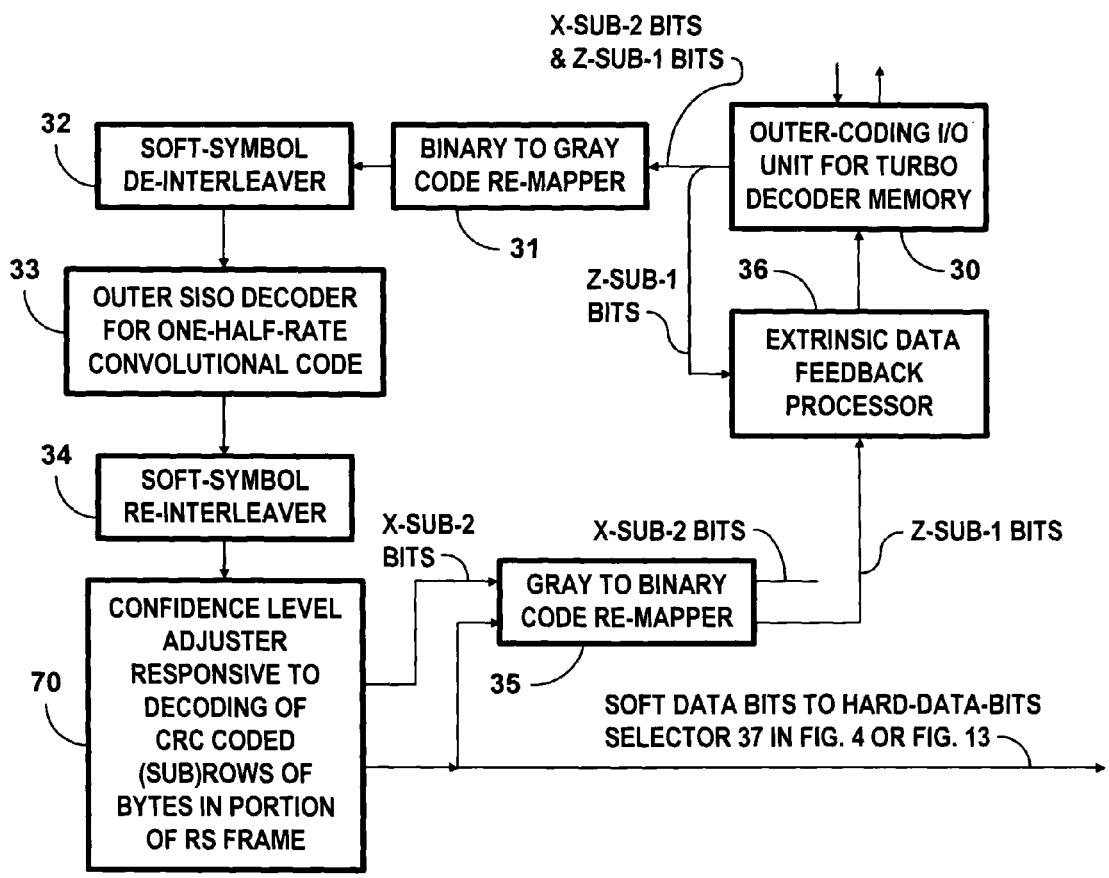
FIG. 18 is a schematic diagram of a modification of the FIG. 3 turbo decoding apparatus in which the results of decoding CRC codes are used to adjust the confidence levels of soft M/H data bits subsequent to decoding outer convolutional coding during each cycle of SCCC decoding.

FIG. 18 shows a modification of the FIG. 3 turbo decoding apparatus in which the results of decoding CRC codes are used to adjust the confidence levels of soft M/H data bits subsequent to decoding outer convolutional coding during each cycle of turbo decoding PCCC. The turbo decoding apparatus shown in FIG. 18 differs in the following way from that shown in FIG. 3. The confidence-level adjuster 70 for processing data bits is interposed between the output port of the soft-symbol re-interleaver 34 and the input port of the Gray-to-binary-code re-mapper 35.

FIG. 19 shows a modification of the FIG. 15 turbo decoding apparatus in which the results of decoding CRC codes are used to adjust the confidence levels of soft M/H data bits subsequent to decoding outer convolutional coding during each cycle of turbo decoding PCCC. The turbo decoding apparatus shown in FIG. 19 differs in the following way from that shown in FIG. 15. The confidence-level adjuster 70 for processing data bits is interposed between the output port of the soft-symbol re-interleaver 34 and the input port of the Gray-to-binary-code re-mapper 35.

Figure 20:
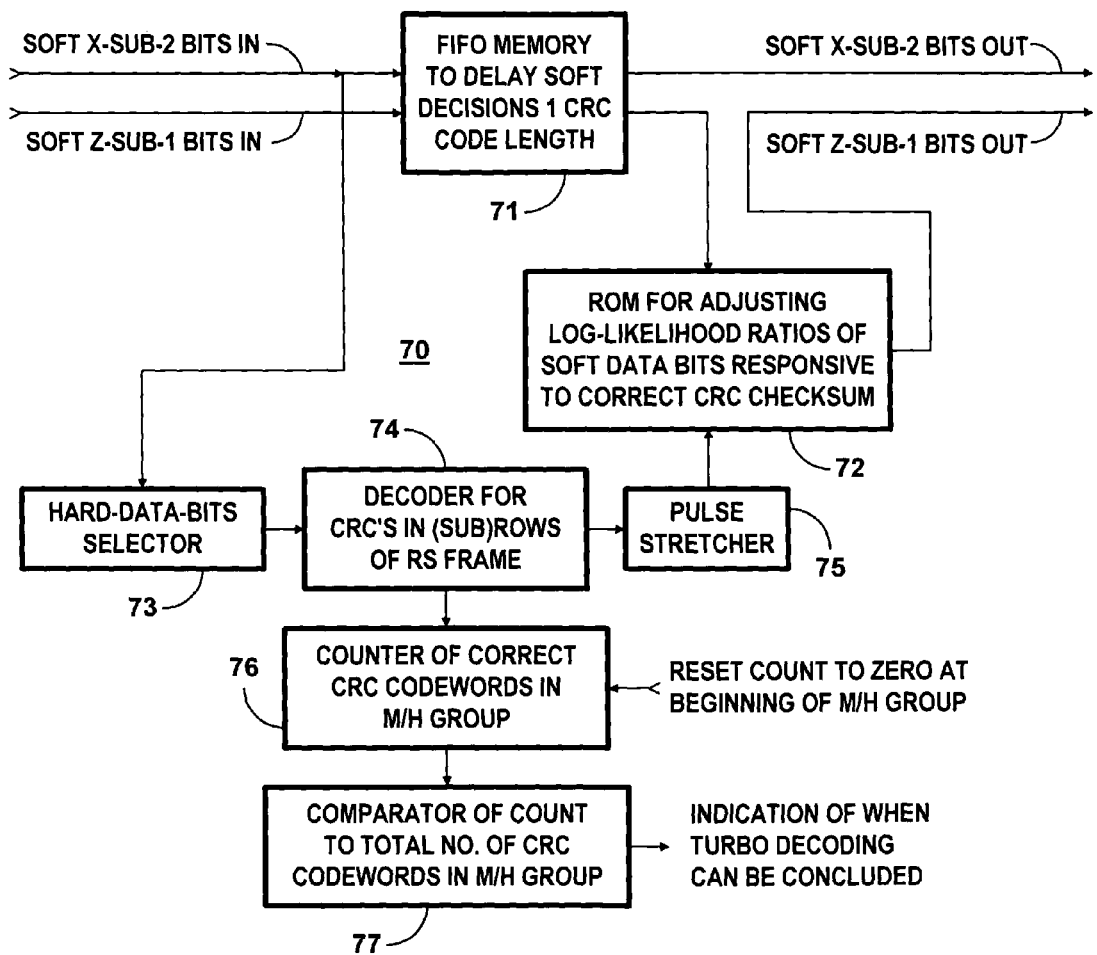
FIG. 20 is a schematic diagram showing a representative structure of the confidence-level adjuster included in any of the modified turbo decoding apparatuses shown in FIGS. 16, 17, 18 and 19.

FIG. 20 shows in detail a representative structure of the confidence-level adjuster 70 shown in FIGS. 16, 17, 18 and 19. The confidence-level adjuster 70 comprises elements 71, 72, 73, 74 and 75. After a delay as long as the time taken for decoding each of the CRC codewords, a first-in/first-out memory 71 reproduces symbol de-interleaved soft X-sub-2 data bits received earlier and supplies them to a read-only memory 72 as partial input addressing thereto. The ROM 72 is used to adjust the confidence levels of those delayed symbol de-interleaved soft X-sub-2 data bits. The data bits written to the FIFO memory 71 as input addressing are also applied as input signal to a hard-data-bits selector 73. The hard-data-bits selector 73 responds to supply hard data bits as the input signal to the input port of a decoder 74 for the cyclic-redundancy-check coding of CRC codewords contained within each row of bytes in an RS Frame. The decoder 74 includes input circuitry therein for converting the data bits received serially from the hard-data-bits selector 73 to 16-parallel-bit format for the CRC decoding procedures. The decoder 74 is connected for supplying the CRC decoding result to a pulse stretcher 75. The pulse stretcher 75 reproduces the CRC decoding result for the duration of a CRC codeword read from the FIFO memory 71 and is connected for applying that reproduced CRC decoding result to the ROM 72 for completing its input addressing. If the decoder 74 does not detect any error in the CRC codeword, the decoder 74 supplies a ONE to the pulse stretcher 75. The stretched-in-time ONE from the pulse stretcher 75 conditions the ROM 72 to increase the confidence levels of the soft data bits in the CRC codeword as supplied from the ROM 72. If the decoder 74 detects error in the CRC codeword, the decoder 74 supplies a ZERO to the pulse stretcher 75. The stretched-in-time ZERO from the pulse stretcher 75 conditions the ROM 72 to leave unaltered the confidence levels of the soft data bits in the CRC codeword as supplied from the ROM 72.

FIG. 20 further shows a counter 76 connected for counting the number of correct CRC codewords in each M/H Group. The count from the counter 76 is connected for being reset to zero at the beginning of each M/H Group. The counter 76 is connected for supplying its count to a comparator 77 that compares that count to the total number of complete CRC codewords in the M/H Group. The comparator 77 is operable for indicating when the count from the counter 76 reaches the total number of complete CRC codewords in the M/H Group. This indication can be used to conclude turbo decoding of the M/H Group when the current cycle of PCCC decoding finishes, rather than continuing the turbo decoding for additional cycles until a specified maximum number of PCCC decoding iterations is reached.

FIG. 21 shows a modification of the FIG. 3 or FIG. 15 portion of M/H receiver apparatus for turbo decoding baseband digital television signal, which modification provides another mechanism for sometimes being able to conclude turbo decoding before a specified maximum number of iterations is reached. A counter 78 is connected to count the number of non-systematic (207, 187) RS codewords from a particular M/H Group that the decoder 28 for such codewords finds to be correct originally or subsequent to correction. The counter 78 is connected for supplying its count to a comparator 79 that compares that count to 118, the total number of non-systematic (207, 187) RS codewords in the M/H Group. The comparator is operable for indicating when the count from the counter 78 reaches the total number of complete CRC codewords in the M/H Group. This indication can be used to conclude turbo decoding of the M/H Group when the current cycle of SCCC decoding finishes, rather than continuing the turbo decoding for additional cycles until a specified maximum number of decoding iterations is reached. This way of sometimes concluding turbo decoding before a specified maximum number of decoding iterations is reached can replace or augment the way shown in FIG. 20. The FIG. 21 way of sometimes concluding turbo decoding before a specified maximum number of decoding iterations is reached is advantageous in that it need not take into account incomplete CRC codewords when decoding the PCCC of a particular M/H Group. There are always 118 non-systematic (207, 187) RS codewords in an M/H Group, if it can be completely decoded.

Figure 22:
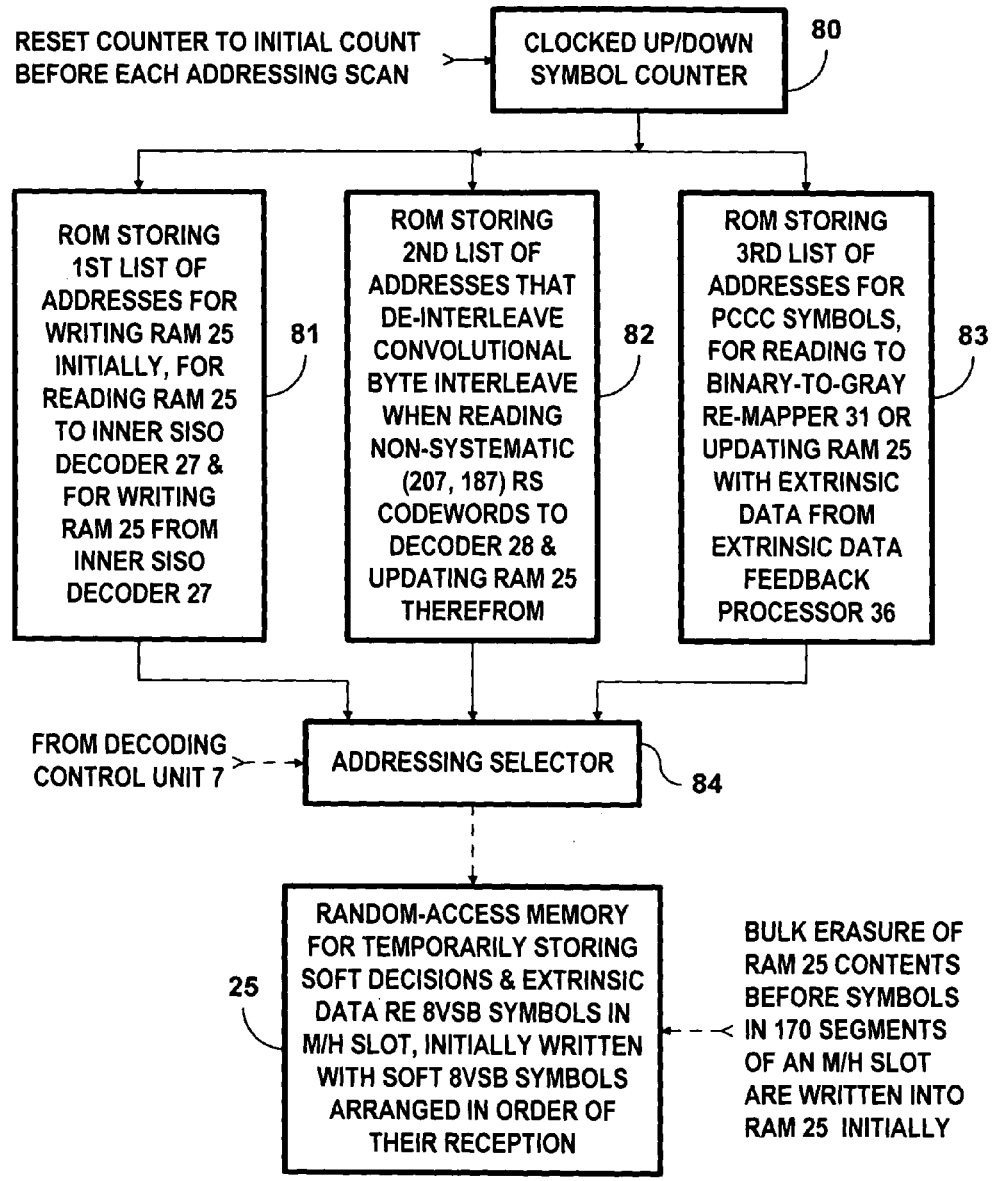
FIG. 22 is a schematic diagram showing a representative arrangement of elements for addressing the random-access memory that FIG. 3, FIG. 15 and their variants include.

FIG. 22 depicts a representative arrangement of elements for addressing the random-access memory 24 that FIG. 3 includes to support turbo decoding. A clocked up/down symbol counter 80 is reset to zero count output before each counting up and to a suitable initial count before each counting down. The direction of counting is controlled by a control signal from the decoding control unit 7, connection for which is not explicitly shown in FIG. 22. The clocked symbol counter 80 is connected to supply its count output to three read-only memories 81, 82 and 83 as read addressing for each of them. Each of the ROMs 81, 82 and 83 stores a respective list of addresses for storage locations in the RAM 25. Each of these lists of RAM 25 addresses is read, address by successive address, with incrementing or decrementing of the symbol count applied to the ROMs 81, 82 and 83 as read addressing. An addressing selector 84 is connected for reproducing addresses read from a selected one of the ROMs 81, 82 and 83 for application to the RAM 25. The addressing selector 84 is connected to receive control signal from the decoding control unit 7. This control signal determines which of the sets of addresses supplied from the ROMs 81, 82 and 83 is to be reproduced by the addressing selector 84 for application to the RAM 25.

The ROM 81 stores a first list of addresses for storage locations in the RAM 25. The addresses in this first list are sequentially reproduced by the addressing selector 84 when writing those storage locations initially with successive symbols from each successive one of the 170 data segments in an M/H Slot in the order that those symbols are received for such writing. The clocked up/down symbol counter 80 counts up during each initial writing subroutine. The addresses in the first list stored in ROM 81 are sequentially reproduced by the addressing selector 84 again each time that these symbols are read from the RAM 25 to the inner SISO decoder 27 via the inner-coding I/O unit 26. Also, the addresses in the first list stored in ROM 81 are sequentially reproduced by the addressing selector 84 again each time the RAM 25 is updated with decoding results supplied from the inner SISO decoder 27 via the inner-coding I/O unit 26. Valenti and Sun recommended that each SISO decoding subroutine in a cycle of turbo decoding be done in two passes, an initial pass in reverse direction to convolutional coding and a final pass in the direction of convolutional coding. The clocked up/down symbol counter 80 is conditioned to count down during each such initial pass in SISO decoding by the inner SISO decoder 27, both during reading from the RAM 25 and when writing back to the RAM 25 later on. The clocked up/down symbol counter 80 is conditioned to count up during each final pass in SISO decoding by the inner SISO decoder 27, both during reading from the RAM 25 and when writing back to the RAM 25 later on.

In an alternative design, rather than writing back to the RAM 25 at the conclusion of an initial pass in SISO decoding by the inner SISO decoder 27, interim decoding results can be retained in local memory within the SISO decoder 27. The contents of the local memory are scanned in reverse order of writing to support the final pass in SISO decoding by the SISO decoder 27. The final decoding results from the SISO decoder 27 are written back to the RAM. 25 at the conclusion of the final pass in SISO decoding. The clocked up/down symbol counter 80 is conditioned to count up for addressing the RAM 25 during its being written back to.

The ROM 82 stores a second list of addresses for selected storage locations in the RAM 25 that temporarily store the 118 non-systematic (207, 187) RS codewords of an M/H Group. Addresses from this second list are reproduced by the addressing selector 84 when the subroutine for decoding the non-systematic (207, 187) RS codewords from the M/H Group is performed. The addresses for the storage locations that store each non-systematic (207, 187) RS codeword appear twice in this second list, being repeated following their first appearance in the second list. The addresses for the storage locations that store a non-systematic (207, 187) RS codeword appear a first time in the second list when that codeword is being read from the RAM 25 to the decoder 28. Those addresses are repeated to appear a second time in the second list when the codeword is to be written back into the RAM 25 after possible correction by the decoder 28. The clocking of the symbol counter 80 is controlled to permit time for the decoder 28 to decode each non-systematic (207, 187) RS codeword read thereto from the RAM 25 before the codeword is written back into the RAM 25 after possible correction. The addressing of the RAM 25 is such as to de-interleave the convolutional byte interleaving of the 118 non-systematic (207, 187) RS codewords successively read from the RAM 25 to the decoder 28.

The ROM 83 stores a third list of addresses for selected storage locations in the RAM 25 that temporarily store symbols of the PCCC used in transmitting M/H data. The addressing selector 84 sequentially reproduces addresses in this third list each time that 2-bit symbols, each composed of a soft X-sub-2 bit and a soft Z-sub-1 bit, are read from those selected storage locations in the RAM 25 to be used in the subroutine for SISO decoding of the outer convolutional coding. The addresses in this third list are sequentially reproduced by the addressing selector 84 again each time response from the Gray-to-binary-code re-mapper 35 is processed by the extrinsic data feedback processor 36 for updating extrinsic data temporarily stored in the RAM 25. For each successive address applied to the RAM 25, the soft Z-sub-1 bit temporarily stored at the addressable storage location in the bank for temporarily storing soft Z-sub-1 bits is read to the extrinsic data feedback processor 36. The extrinsic data feedback processor 36 differentially combines the soft Z-sub-1 bit read the RAM 25 with a corresponding soft Z-sub-1 bit from the Gray-to-binary-code re-mapper 35. The resulting soft bit of extrinsic data is written back to the bank of the RAM 25 for temporarily storing soft bits of extrinsic data before the next successive address from the third list is applied to the RAM 25. The soft bit of extrinsic data written back from the extrinsic data feedback processor 36 over-writes any soft bit of extrinsic data previously stored at the addressable storage location, updating content of the RAM 25.

Decoding by the outer SISO decoder 33 is preferably done in two passes in each cycle of turbo decoding, an initial pass in reverse direction to outer convolutional coding and a final pass in the direction of outer convolutional coding. The clocked up/down symbol counter 80 is conditioned to count down when reading from the RAM 25 at the beginning of each initial pass in decoding the outer convolutional coding. The clocked up/down symbol counter 80 is conditioned to count up when writing back to the RAM 25 at the conclusion of each final pass in decoding the outer convolutional coding. If the RAM 25 were written back to at the conclusion of each initial pass in decoding the outer convolutional coding, the clocked up/down symbol counter 80 would be conditioned to count down. Then, the clocked up/down symbol counter 80 would be conditioned to count up when reading from the RAM 25 at the beginning of each final pass in decoding the outer convolutional coding. However, the procedures set forth in the previous two sentences are better omitted. Instead, the outer SISO decoder 33 retains in local memory therein the interim decoding results from the initial pass of decoding the outer convolutional coding. The contents of the local memory are scanned in reverse order of writing to support the final pass in of decoding the outer convolutional coding by the SISO decoder 33. This avoids delays between the initial and final passes of decoding by the SISO decoder 33 that would otherwise be introduced by cascading of the soft-symbol re-interleaver 34 and the soft-symbol de-interleaver 32.

Figure 23:
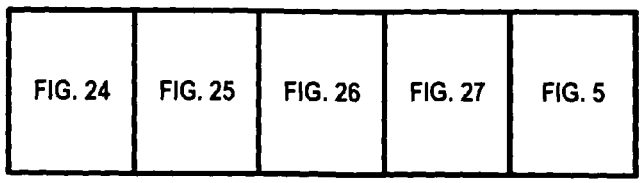
FIG. 23 is an assembly drawing indicating how FIGS. 24, 25, 26, 27 and 5 combine to provide a schematic diagram of a receiver for receiving M/H transmissions sent over the air as PCCC portions of an 8-VSB signal employing iterative diversity, or as PCCC portions of a plurality of 8-VSB signals employing frequency diversity.
Figure 24:
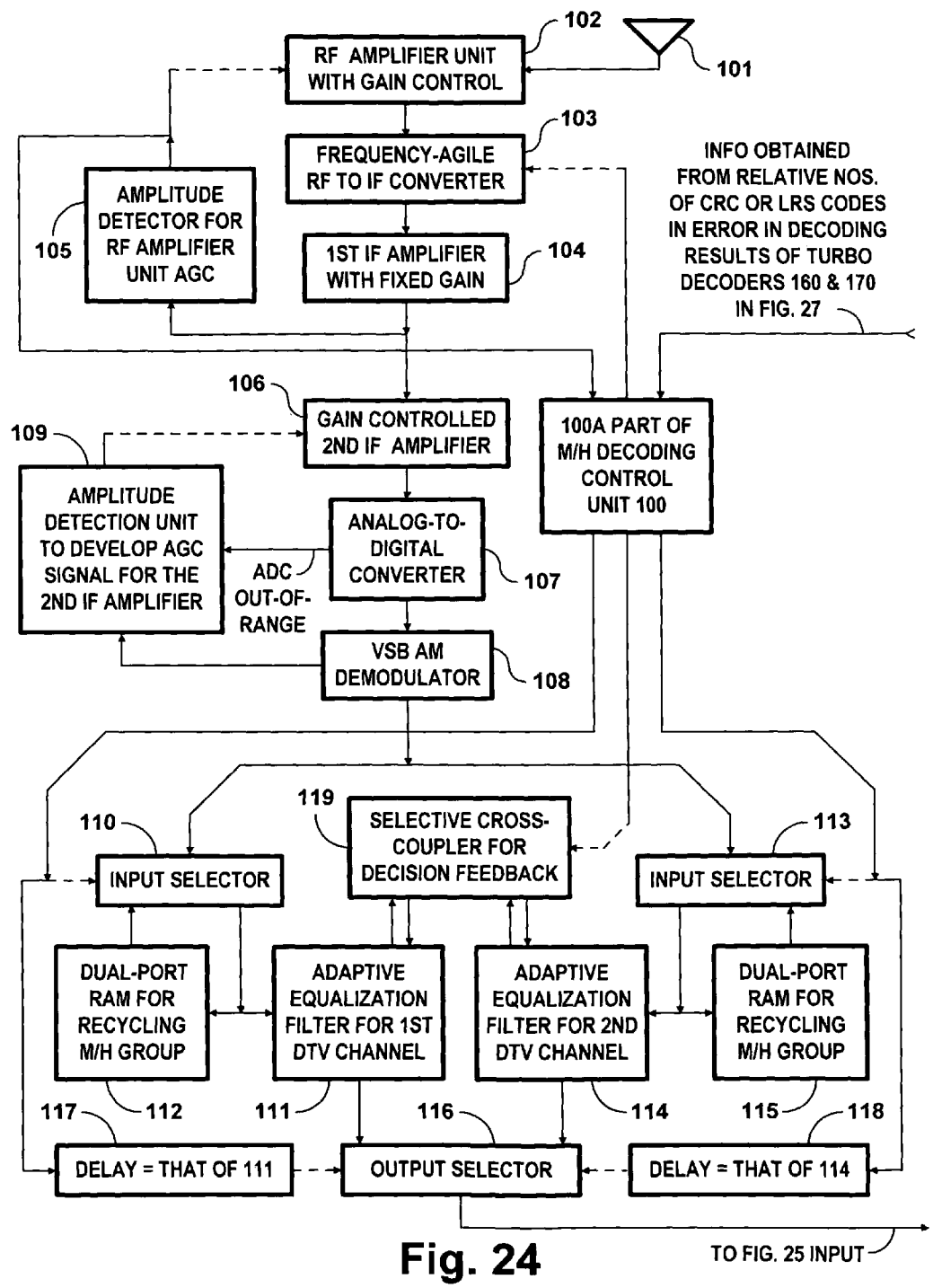
FIG. 24 is a schematic diagram of front-end tuner apparatus within the FIG. 23 M/H receiver apparatus for recovering baseband digital television signal, which front-end tuner apparatus includes a frequency-agile converter for converting frequency-diversity radio-frequency 8-VSB signals to baseband and further includes respective adaptive channel-equalization filtering for each 8-VSB signal.
Figure 25:
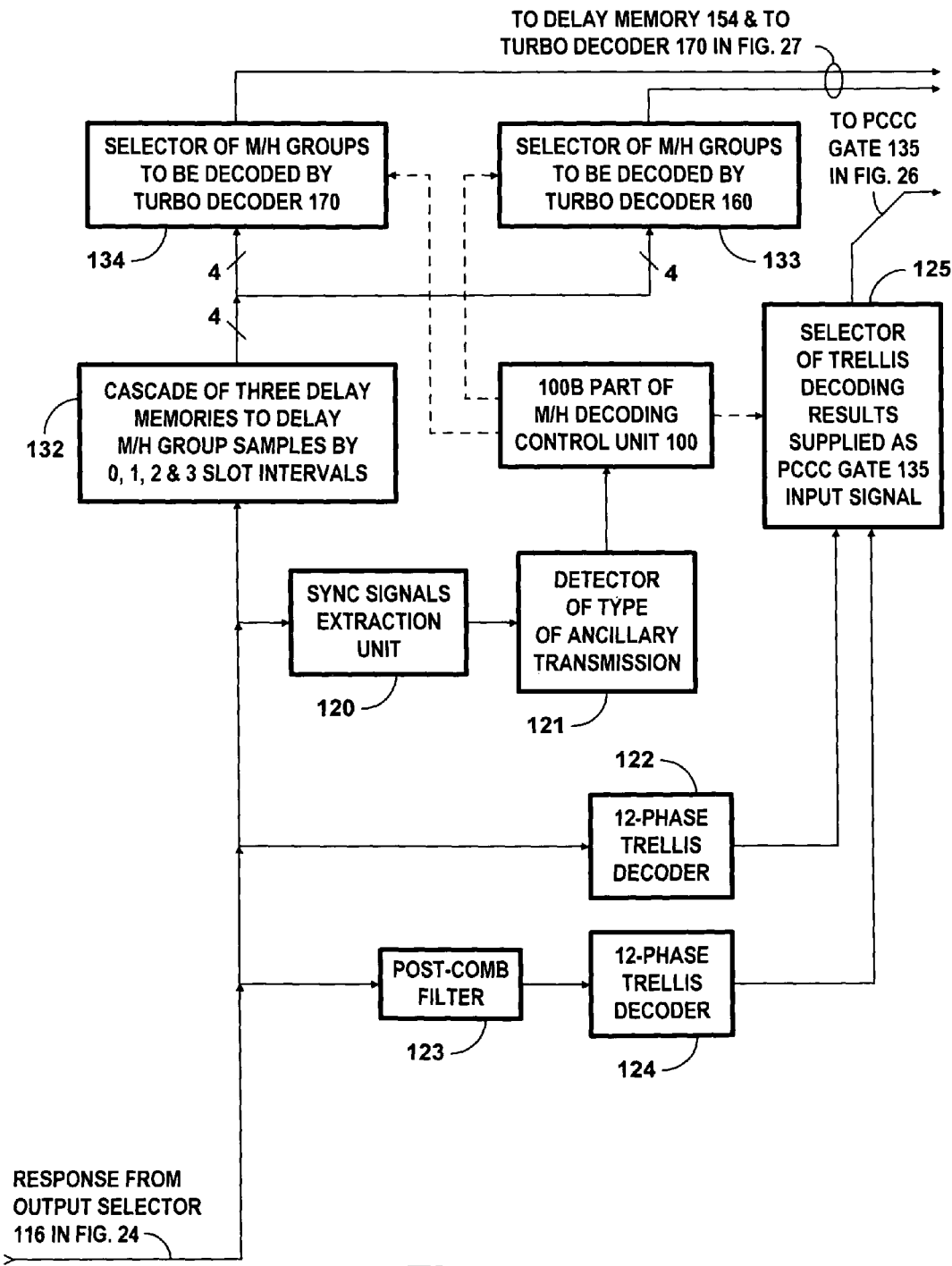
FIG. 25 is a schematic diagram of a portion of the FIG. 23 M/H receiver apparatus in which specific M/H slots are selected from baseband DTV signal for turbo decoding of the M/H Groups therein.
Figure 26:
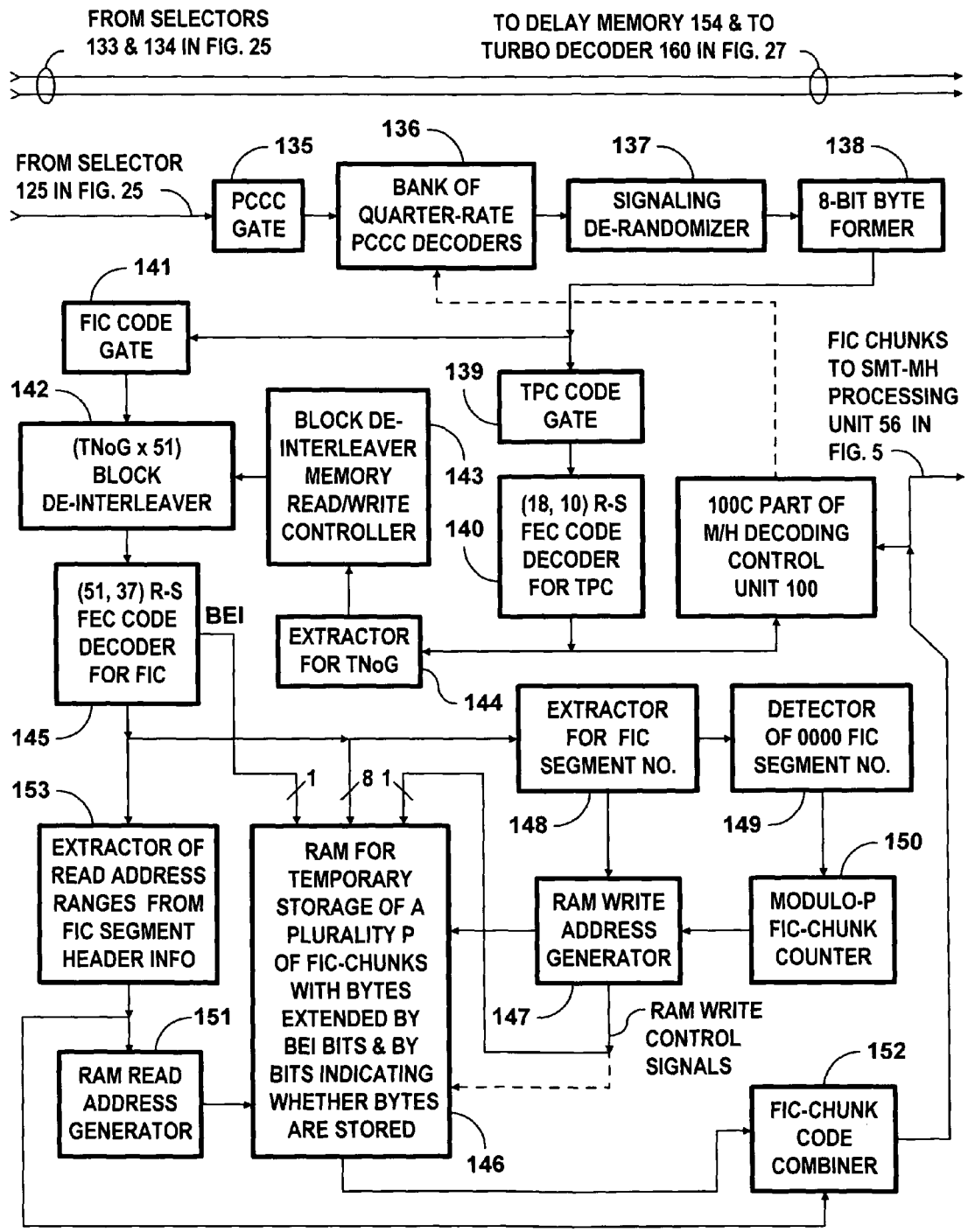
FIG. 26 is a schematic diagram of portions of the FIG. 23 M/H receiver apparatus to recover transmission parameter channel (TPC) signal and fast information channel (FIC) signal.

FIG. 23 is an assembly drawing that shows how FIGS. 24, 25, 26, 27 and 5 combine to provide a schematic diagram of a "FIG. 23" DTV receiver apparatus for receiving M/H transmissions broadcast from two DTV transmitters, each of the sort shown in FIG. 1 of the above-referenced U.S. patent application Ser. No. 12/928,186. The two DTV transmitters broadcast similar program material over different radio-frequency (RF) channels, and their coverage areas partially overlap. The FIG. 23 DTV receiver apparatus is designed for having continuing reception of the similar program material as it is moved from the coverage area of one of the two DTV transmitters to the coverage area of the other of the two DTV transmitters. Continuing reception of the similar program material requires that the movement of the FIG. 23 DTV receiver apparatus remain within the coverage area of at least one of the DTV transmitters broadcasting the similar program material. The number of DTV transmitters that broadcast the similar program material can exceed two, and there may be regions where the coverage areas of more than two of these DTV transmitters overlap. If the FIG. 23 DTV receiver apparatus is moved into such a region, its reception will be primarily directed towards receiving the stronger two of the RF signals available to it. The DTV transmitters that broadcast similar program material and that have overlapping coverage areas are presumed to transmit information concerning the respective TV channels those DTV transmitters use for broadcasting. This information is included in an optional Cell Information Table for ATSC-M/H (CIT-MH) that the transmitters concurrently transmit in selected IP packets for each M/H Service. One of the several functions of part 100A of the M/H decoding control unit 100 shown in FIG. 24 is the selection of the RF channels to be received, which selection takes the CIT-MH table into account. Part 100C of the M/H decoding control unit 100 shown in FIG. 26 is connected to receive the TPC signals of the RF channels selected for reception. The M/H decoding control unit 100 responds to the subchannel_interleaving numbers contained within these TPC signals to coordinate the selection of sub-channels conveying the same program material.

FIG. 24 shows an antenna 101 for capturing RF DTV signals applied as input signal to a radio-frequency amplifier unit 102 with automatic gain control (AGC). The antenna 101 and the RF amplifier unit 102 are capable of capturing and amplifying ultra-high-frequency (UHF) DTV signals. In some embodiments of the FIG. 18 DTV receiver apparatus the antenna 101 and the RF amplifier unit 102 are further capable of capturing and amplifying very-high-frequency (VHF) DTV signals, or at least the higher-frequency VHF DTV signals. The RF amplifier unit 102 is connected for supplying amplified RF DTV signals to a frequency-agile RF-to-IF converter 103 that converts radio-frequency (RF) DTV signals to intermediate-frequency (IF) DTV signals for application to a first intermediate-frequency amplifier 104 as input signal thereto. A part 100A of the M/H decoding control unit 100 is connected for selecting the beat frequency oscillations that the frequency-agile RF-to-IF converter 103 generates for implementing its RF-to-IF conversion. The first IF amplifier 104 has fixed gain and the amplified RF signal it supplies as output signal is applied as input signal to an amplitude detector 105, which responds to supply gain-control signal to the RF amplifier unit 102, thus completing a loop for its AGC. The gain-control signal developed by the amplitude detector 105 is also supplied to part 100A of the M/H decoding control unit 100, which includes circuitry for comparing the gain-control signals developed for RF DTV signals received at different times from different DTV transmitters. The results of this comparison are used to help in deciding when the signal received from a DTV transmitter is no longer of sufficient strength to be turbo decoded usefully.

The output signal from the first IF amplifier 104 is also applied as input signal to a second IF amplifier 106, which is gain-controlled. The second IF amplifier 106 is connected for supplying an amplified IF signal as its output signal. An analog-to-digital converter 107 is connected for digitizing the amplified IF signal supplied by the second IF amplifier 106. The ADC 107 is connected for supplying digitized amplified IF signal to an 8-VSB AM demodulator 108 operable for de-modulating the digitized vestigial-sideband amplitude-modulated IF carrier wave in that digitized amplified IF signal. The demodulator 108 supplies a digital signal descriptive of the baseband DTV signal that modulated the amplitude of the RF carrier wave from a DTV transmitter that was selected for reception by the FIG. 23 receiver apparatus. An amplitude detection unit 109 is used to develop automatic-gain-control (AGC) signal supplied to the second IF amplifier 106 for controlling the gain thereof. FIG. 24 shows the amplitude detection unit 109 connected for developing AGC signal partly in response to indications from the ADC 107 that its input signal from the first IF amplifier 104 is so large as to be out of range for proper digitization. FIG. 24 shows the amplitude detection unit 109 connected for developing AGC signal in further response to the amplified IF signal that the second IF amplifier 106 supplies as its output signal. A sophisticated design of the amplitude detection unit 109 data-slices the second IF amplifier 106 output signal using a bin comparator. Then, the amplitude detection unit 109 adjusts the gain of the second IF amplifier 106 to make the positive and negative variances of the output signal from bin centers substantially equal to each other. The portion of the FIG. 23 receiver apparatus described in this paragraph has a number of known substantial equivalents. Some of them demodulate the amplified VSB AM IF signal before analog-to-digital conversion to recover digital signal descriptive of baseband DTV signal.

An input selector 110 has a first input port to which the output signal of the demodulator 108 is applied, a second input port, and an output port connected to the input port of an adaptive equalization filter 111. Part 100A of the M/H decoding control unit 100 supplies a respective control signal to the input selector 110 conditioning the input selector 110 to reproduce at is output port a selected one of the respective signals applied to its first and second input ports. The control signal conditions the input selector 110 to reproduce only those portions of the output signal of the demodulator 108 responsive to DTV signal received from a first DTV transmitter. The adaptive equalization filter 111 performs adaptive channel equalization solely for the baseband DTV signal received from that first DTV transmitter, as reproduced at the output port of the input selector 110. A dual-port random-access memory 112 has a random-access port connected for being written to from the output port of the input selector 110 and has a serial output port connected for reading to the second input port of the input selector 110. The RAM 112 and the input selector 110 are operated for reapplying previous input signal to the input port of the adaptive equalization filter 111 when signal broadcast by the first DTV transmitter is not otherwise available for updating adaptation of the equalization filter 111. This provides the adaptive equalization filter 111 an extended time to converge its filter coefficients for that input signal.

An input selector 113 has a first input port to which the output signal of the demodulator 108 is applied, a second input port, and an output port connected to the input port of an adaptive equalization filter 114. Part 100A of the M/H decoding control unit 100 supplies a respective control signal to the input selector 113 conditioning the input selector 113 to reproduce at is output port a selected one of the respective signals applied to its first and second input ports. The control signal conditions the input selector 113 to reproduce only those portions of the output signal of the demodulator 108 responsive to DTV signal received from a second DTV transmitter. The adaptive equalization filter 114 performs adaptive channel equalization for the baseband DTV signal received from that second DTV transmitter, as reproduced at the output port of the input selector 113. A dual-port random-access memory 115 has a random-access port connected for being written to from the output port of the input selector 113 and has a serial output port connected for reading to the second input port of the input selector 113. The RAM 115 and the input selector 113 are operated for reapplying previous input signal to the input port of the adaptive equalization filter 114 when signal broadcast by the second DTV transmitter is briefly unavailable for updating adaptation of the equalization filter 114. This provides the adaptive equalization filter 114 an extended time to converge its filter coefficients for that input signal.

Part 100A of the M/H decoding control unit 100 generates respective control signals applied to the input selector 110 and to the input selector 113, taking into account the subchannel_interleaving information extracted from the TPC signals of received RF channels. When two or more DTV transmitters broadcast the same program material and their respective coverage areas overlap, preferably each DTV transmitter will broadcast that same program material in a different set of M/H Groups than the other DTV transmitter(s). This is described in detail in the above-referenced U.S. patent application Ser. No. 12/928,186. The M/H decoding control unit 100 relies on the subchannel_interleaving information for determining the time offset(s) between the same program material being transmitted at different radio frequencies by respective DTV transmitters. The FIG. 18 receiver may be situated where the coverage areas of two or more of these DTV transmitters overlap. Part 100A of the M/H decoding control unit 100 can then arrange for the frequency-agile RF-to-IF converter 103 to convert the RF signals from these DTV transmitters to IF signal on a time-staggered basis for amplification by the cascaded IF amplifiers 104 and 106. The amplified IF signals can then be digitized by the ADC 107 and subsequently demodulated by the VSB AM demodulator 108 to recover two transmissions of the same program material on the time-staggered basis. Subsequent parts 100B and 100C of the M/H decoding control unit 100 shown in FIGS. 25 and 26, respectively, can then arrange for the earlier received duplicate program material to be delayed so as to be contemporaneous with the duplicate program material as later received. Then, part 100C of the M/H decoding control unit 100 can arrange for both the earlier received and the later received duplicate program material to be turbo decoded concurrently with respective turbo decoders shown in FIG. 27. The turbo decoders can exchange information with each other concerning the confidence levels of the data bits they each decode, improving the decoding capability of the FIG. 23 receiver when it is situated where the coverage areas of two DTV transmitters overlap.

An output selector 116 is connected for reproducing at an output port thereof a selected one of the equalized baseband DTV signals respectively received at first and second input ports thereof. The first input port of the output selector 116 is connected for receiving the baseband response of the equalization filter 111, and the second input port of the output selector 116 is connected for receiving the baseband response of the equalization filter 114. FIG. 24 shows the control signal applied to the input selector 110 being delayed by a delay unit 117 to compensate for the latent delay of the adaptive equalization filter 111 and thereafter being applied as a first control signal to the output selector 116. The output selector 116 is conditioned by this first control signal selectively to reproduce at its output port the adaptive equalization filter 111 response to the DTV signal received from the first DTV transmitter. FIG. 24 shows the control signal applied to the input selector 113 being delayed by a delay unit 118 to compensate for the latent delay of the adaptive equalization filter 114 and thereafter supplied as a second control signal to the output selector 116. The output selector 116 is conditioned by this second control signal selectively to reproduce at its output port the adaptive equalization filter 114 response to the DTV signal received from the second DTV transmitter.

A selective cross-coupling of decision feedback for the adaptive equalization filters 111 and 114 provides for parallel incremental updating of their respective filter coefficients during iterative-diversity reception. The adaptive equalization filters 111 and 114 are structurally similar, each of them being of a type that uses a Kalman feedback loop for incrementally adjusting its filter coefficients. The M/H decoding control unit 100 is connected for generating control signal that controls a selective cross-coupler 119 of decision feedback for the adaptive equalization filters 111 and 114. This control signal indicates the times when frequency-diversity reception is not being used, but iterative-diversity reception is being used. During such times a portion of the selective cross-coupler 119 transmits incremental error information from the Kalman loop of the adaptive equalization filter 111 to the Kalman loop of the adaptive equalization filter 114. Also, during such times the selective cross-coupler 119 transmits incremental error information from the Kalman loop of the adaptive equalization filter 114 to the Kalman loop of the adaptive equalization filter 111. The one-to-three Slot-interval differential delay between the respective input signals to the equalization filters 111 and 114 is so long that there is no appreciable increase risk of undesired tendency toward self-oscillation in either Kalman loop. However, there appears to be an increase in adaptive gain. The selective cross-coupler 119 provides no cross-coupling of the Kalman loops of the adaptive equalization filters 111 and 114 during frequency-diversity reception, when the filters 111 and 114 have to equalize respective signals transmitted by two different transmitters.

The output port of the output selector 116 is connected for supplying the selectively reproduced responses of the adaptive equalization filters 111 and 114 to the portion of the FIG. 23 receiver shown in FIG. 25. FIG. 25 shows a connection for the output signal from the output selector 116 to be supplied directly to the input port of a synchronization signals extraction unit 120. Responsive to data-field-synchronization (DFS) signals, the sync extraction unit 120 detects the beginnings of data frames and fields. Responsive to data-segment-synchronization (DSS) signals, the sync extraction unit 120 detects the beginnings of data segments. The FIG. 23 DTV receiver apparatus uses the DSS and DFS signals for controlling its operations similarly to the way this is conventionally done in DTV receivers. None of FIGS. 24, 25, 26, 27 and 5 explicitly shows the apparatus and connections thereof for effecting these operations.

A decoder 121 for detecting the type of ancillary transmission responds to 8-bit sequences contained in final portions of the reserved portions of DFS signals separated by the sync extraction unit 120. The decoder 121 is connected for indicating the type of ancillary transmission to part 100B of the M/H decoding control unit 100, which control unit 100 controls turbo decoding of PCCC and plural-dimensional decoding of RS Frames in the FIG. 23 DTV receiver apparatus. The type of ancillary transmission that the decoder 121 detects may be one that conditions the decoder 121 to extract further information concerning the ancillary transmission from the initial portions of the reserved portions of DFS signals separated by the sync extraction unit 120. The decoder 121 is connected for supplying such further information to part 100B of the M/H decoding control unit 100. Many of the connections of the M/H decoding control unit 100 to the elements involved in turbo decoding of PCCC and in plural-dimensional decoding of RS Frames are not explicitly shown in FIGS. 24, 25, 26, 27 and 5, to keep them from being too cluttered to be understood readily.

FIG. 25 shows a connection for the output signal from the output selector 116 to be supplied directly to a 12-phase trellis decoder 122 as input signal thereto. FIG. 25 shows a connection for the output signal from the output selector 116 to be supplied to the input port of a post comb filter 123 that has its output port connected for supplying input signal for a 12-phase trellis decoder 124, which may be of Viterbi type. A selector 125 has first and second input ports connected for receiving trellis decoding results as supplied from the output ports of the trellis decoders 122 and 124 respectively. Part 100B of the M/H decoding control unit 100 is connected for supplying a control signal to the selector 125 for selecting which of the trellis decoding results received at the first and second input ports of the selector 125 will be reproduced at the output port thereof. The M/H decoding control unit 100 determines whether or not the DFS signal includes an indication that the most significant bits of the 8-VSB symbols of the PCCC used for TPC and FIC signaling were not precoded. If the M/H decoding control unit 100 determines that the DFS signal includes such an indication, the selector 125 is conditioned to select the trellis coding results from the trellis decoder 122 for reproduction therefrom. The selection of the trellis coding results from the trellis decoder 124 for reproduction by the selector 125 is based on the M/H decoding control unit 100 determining that the DFS signal includes no such indication. The trellis coding results reproduced at the output port of the selector 125 are forwarded to the portion of the FIG. 23 receiver shown in FIG. 26, to be used in the recovery of TPC and FIC signals.

FIG. 25 shows a connection for the output signal from the output selector 116 to be supplied as input signal to a tapped cascade connection 132 of three delay memories operable to delay each successively received M/H Group by 0, 1, 2 and 3 slot intervals. This tapped cascade connection 132 of the three delay memories combines with selectors among the delays they make available to provide a differential-delay-compensation unit to compensate for any differential delay between signals that contain the same program information and are received from different DTV transmitters used to implement frequency-diverse transmissions. These frequency-diverse transmissions have different types of subchannel interleaving as well, to permit reception by an M/H receiver that has only a single frequency-agile front-end tuner for RF signals. This compensation for the differential delay between signals that contain the same program information aligns the signals temporally, permitting them to be turbo-decoded concurrently by respective turbo decoders that interchange information concerning the confidence levels of data bits of that same program information.

Figure 27:
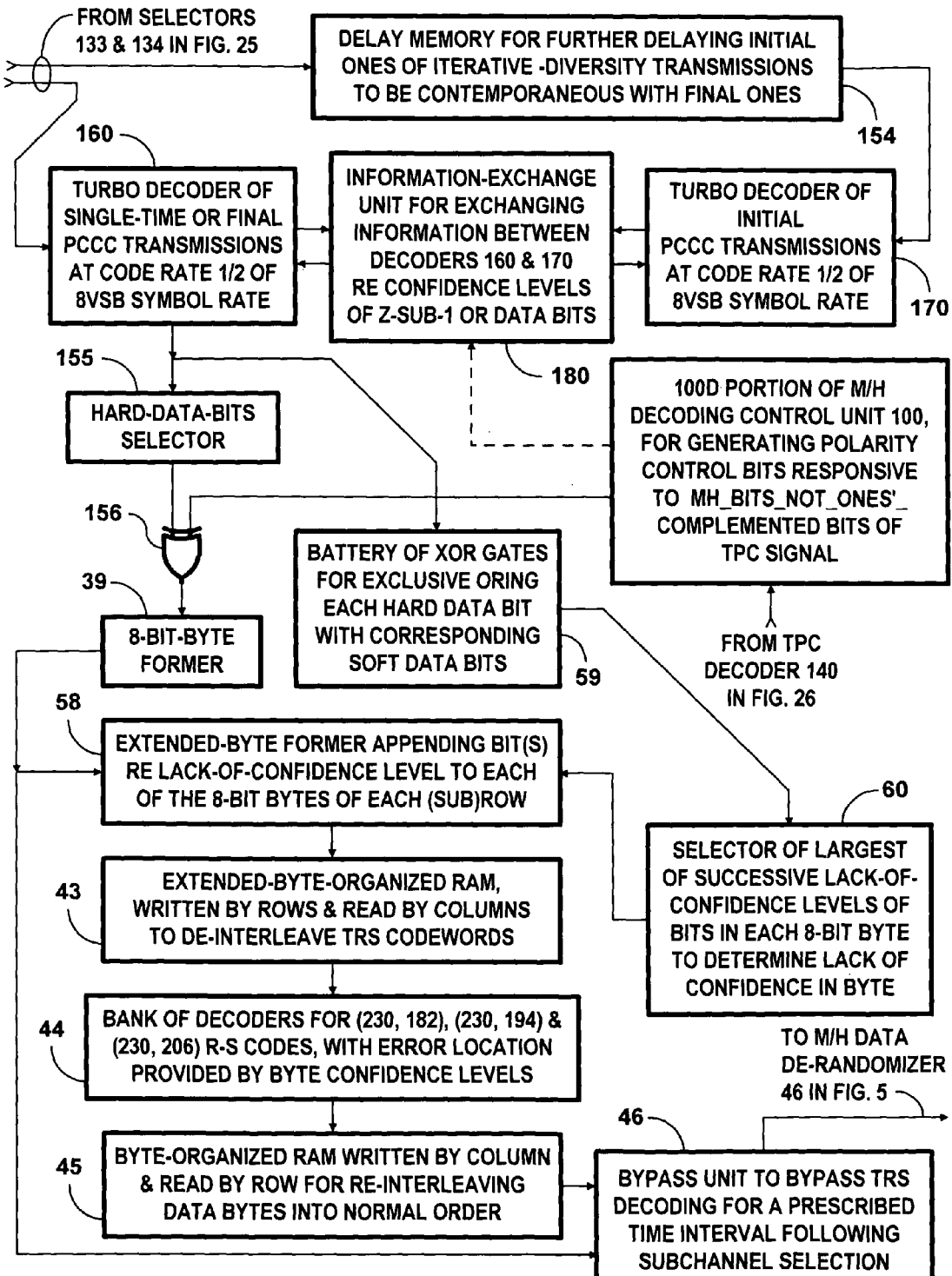
FIG. 27 is a schematic diagram of portions of the FIG. 23 M/H receiver apparatus, including paralleled turbo decoders for contemporaneously turbo decoding pairs of M/H Groups selected from baseband 8-VSB digital television signals to recover portions of transverse Reed-Solomon (TRS) codewords, and further including apparatus for decoding said TRS codewords.

A selector 133 is operable for selectively reproducing one of four input signals thereto at an output port thereof for subsequent application to the input port of a turbo decoder 160 shown in FIG. 27. These four input signals correspond to the M/H Groups of 8-VSB symbols as respectively delayed 0, 1, 2 and 3 slot intervals by the tapped cascade connection 132 of three delay memories. FIG. 25 shows the selector 133 connected for receiving a control signal from part 100B of the M/H decoding control unit 100. This control signal controls the selector 133 in its selection of the one of the four input signals thereto that the selector 133 reproduces at its output port.

A selector 134 is operable for selectively reproducing one of four input signals thereto at an output port thereof to be delayed by a delay memory 154 shown in FIG. 27 before subsequent application to the input port of a turbo decoder 170 shown in FIG. 27. These four input signals correspond to the M/H Groups of 8-VSB symbols as respectively delayed by 0, 1, 2 and 3 slot intervals by the tapped cascade connection 132 of three delay memories. FIG. 25 shows the selector 134 connected for receiving a control signal from part 100B of the M/H decoding control unit 100. This control signal controls the selector 134 in its selection of the one of the four input signals thereto that the selector 134 reproduces at its output port.

FIG. 26 shows a PCCC gate 135 connected for receiving trellis-decoding results from the selector 125, shown in FIG. 25. The PCCC gate 135 is operated for extracting the PCCC'd signaling within each Group and reproducing that PCCC'd signaling to be applied as input signal to a bank 136 of decoders for quarter-rate PCCC. The bank 136 of decoders includes a decoder for each type of quarter-rate PCCC signaling used for M/H broadcasting. A selected decoder in the bank 136 of decoders for quarter-rate PCCC reproduces randomized signaling decoded (possibly with some errors) from the quarter-rate PCCC supplied thereto and is connected for supplying that randomized signaling as input signal to a signaling de-randomizer 137. The de-randomizer 137 is connected for supplying de-randomized coded signaling to an 8-bit byte former 138.

FIG. 26 shows a TPC code gate 139 connected for extracting bytes of TPC code from bytes of the de-randomized signaling supplied by the byte former 138 and for supplying those extracted bytes of TPC code as input signal to a decoder 140 for (18, 10) Reed-Solomon coding. The decoder 140 recovers TPC information and is connected for supplying the TPC information to part 100C of the M/H decoding control unit 100 and to other elements of the receiver apparatus.

FIG. 26 shows an FIC code gate 141 connected for extracting byte-interleaved FIC code bytes from the bytes of de-randomized signaling supplied by the byte former 138 and reproducing those extracted bytes for application as input signal to a block de-interleaver 143. The block de-interleaver 143 is of matrix type and complements the block interleaving done per A/153 in the signaling encoder 16 shown in FIG. 1. In this specification the coined word "(over)writing" refers both to memory writing procedures in which storage locations are empty of content when written by new content and to memory writing procedures in which storage locations have their original contents overwritten by new content. The block de-interleaver 143 is essentially a byte-organized random access memory (RAM) with byte-storage locations arrayed in rows and columns to be (over)written and read in accordance with addressing and read/write control signals supplied from a block de-interleaver memory read/write controller 143. The byte-storage locations are arrayed in 51-byte rows for being (over)written by RS coded FIC data from respective Groups within each M/H sub-Frame. The memory read/write controller 143 needs to know the total number of Groups, TNoG, within each M/H sub-Frame in order to know the number of these 51-byte rows. The memory read/write controller 143 uses this knowledge to control the addressing of successive columns of TNoG byte-storage locations when writing to them.

An extractor 144 is connected to extract TNoG for the current M/H sub-Frame (current_TNoG) from the response of the decoder 140 of the (18, 10) Reed-Solomon coded TPC data. The value of current_TNoG appears NoG times in the TPC data recovered by the decoder 140 from the previous M/H sub-Frame. The extractor 144 selects from the TPC data those bit sequences descriptive of current_TNoG estimates and decides the value of current_TNoG based on the majority of concurring estimates. The extractor 144 is connected to supply that value of current_TNoG to the memory read/write controller 143. In an alternative procedure for determining TNoG for the current M/H sub-Frame, the training signal sequences in the current M/H sub-Frame are counted. The above-referenced U.S. patent application Ser. No. 12/800,559 filed 18 May 2010 describes apparatus for so determining TNoG, with reference to FIG. 28 of the drawings of that application.

After the final Group of each M/H sub-Frame concludes, the read/write controller 143 generates read addresses for reading rows of 35×TNoG bytes from the RAM in the block de-interleaver 143. The reading is completed before the initial Group of the next M/H sub-Frame begins and the contents of the memory in the block de-interleaver 143 will be overwritten. The block de-interleaver 143 is connected for supplying its de-interleaved FIC code response as input signal to a decoder 145 for (51, 37) Reed-Solomon coding. The decoder 145 recovers FIC information and is connected for supplying that FIC information to be written into addressed temporary-storage locations within a random-access memory 146. The decoder 145 generates a Byte Error Indication (BEI) bit whenever a (51, 37) Reed-Solomon codeword is found to contain byte error(s) that cannot be corrected. A BEI bit is generated when there is a momentary fade in received RF signal strength, for example.

The RAM 146 provides temporary storage for the bytes of the FIC information for one entire M/H Frame, plus two-bit extensions of those bytes. One of these extension bits is the BEI bit from the decoder 145 for (51, 37) RS coding. A further one of these extension bits is used for signaling whether or not byte-storage locations in the RAM 146 contain FIC information content. When the M/H receiver is initially powered up, or when there is a change in selection of the major reception channel, the contents of the RAM 146 are erased in bulk. This erasure sets the further one-bit extensions to signal the erasure—e.g., the further one-bit extensions are all set to ZERO.

A write address generator 147 is connected for supplying write addressing to the RAM 146 such that FIC information is stored at appropriate locations within the M/H Frame, even if that FIC information begins to be furnished part way through the M/H Frame. An extractor 148 is connected for extracting the current FIC-Segment number from the header of the FIC Segment being currently written into the RAM 146 and supplying that current FIC-Segment number to the write address generator 147. The extractor 148 is further connected for supplying the current FIC-Segment number to a detector 149 for generating a pulse response to the current FIC-Segment number being '0000'. The detector 149 can be a four-input NOR gate operating as a decoder for 0000. An FIC-Chunk counter 150 is connected for receiving pulse responses from the detector 149 as count input signal. The write address generator 147 combines the FIC-Chunk count supplied from the counter 150 with the current FIC-Segment number supplied from the extractor 148 to generate each write address that the write address generator 147 supplies to the RAM 146.

The write addresses that the write address generator 147 supplies to the RAM 146 are accompanied by write control signals, which write control signals are also supplied as the further extension bits of the extended bytes supplied for being written into storage locations of the RAM 146. The value of these write control signals is the opposite—e.g., ONE—of the value indicating that a byte-storage location is empty of content. Accordingly, the further extension bits temporarily stored in respective extended-byte-storage locations of the RAM 146 are indicative of whether or not those locations store bytes of FIC information.

A read address generator 151 is connected for supplying read addressing to the RAM 146 when the RAM 146 reads its stored FIC information to provide input signal for an FIC-Chunk code combiner 152 at the conclusion of each M/H Frame interval. The FIC-Chunk code combiner 152 is connected for supplying processed FIC Chunks to part 100C of the M/H decoding control unit 100. (FIG. 5 shows processed FIC Chunks from the FIC-Chunk code combiner 152 being supplied to SMT-MH processing unit 55 to be integrated with SMT-MH information during the generation of Service Map Data, which are written into memory 56 for temporary storage therewithin.) The FIC-Chunk code combiner 152 combines correct 37-byte FIC-Segments from similar FIC-Chunks to generate correct FIC-Chunks, if possible.

The decoder 145 for (51, 37) RS coding is connected for supplying FIC-Segments to a read-address-ranges extractor 153 for extracting information from their headers concerning the FIC_last_segment_num(ber) of each of the FIC-Chunks, P in number, temporarily stored in the RAM 146. This information is temporarily stored in memory within the read-address-ranges extractor 153 to be used for controlling the operation of the read address generator 151 when reading FIC-Chunks in parallel from the RAM 146 to the FIC-Chunk code combiner 152.

FIG. 27 shows the turbo decoder 160 for PCCC signal and the delay memory 154 connected for receiving respective input signals from the selector 133 and from the selector 134 in FIG. 25. The delay memory 154 is operated for temporally aligning the initial-component transmissions of an iterative-diversity broadcast as reproduced in its delayed response with the final-component transmissions of the iterative-diversity broadcast as applied to the turbo decoder 160. The response of the delay memory 154 is applied as input signal to the turbo decoder 170 for PCCC signal, which turbo decoder 170 is selectively operated in parallel with the turbo decoder 160. The delay memory 154 provides a number of M/H Frame intervals of delay as determined by the M/H decoding control unit 100 in response to the iterative_diversity_delay bits extracted from the TPC signal that the decoder 140 for (18, 10) RS FEC code supplies. This number of M/H Frame intervals will be zero if a code rate one-quarter the 8-VSB symbol rate is desired without resort to iterative diversity, but is more likely to be eight, twelve or sixteen.

The differential delay between the initial-component transmissions and the final-component transmissions of an iterative-diversity broadcast is not compensated for in a single stage of delay memory in the FIG. 23 M/H receiver apparatus. Rather, the differential delay is compensated for in two stages, as described in the above-referenced U.S. patent application Ser. No. 12/800,559. The time interval between an initial-component transmission and the corresponding final-component transmission of an iterative-diversity broadcast can be considered to be an integral number of M/H Frame intervals plus or minus a fraction of an M/H sub-Frame interval. The component of the differential delay that is a fraction of an M/H sub-Frame interval is compensated for by the portion of the FIG. 25 apparatus comprising elements 132, 133 and 134, which elements are also used to compensate for the differential delay encountered during frequency-diversity reception. The M/H decoding control unit 100 determines the fraction of an M/H sub-Frame interval of delay to be compensated for by the portion of the FIG. 25 apparatus comprising elements 132, 133 and 134. This determination proceeds starting from the subchannel_interleaving bits in the TPC signal. The integral number of M/H Frame intervals component of the differential delay is compensated for by the delay memory 154, which affords delay as programmed by the M/H decoding control unit 100 responsive to the iterative_diversity_delay bits in the TPC signal.

A selected portion of the equalized baseband DTV signal supplied from the output port of the selector 133 in FIG. 25 as possibly subjected to some delay is applied to the turbo decoder 160 as its input signal. A selected portion of the equalized baseband DTV signal supplied from the output port of the selector 134 in FIG. 25 is applied to the input port of the delay memory 154 to be temporarily stored before being read out to the turbo decoder 170 as input signal thereto. The turbo decoders 160 and 170 have respective structures each generally similar to that shown in FIG. 3 or in FIG. 15, but being modified to share an information-exchange unit 180. If the delay memory 154 is supplied with the final-component transmissions of a frequency-diversity broadcast as input signal, those final-component transmissions are forwarded immediately to the turbo decoder 170 as input signal thereto. The elements 132, 133 and 134 are operable to provide shimming delays of the input signals applied to the turbo decoders 160 and 170 such that these respective final-component transmissions are essentially contemporaneous with each other.

If the delay memory 154 is written with the initial-component transmissions of an iterative-diversity broadcast that are supplied from the output port of the selector 134 in FIG. 25, the delay memory 154 temporarily stores each initial-component transmission until the corresponding final-component transmission of that data appears in the response from the output port of the selector 133 in FIG. 25. Each initial-component transmission of data is subsequently read to provide input signal to the turbo decoder 170 that is concurrent with the corresponding final-component transmission of that data applied as input signal to the turbo decoder 160.

The delay memory 154 facilitates the parallel operation of the turbo decoders 160 and 170 to decode respectively the initial-component transmissions and the final-component transmissions of an iterative-diversity PCCC broadcast. Furthermore, the concurrent decoding operations of the turbo decoders 160 and 170 permit the information-exchange unit 180 connected between corresponding points in their respective turbo loops to exchange information concerning the confidence levels of soft data bits. The turbo decoder 160 is operated alone when receiving a single-time PCCC broadcast that does not employ iterative diversity. The delay memory 154, the turbo decoder 170 and the information-exchange unit 180 are not operated when receiving a single-time PCCC broadcast and do not need to be powered at such time.

When a DTV transmitter is operated to permit iterative-diversity reception of its signals alone, the data bits of the early-component transmissions preferably ones' complement the data bits of the corresponding late-component transmissions. When similar program material is broadcast by two cooperating DTV transmitters having respective coverage areas that overlap, it is advantageous for one of the cooperating DTV transmitters to transmit the similar program material in ones' complemented form. When broadcasting is of a sort described in the foregoing two sentences, the information-exchange unit 180 needs to compare the confidence levels of two sets of data bits that are complementary to each other. If similar program material is broadcast by three cooperating DTV transmitters having respective coverage areas all of which overlap in certain regions, two of the transmitters will have to transmit respective sets of data bits that are alike, rather than complementary to each other. Depending on the location of the FIG. 23 receiver apparatus, the information-exchange unit 180 is apt to have to compare the confidence levels of two sets of data bits that are similar to each other, rather than complementary to each other. Accordingly, the information-exchange unit 180 is constructed so it can accommodate comparison of the confidence levels of the two sets of data bits from the turbo loops of decoders 160 and 170 when those sets of data bits are similar to each other, rather than complementary to each other. FIG. 27 shows a portion 100D of the M/H decoding control unit 100 connected for supplying the information-exchange unit 180 a binary control signal. This binary control signal indicates which of the two modes of comparison of the confidence levels of the two sets of data bits from the turbo loops of decoders 160 and 170 is appropriate to use. The M/H decoding control unit 100 generates this binary control signal, which has a first value during iterative-diversity reception of a single DTV channel. When first and second DTV channels are being received in a region where the coverage areas of their transmitters overlap, the M/H decoding control unit 100 generates the binary control signal responsive to the result of exclusive-ORing the M/H_data_not_ones'_complemented? bits in the TPC signals of the first and second DTV channels.

The turbo decoder 160 is connected for supplying its decoding results to a hard-data-bits selector 155 that selects respective hard-decision bits from the soft data bits. As noted in the previous paragraph, some transmitters send a single transmission or the late component-transmission for iterative-diversity reception with ones' complemented data bits. So, the turbo decoding results when receiving M/H data from such transmitters need to be ones' complemented to regenerate the original data bits. The hard-decision unit 155 is connected for supplying hard-decisions concerning data bits to one of two input connections of an exclusive-OR gate 155. Part 100D of the M/H decoding control unit 100 is connected for supplying the other input connection of the XOR gate 155 a binary control signal. The M/H decoding control unit 100 generates this binary control signal dependent on the M/H_bits_not_ones'_complemented? bits in the TPC signal of the baseband DTV signal being decoded by the turbo decoder 160. If the hard-decisions concerning data bits supplied to the XOR gate 155 regenerate the original data bits, the value of the binary control signal supplied to the XOR gate 155 is ZERO. If the hard-decisions concerning data bits supplied to the XOR gate 155 need to be ones' complemented to regenerate the original data bits, the value of the binary control signal supplied to the XOR gate 155 is ONE. In either case the data bits in the output signal of the XOR gate 155 reproduce the original M/H data bits, presuming them not to be corrupted by noise.

In their operation and interconnections the elements 38, 42-45 and 58-60 shown in FIG. 27 correspond respectively to the elements 38, 42-45 and 58-60 shown in FIG. 13. FIG. 27 shows the 8-bit-byte former 38 connected for forming the serial-bit response of the XOR gate 155 into eight-bit bytes. The extended-byte former 58 is connected for receiving the 8-bit bytes formed by the 8-bit-byte former 38 and appending to each of those bytes a number of bits indicative of the likelihood that that byte is in error. These bits indicative of the level of lack of confidence that a byte is correct are generated in the following way. The battery 59 of exclusive-OR gates is connected for exclusive-ORing the hard bit of each successive soft data bit from the turbo decoder 160 output signal with each of the soft bits descriptive of the level of confidence that hard bit is correct. The battery 59 of XOR gates thus generates a respective set of bits indicative of the level of lack of confidence that each successive hard bit is correct. The selector 60 selects the largest of the successive lack-of-confidence levels regarding the eight bits in each 8-bit-byte to provide the bits indicative of the level of lack of confidence that the byte is correct. The combination of the 8-bit-byte former 38, the extended-byte former 58, the battery 59 of XOR gates and the selector 60 of the largest lack-of-confidence level accompanying the bits in each 8-bit byte is referred to collectively as an "extended-byte generator".

The resulting extended bytes are written row-by-row or subrow-by-subrow into respective rows of extended-byte storage locations in the RAM 42, operated to perform the matrix-type block de-interleaving procedure that is a first step of the TRS decoding routine. The RAM 42 is subsequently read one column of 9-bit extended bytes at a time to a selected one of the bank 43 of decoders for (230, 182), (230, 194) and (230, 206) Reed-Solomon codes, respectively. The M/H decoding control unit 100 selects the appropriate decoder in response to information extracted from the TPC. The extension bits accompanying the 8-bit bytes of the TRS code are used to help locate byte errors for the TRS code. Such previous location of byte errors facilitates successful use of a Reed-Solomon algorithm capable of correcting more byte errors than an algorithm that must locate byte errors as well as correct them. The 8-bit data bytes that have been corrected insofar as possible by the selected one of the RS decoders in the bank 43 are written, column by column, into respective columns of byte-storage locations of the RAM 44. The RAM 44 is operated to perform the matrix-type block re-interleaving procedure for data in further steps of the TRS decoding routine. In a final step of the TRS decoding routine, the byte-storage locations in the RAM 44 are read from row-by-row for supplying reproduced randomized M/H data to the bypass unit 45. The bypass unit 45 usually relays this reproduced randomized M/H data to the M/H data de-randomizer 46 shown in FIG. 5. The bypass unit 45 is connected to bypass TRS decoding for a prescribed time interval following selection of a new sub-channel for reception, however, supplying the data de-randomizer 46 with bytes of randomized M/H data taken directly from the response of the byte former 38.

Figure 28:
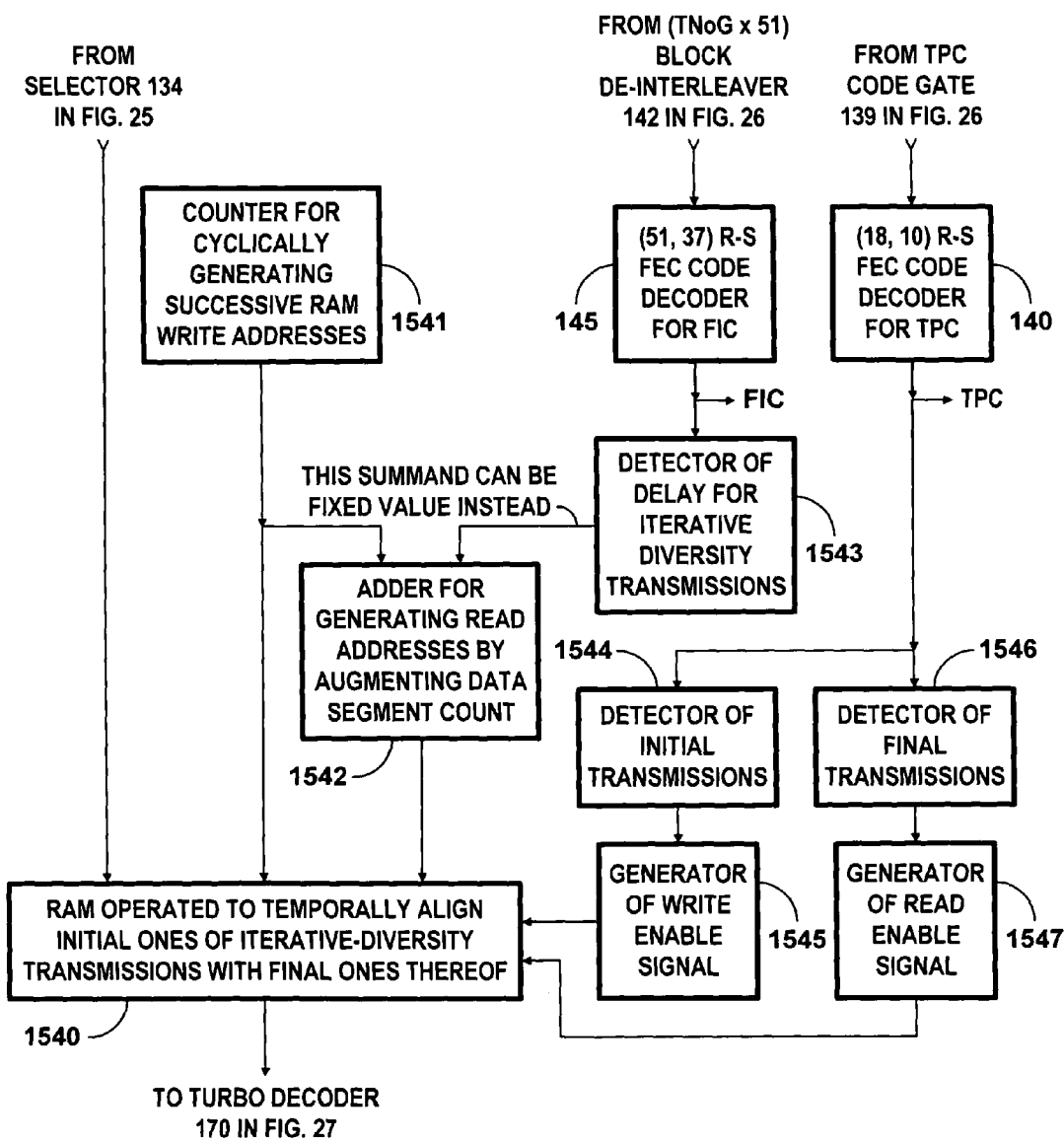
FIG. 28 is a detailed schematic diagram of a representative embodiment of the delay memory used in the FIG. 26 portion of the FIG. 23 receiver apparatus for delaying initial transmissions of M/H data, so as to align them in time with final transmissions of the same M/H data when iterative-diversity transmissions are being received.

FIG. 28 shows more particularly a random-access memory 1540 being used as the basis of the delay memory 154 that FIG. 27 shows for delaying the initial-component transmissions when receiving an iterative-diversity broadcast of coded M/H data. FIG. 28 depicts, in detail, the circuitry used to support the operation of the RAM 1540. FIG. 28 shows a counter 1541 connected for cyclically generating successive write addresses for the RAM 1540. The output count from the counter 1541 is partitioned into a data field count, a data segment count and an 8-VSB symbol count. The data segment count, the 8-VSB symbol count and the least significant bit of the data field count are reset to appropriate values responsive to information in the data field synchronizing (DFS) signals at the beginning of 8-VSB data fields. The RAM 1540 accepts a full range of data segment count that is an integer multiple M times 312 in number, as partial addresses both for writing and for reading.

A digital adder 1542 is connected for generating read addresses for the RAM 1540 by augmenting the data segment count portions of the successive write addresses for the RAM 1540 generated by the counter 1541. The augmentation can be a fixed value, for offsetting the write addresses from the read addresses that they respectively augment by a specified odd multiple of 156, which multiple is typically 156 times either 81 or 79.

FIG. 28 shows a more sophisticated way of determining the offset between write addresses and read addresses for the RAM 1540. The offset is determined responsive to an indication supplied by bits in the FIC signal from the decoder 145 for the (51, 37) RS FEC coded FIC. A detector 1543 of the delay for iterative diversity transmission responds to these bits to generate the offset between the data segment count portions of the write and read addresses to be supplied to the RAM 1540. This offset is supplied as the summand input signal to the digital adder 1542 that augments the data segment count portions of the successive write addresses generated by the counter 1541, thus to generate read addresses for the RAM 1540. Programming the offset between write addresses and read addresses for the RAM 1540 responsive to bits of the FIC signal, allows receivers to be made with different amounts of storage capability for bytes of iterative-diversity signals. As memory becomes cheaper, more receivers can be built with longer delays for overcoming momentary drop-outs in received signal strength. More importantly perhaps, such programming offers the broadcaster some trade-off in the way the RAM 1540 is used in the receiver. If fewer Slots are used for iterative-diversity transmissions, the excess storage capacity of the RAM 1540 can be utilized to provide longer delay for overcoming momentary drop-outs in received signal strength.

The RAM 1540 will seldom, if ever, be called upon to temporarily store more than 40 M/H Groups of data per M/H Frame. The RAM 1540 will never be called upon to temporarily store more than 40 M/H Groups of data per M/H Frame if careful broadcast practices are followed. Accordingly, the number of storage locations in the RAM 1540 can be halved if their addressing takes into account the subchannel_interleaving and iterative_diversity_mode information extracted from TPC signaling.

A detector 1544 for detecting initial transmissions is connected for receiving TPC signal from the decoder 140 for the (18, 10) RS FEC coded TPC. The TPC signal presumably includes an iterative_diversity_mode datum. The detector 1544 responds to that iterative_diversity_mode datum indicating an initial transmission is currently being made to condition a generator 1545 of write-enable signal to begin generating a write-enable signal for application to the RAM 1540. Generation of the write-enable signal continues until the then current Slot concludes. The RAM 1540 is conditioned by the write-enable signal to write the equalized baseband M/H signal supplied from the selector 134 to symbol storage locations specified by the write addressing received from the digital adder 1542. These symbol storage locations will not be reached for reading until a second or so later.

A detector 1546 for detecting final transmissions is connected for receiving TPC signal from the decoder 140 for the (18, 10) RS FEC coded TPC. The detector 1546 responds to the iterative_diversity_mode datum indicating an final transmission being currently made to condition a generator 1547 of read-enable signal to begin generating a read-enable signal for application to the RAM 1540. Generation of the read-enable signal continues until the then current Slot concludes. The RAM 1540 is conditioned by the read-enable signal to read delayed equalized baseband PCCC from symbol storage locations specified by the read addressing received from the counter 1541. The delayed equalized baseband PCCC is read from the RAM 1540 to supply input signal to the turbo decoder 170 for the initial-component transmissions of the iterative-diversity broadcast. The turbo decoder 170 is depicted in FIG. 27.

FIGS. 29, 30, 31 and 32 illustrate various ways in which the information-exchange unit 180 is connected within the respective turbo decoding loops of the paired turbo decoders 160 and 170. The basic structure of each of the turbo decoders 160 and 170 is presumed to be similar to that shown in FIG. 3 or to that shown in FIG. 15. FIGS. 29, 30, 31 and 32 show only those portions of the structures of the turbo decoders 160 and 170 with which the information-exchange unit 180 interconnects. The information-exchange unit 180 comprises a component part 180A connected within the turbo decoding loop of the turbo decoder 160 and further comprises a component part 180B connected within the turbo decoding loop of the turbo decoder 170. If the confidence levels of data bits in one of the turbo decoding loops are higher than the confidence levels of the corresponding data bits in the other of the turbo decoding loops, the information-exchange unit 180 adjusts those corresponding data bits. They are adjusted to be more like the data bits with the higher confidence levels.

Figure 29:
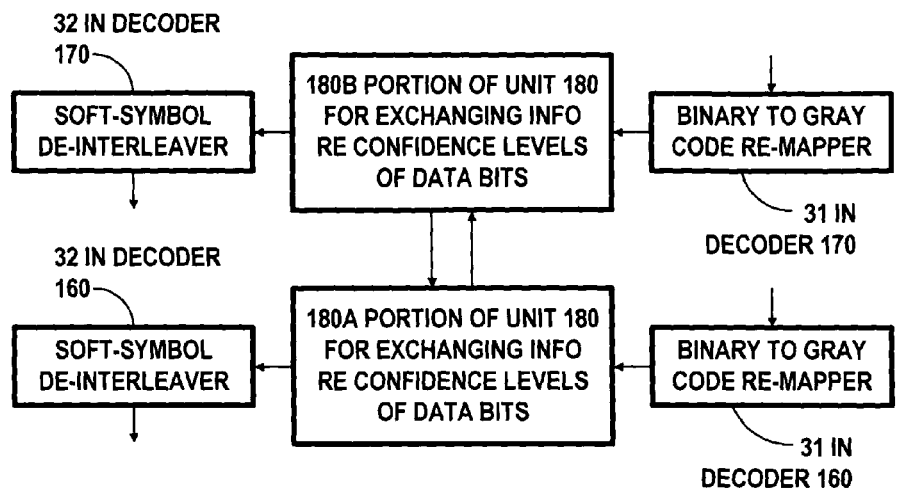
FIGS. 29, 30, 31 and 32 are schematic diagrams of portions of the paralleled turbo decoders shown in FIG. 27 showing various connections of units for exchanging information between those turbo decoders.
Figure 30:
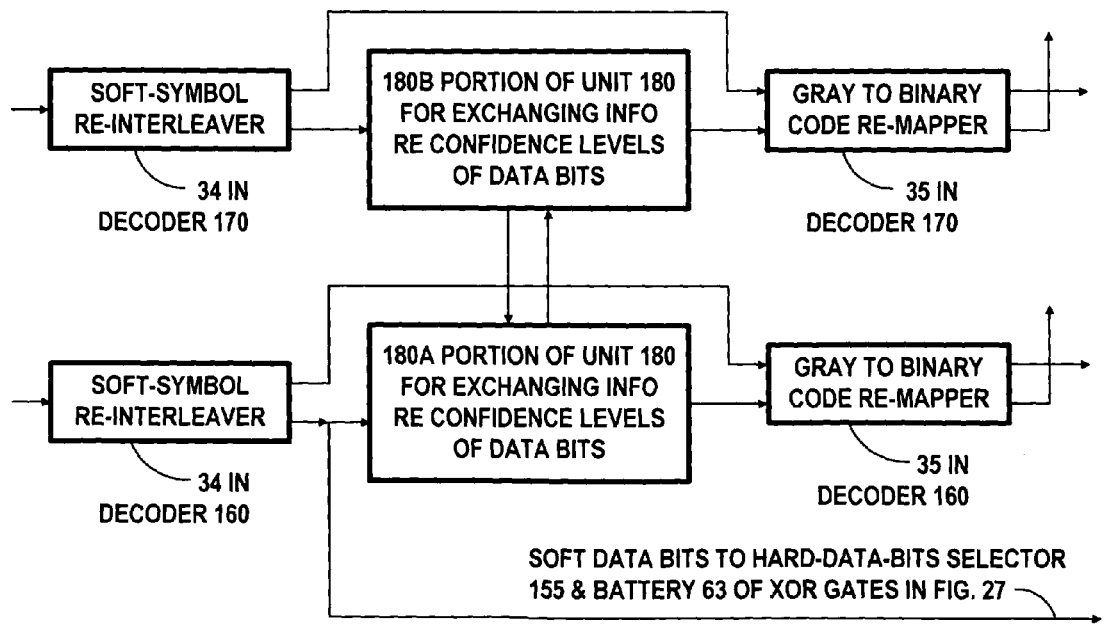

FIG. 29 shows component part 180A of the information-exchange unit 180 connected to respond to data bits furnished from the output port of the binary-to-Gray-code re-mapper 31 in the turbo decoder 160 and to data bits supplied from component part 180B of the information-exchange unit 180. The component part 180A of the information-exchange unit 180 is further connected for supplying adjusted data bits to the input port of the soft-symbol de-interleaver 32 in the turbo decoder 160. FIG. 30 also shows component part 180B of the information-exchange unit 180 connected to respond to data bits furnished from the output port of the binary-to-Gray-code re-mapper 31 in the turbo decoder 170 and to data bits supplied from component part 180A of the information-exchange unit 180. The component part 180B of the information-exchange unit 180 is further connected for supplying adjusted data bits to the input port of the soft-symbol de-interleaver 32 in the turbo decoder 170.

FIG. 30 shows component part 180A of the information-exchange unit 180 connected to respond to data bits furnished from the output port of the soft-symbol re-interleaver 34 in the turbo decoder 160 and to data bits supplied from component part 180B of the information-exchange unit 180. The component part 180A of the information-exchange unit 180 is further connected for supplying adjusted data bits to the input port of the Gray-to-binary-code re-mapper 35 in the turbo decoder 160. FIG. 30 also shows component part 180B of the information-exchange unit 180 connected to respond to data bits furnished from the output port of the soft-symbol re-interleaver 34 in the turbo decoder 170 and to data bits supplied from component part 180A of the information-exchange unit 180. The component part 180B of the information-exchange unit 180 is further connected for supplying adjusted data bits to the input port of the Gray-to-binary-code re-mapper 35 in the turbo decoder 170.

Figure 31:
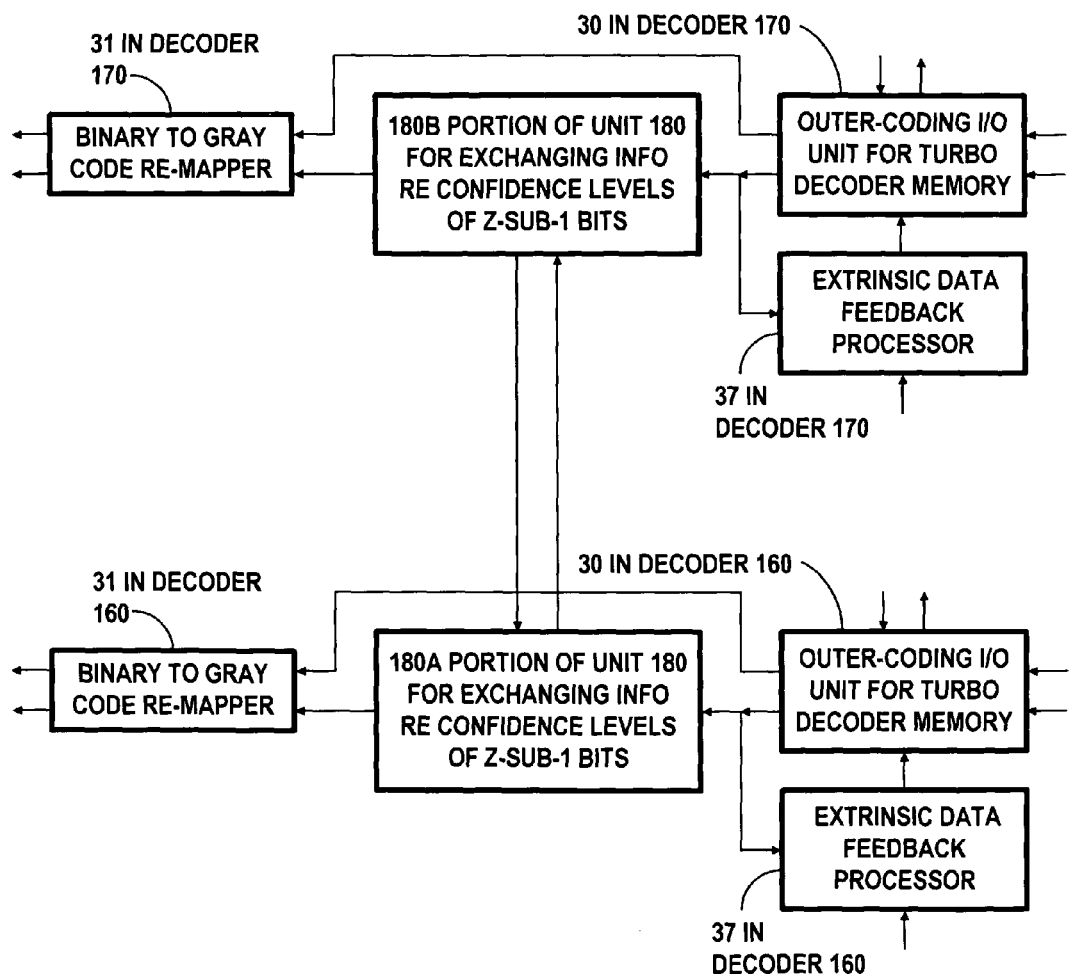

FIG. 31 shows component part 180A of the information-exchange unit 180 connected to respond to data bits furnished from an output port of the outer-coding I/O unit 30 in the turbo decoder 160 and to data bits supplied from component part 180B of the information-exchange unit 180. The component part 180A of the information-exchange unit 180 is further connected for supplying adjusted data bits to the input port of the binary-to-Gray-code re-mapper 31 in the turbo decoder 160. FIG. 31 also shows component part 180B of the information-exchange unit 180 connected to respond to data bits furnished from an output port of the outer-coding I/O unit 30 in the turbo decoder 170 and to data bits supplied from component part 180A of the information-exchange unit 180. The component part 180B of the information-exchange unit 180 is further connected for supplying adjusted data bits to the input port of the binary-to-Gray-code re-mapper 31 in the turbo decoder 170.

Figure 32:
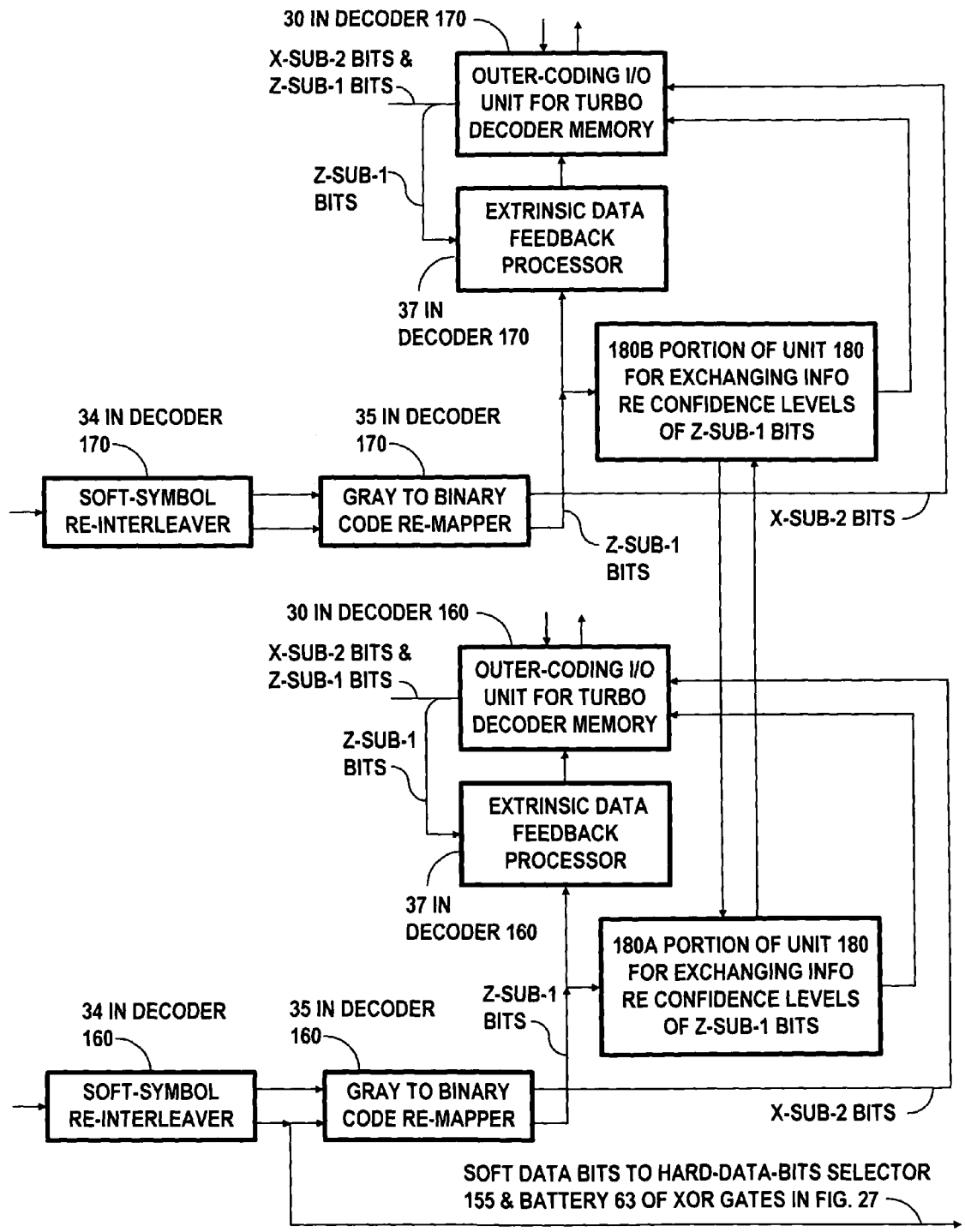

FIG. 32 shows component part 180A of the information-exchange unit 180 connected to respond to data bits furnished from an output port of the Gray-to-binary-code re-mapper 35 in the turbo decoder 160 and to data bits supplied from component part 180B of the information-exchange unit 180. The component part 180A of the information-exchange unit 180 is further connected for supplying adjusted data bits to an input port of the outer-coding I/O unit 30 in the turbo decoder 160. FIG. 32 also shows component part 180B of the information-exchange unit 180 connected to respond to data bits furnished from an output port of the Gray-to-binary-code re-mapper 35 in the turbo decoder 170 and to data bits supplied from component part 180A of the information-exchange unit 180. The component part 180B of the information-exchange unit 180 is further connected for supplying adjusted data bits to an input port of the outer-coding I/O unit 30 in the turbo decoder 170.

Figure 33:
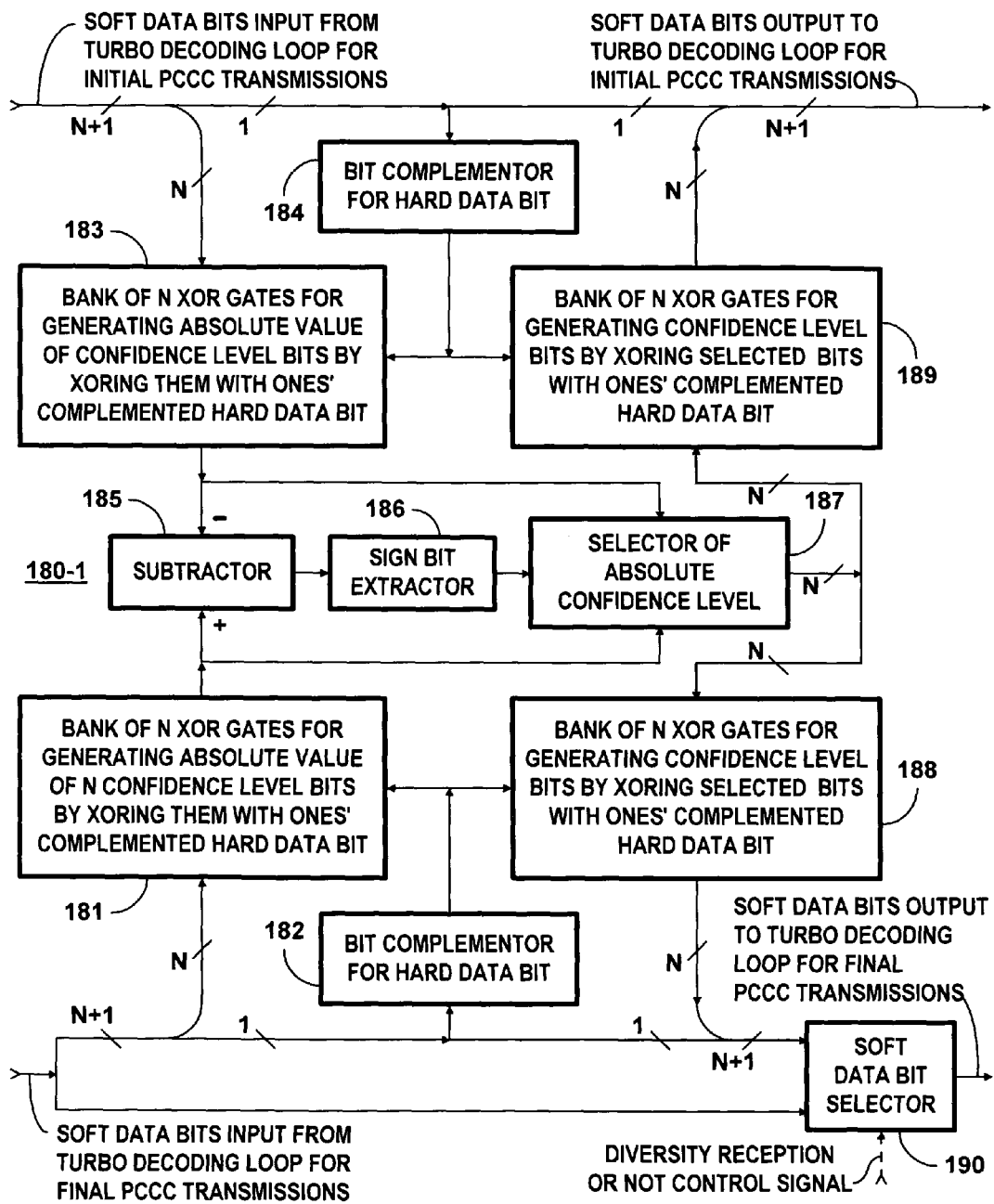
FIG. 33 is a detailed schematic diagram of a first embodiment of the information-exchange unit that the paralleled turbo decoders of FIG. 27 use during diversity reception to exchange information between their respective turbo loops.

FIG. 33 shows in detail a first embodiment 180-1 of the information-exchange unit 180 for exchanging information regarding data bits between the turbo decoders 160 and 170 shown in FIG. 27. This first embodiment of the information-exchange unit 180 comprises elements 181, 182, 183, 184, 185, 186, 187, 188, 189 and 190. The information-exchange unit 180-1 shown in FIG. 33 compares each soft data bit from a breakpoint in the turbo decoding loop of the turbo decoder 170 for initial transmissions with the corresponding soft data bit from a like breakpoint in the turbo decoding loop of the turbo decoder 160 for final transmissions. The FIG. 33 information-exchange unit 180-1 then selects the soft data bit with the better confidence level as the basis for continuing the paired turbo loops of the turbo decoders 160 and 170. The structure and operation of the FIG. 33 information-exchange unit 180-1 are described in further detail, following.

Each of the soft data bits from the breakpoint in the turbo decoding loop of the turbo decoder 160 is separated into two components, a single hard data bit and a number N of confidence-level bits expressing a level of confidence that the hard data bit is correct. A bank 181 of 2-input exclusive-OR gates, N in number, is connected for receiving the N confidence-level bits, which are applied to respective ones of the first input ports of those XOR gates. A bit complementor 182 is connected for ones' complementing the hard data bit and supplying the complemented hard data bit to the second input ports of the XOR gates in the bank 181 of them. The responses from the bank 181 of XOR gates together provide an absolute value of the level of confidence that a hard data bit from the breakpoint in the turbo decoding loop of the turbo decoder 160 is correct.

Each of the soft data bits from the breakpoint in the turbo decoding loop of the turbo decoder 170 is separated into two components, a single hard data bit and a number N of confidence-level bits expressing a level of confidence that the hard data bit is correct. A bank 183 of 2-input exclusive-OR gates, N in number, is connected for receiving the N confidence-level bits, which are applied to respective ones of the first input ports of those XOR gates. A bit complementor 184 is connected for ones' complementing the hard data bit and supplying the complemented hard data bit to the second input ports of the XOR gates in the bank 183 of them. The responses from the bank 183 of XOR gates together provide an absolute value of the level of confidence that a hard data bit from the breakpoint in the turbo decoding loop of the turbo decoder 170 is correct.

A subtractor 185 is connected for receiving the response of the bank 181 of XOR gates as a minuend input signal and for receiving the response of the bank 183 of XOR gates as a subtrahend input signal. The subtractor 185 performs subtraction using twos' complement arithmetic to generate a difference output signal. A sign bit extractor 186 is connected for receiving the difference output signal from the subtractor 185 and extracting the sign bit for application as control signal to a selector 187. The selector 187 responds to this control signal to reproduce the larger of the respective responses of the banks 181 and 183 of XOR gates. That is, the selector 187 is conditioned by its control signal to reproduce the larger absolute value of confidence level associated with a pair of corresponding soft data bits from the turbo loops of the turbo decoders 160 and 170.

A bank 188 of 2-input exclusive-OR gates, N in number, is connected for receiving the N bits of the absolute value of confidence level reproduced by the selector 187, which are applied to respective ones of the first input ports of those XOR gates. The bit complementor 182 is connected for supplying its complemented hard data bit response to the second input ports of the XOR gates in the bank 188 of them. The bank 188 of XOR gates generates N bits of an updated confidence level to be joined with the hard data bit from the breakpoint in the turbo loop of the turbo decoder 160 to generate adjusted soft data bits. The soft data bits from the breakpoint in the turbo loop of the decoder 160 are also supplied to the first input port of the soft-data-bits selector 190, the second input port of which is connected for receiving the adjusted soft data bits with confidence levels generated by the bank 188 of XOR gates. The output port of the soft-data-bits selector 190 is connected for continuing the turbo loop of the decoder 160. The soft-data-bits selector 190 is operable for reproducing at its output port the soft data bits received at a selected one of its two input ports. The soft-data-bits selector 190 has an output port connected for continuing the turbo loop of the decoder 160.

The soft-data-bits selector 190 is operable for reproducing the soft data bits received at one of its input ports as selected responsive to a DIVERSITY RECEPTION OR NOT control signal. This control signal can be furnished from the M/H decoding control unit 100 responsive to the iterative_diversity_mode fields of TPC signals decoded by the decoder 140 of (18, 10) RS FEC code shown in FIG. 26. When the iterative_diversity_mode field of the TPC signal is '11' signaling a single-time transmission, the M/H decoding control unit 100 will generate a DIVERSITY RECEPTION OR NOT control signal state indicating lack of diversity reception. Such indication of lack of diversity reception conditions the soft-data-bits selector 190 for selectively reproducing at its output port the soft data bits supplied to its first input port. When the iterative_diversity_mode field of the TPC signal is '10' indicating the final component of an iterative-diversity transmission, the M/H decoding control unit 100 will generate a DIVERSITY RECEPTION OR NOT control signal indicating diversity reception. Such indication of diversity reception conditions the soft-data-bits selector 190 for selectively reproducing at its output port the soft data bits that the RAM 192 supplies to its second input port. When the iterative_diversity_mode field of the TPC signal is '00' indicating simultaneous frequency-diversity transmissions with no iterative-diversity, the M/H decoding control unit 100 will generate a DIVERSITY RECEPTION OR NOT control signal indicating diversity reception. Such indication of diversity reception also conditions the soft-data-bits selector 190 for selectively reproducing at its output port the soft data bits that the RAM 192 supplies to its second input port.

However, an M/H receiver with a single frequency-agile tuner as shown in FIG. 33 is incapable of receiving both of two simultaneous frequency-diversity transmissions without attendant iterative diversity. An M/H receiver with two separate tuners is required for receiving both of two simultaneous frequency-diversity transmissions without attendant iterative diversity. Automatic gain control and channel equalization filtering are easier to design for an M/H receiver with two separate tuners, since the two tuners can individually deal with reception of frequency-diversity transmissions of different received signal strength and different multipath interference on a respective continuing basis.

A bank 189 of 2-input exclusive-OR gates, N in number, is connected for receiving the N bits of the absolute value of confidence level reproduced by the selector 187, which are applied to respective ones of the first input ports of those XOR gates. The bit complementor 184 is connected for supplying its complemented hard data bit response to the second input ports of the XOR gates in the bank 189 of them. The bank 189 of XOR gates generates N bits of an updated confidence level to be joined with the hard data bit from the breakpoint in the turbo loop of the turbo decoder 170 to be used in continuing that turbo loop.

In variants of this first embodiment 180-1 of the information-exchange unit 180 the confidence levels supplied from the banks 188 and 189 do not replace original confidence levels as supplied from respective breakpoints in the turbo loops of the turbo decoders 160 and 170 when continuing those loops. Instead, a weighted average of the confidence level generated by the bank 188 of XOR gates and the original confidence level as supplied from the breakpoint in the turbo loop of the turbo decoder 160 is used in continuing that turbo loop. And, a weighted average of the confidence level generated by the bank 189 of XOR gates and the original confidence level as supplied from the breakpoint in the turbo loop of the turbo decoder 170 is used in continuing that turbo loop.

Figure 34:
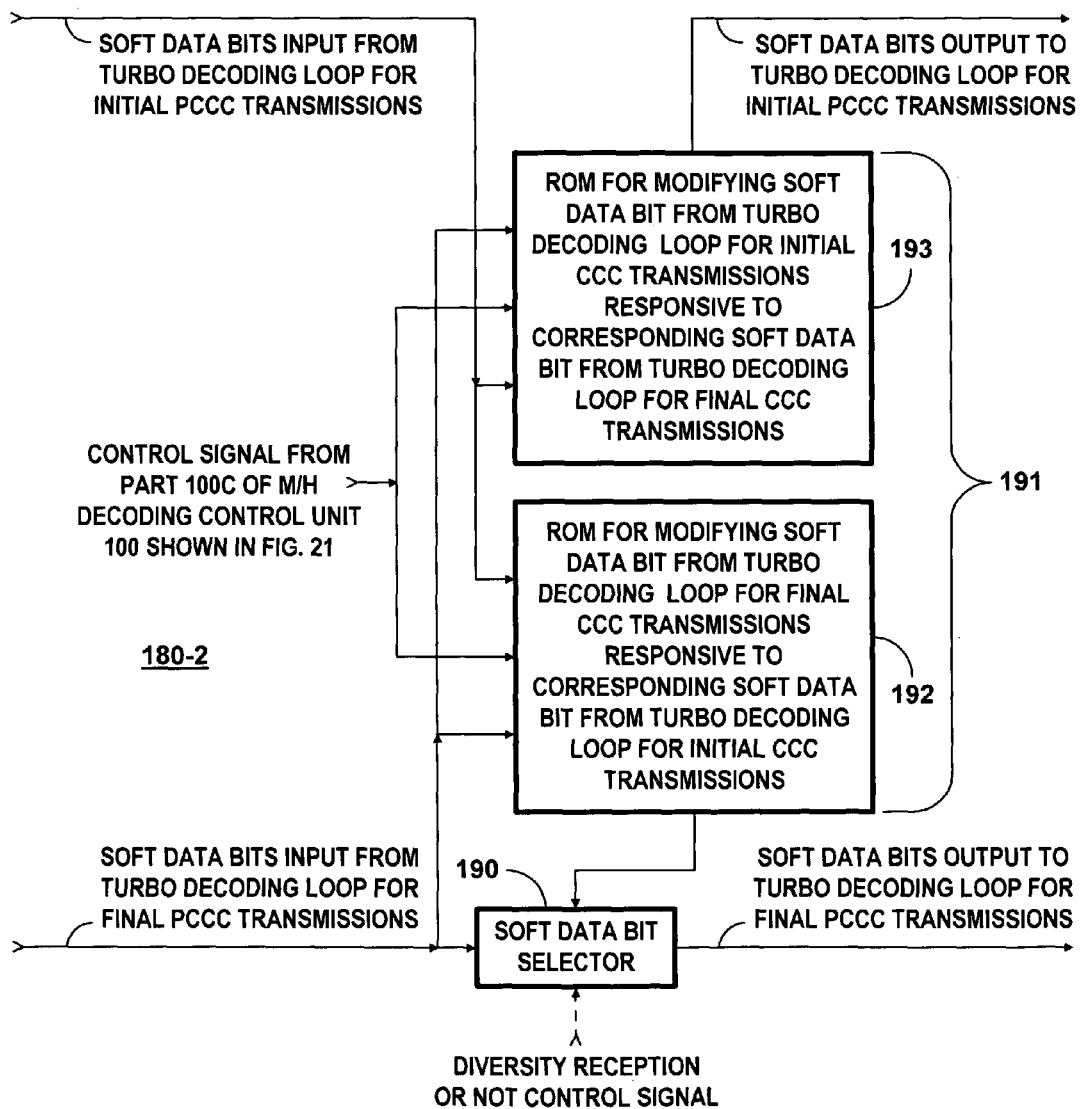
FIG. 34 is a schematic diagram of a second embodiment of the information-exchange unit that the paralleled turbo decoders of FIG. 27 use during diversity reception to exchange information between their respective turbo loops.

FIG. 34 shows a second embodiment 180-2 of the information-exchange unit 180 for exchanging information regarding soft data bits between the two turbo decoders 160 and 170 shown in FIG. 27. This second embodiment 180-2 of the information-exchange unit 180 is implemented with read-only memory (ROM) 191 divided into two halves 192 and 193. Soft data bits from corresponding breakpoints in the turbo loops of the decoders 160 and 170 provide each of the ROM halves 192 and 193 its input addressing. The ROM half 193 is connected to supply adjusted soft data bits for continuing the turbo loop of the decoder 170. The soft data bits from the breakpoint in the turbo loop of the decoder 160 are also supplied to a first of two input ports of a soft-data-bits selector 190, the second input port of which is connected for receiving the hard-adjusted soft data bits supplied from the ROM half 192. The output port of the soft-data-bits selector 190 is connected for continuing the turbo loop of the decoder 160. The soft-data-bits selector 190 is operable for reproducing at its output port the soft data bits received at a selected one of its two input ports. Control of the selection is similar to that described supra in regard to the first embodiment 180-1 of the information-exchange unit 180 depicted in FIG. 33.

The output response of the ROM half 192 adjusts the soft data bit received from the breakpoint in the turbo loop of the decoder 160, which soft data bit provides one half of the input addressing of the ROM half 192. This adjustment by the ROM half 192 is responsive to the soft data bit received from the turbo loop of the decoder 170 as the other half of its input address. The output response of the ROM half 193 adjusts the soft data bit received from the breakpoint in the turbo loop of the decoder 170, which soft data bit provides one half of the input addressing of the ROM half 193. This adjustment by the ROM half 193 is responsive to the soft data bit received from the turbo loop of the decoder 160 as the other half of its input address.

FIG. 34 shows a further input address bit being applied to each of the ROM halves 192 and 193, which further input address bit is supplied via a connection from part 100D of the M/H decoding control unit 100 shown in FIG. 27. This further input address bit has a first value when the M/H data bits being processed by the turbo decoder 170 should be ones' complements of the M/H data bits being processed by the turbo decoder 160. This will be the case during iterative-diversity reception of broadcasts from a single DTV transmitter, which broadcasts repeat the initial-component transmissions just once as final-component transmissions. Also, this will be the case during frequency-diversity reception of broadcasts from certain pairs of DTV transmitters. The further input address bit applied to each of the ROM halves 192 and 193 can have a second value complementary to the first value. This is the case during frequency-diversity reception of broadcasts from certain other pairs of DTV transmitters when the M/H data bits being processed by the turbo decoders 160 and 170 should be similar to each other, rather than being ones' complements of each other.

Suppose that during iterative-diversity reception one of the hard-decision portions of the two soft bits contemporaneously supplied by the turbo loops of the decoders 160 and 170 as input addressing for the two ROM halves 192 and 193 is a ONE and the other is a ZERO. Each of the two soft bits supports increased likelihood that itself and the other bit are correct. If the chance of one of the bits being in error is $1/n$, the chance of both being in error is $(1/n) \times (1/n) = 1/n^2$. So, the chance of both being correct is $1-(1/n^2) = (n^2-1)/n^2$. That is, the chance of both bits being correct is $(n^2-1)$ times as likely as both being erroneous. Accordingly, if possible, the output response of the ROM half 192 increases the confidence level of the soft data bit received from the turbo loop of the turbo decoder 160 in the adjusted soft data bit it supplies for continuing that turbo loop. The hard-decision portion of the soft bit received from the turbo loop of the turbo decoder 160 is kept the same in the soft bit that the ROM half 192 supplies for continuing that turbo loop. Furthermore, if possible, the output response of the ROM half 193 increases the confidence level of the soft data bit received from the turbo loop of the turbo decoder 170 in the adjusted soft data bit it supplies for continuing that turbo loop. The hard-decision portion of the soft bit received from the turbo loop of the turbo decoder 170 is kept the same in the soft bit that the ROM half 193 supplies for continuing that turbo loop.

Suppose that during iterative-diversity reception the hard-decision portions of the two soft data bits contemporaneously supplied as first and second halves of the input addressing for the ROM halves 192 and 193 are the same, rather than being different. This indicates that the hard-decision portion of one of the two soft bits is in error. If the confidence levels of both of the soft bits are fairly similar, the soft data bit that the ROM half 192 supplies for continuing the turbo loop of the turbo decoder 160 is, if possible, decreased to be somewhat lower than that of the soft data bit that the ROM half 192 received from that turbo loop. The hard-decision portion of the soft bit that the ROM half 192 supplies for continuing the turbo loop of the turbo decoder 160 is kept the same as that of the soft data bit received from that turbo loop. Furthermore, the soft data bit that the ROM half 193 supplies for continuing the turbo loop of the turbo decoder 170 is, if possible, decreased to be somewhat lower than that of the soft data bit that the ROM half 193 received from that turbo loop. The hard-decision portion of the soft bit that the ROM half 193 supplies for continuing the turbo loop of the turbo decoder 170 is kept the same as that of the soft data bit received from that turbo loop.

Suppose that during iterative-diversity reception the hard-decision portions of the first and second halves of the input addressing for the ROM halves 192 and 193 are the same, rather than being different, but the confidence level of the soft data bit supplied from the turbo decoder 160 is much higher than the confidence level of the soft data bit supplied from the turbo decoder 170. This indicates increased likelihood that the soft bit supplied from the turbo decoder 160 is correct and decreased likelihood that the soft bit supplied from the turbo decoder 170 is correct. Accordingly, if possible, the output response of the ROM half 192 adjusts the soft data bit supplied from the turbo decoder 160 increasing the confidence level of that soft data bit somewhat for continuing the turbo loop of the turbo decoder 160. The hard-decision portion of that adjusted soft data bit is kept the same as that of the soft data bit supplied from the turbo decoder 160. Furthermore, if possible, the output response of the ROM half 193 adjusts the soft data bit supplied from the turbo decoder 170 decreasing the confidence level of that soft data bit somewhat for continuing the turbo loop of the turbo decoder 170. The hard-decision portion of that adjusted soft data bit is kept the same as that of the soft data bit supplied from the turbo decoder 170, if the difference between the confidence levels of the soft data bits contemporaneously supplied from the turbo decoders 160 and 170 is not too great. If the difference is very great because the confidence level of the soft bit supplied from the decoder 170 is very low, turbo decoding is apt to progress faster if the hard-decision portion of that soft data bit is ones' complemented in the adjusted soft data bit supplied for continuing the turbo loop in the turbo decoder 170.

Suppose that during iterative-diversity reception the hard-decision portions of the first and second halves of the input addressing for the ROM halves 192 and 193 are the same, rather than being different, but the confidence level of the soft data bit supplied from the turbo decoder 170 is much higher than the confidence level of the soft data bit supplied from the turbo decoder 160. This indicates increased likelihood that the soft bit supplied from the turbo decoder 170 is correct and decreased likelihood that the soft bit supplied from the turbo decoder 160 is correct. Accordingly, if possible, the output response of the ROM half 193 adjusts the soft data bit supplied from the turbo decoder 170, increasing the confidence level of that soft data bit somewhat for continuing the turbo loop of the turbo decoder 170. The hard-decision portion of that adjusted soft data bit is kept the same as that of the soft data bit supplied from the turbo decoder 170. Furthermore, if possible, the output response of the ROM half 192 adjusts the soft data bit supplied from the turbo decoder 160, decreasing the confidence level of that soft data bit somewhat for continuing the turbo loop of the turbo decoder 160. The hard-decision portion of that adjusted soft data bit is kept the same as that of the soft data bit supplied from the turbo decoder 160, if the difference between the confidence levels of the soft data bits contemporaneously supplied from the turbo decoders 160 and 170 is not too great. If the difference is very great because the confidence level of the soft bit supplied from the decoder 160 is very low, turbo decoding is apt to progress faster if the hard-decision portion of that soft data bit is ones' complemented in the adjusted soft data bit supplied for continuing the turbo loop in the turbo decoder 160.

In the M/H receivers described above, the decoding of non-systematic (207, 187) RS codewords is iteratively performed without change in the comb-filtered X-sub-2 bits of the codewords from one cycle of turbo decoding procedure to the next. Only the Z-sub-1 bits can change from one cycle of turbo decoding procedure to the next. So, if a number of the bytes of a non-systematic (207, 187) RS codeword contain comb-filtered X-sub-2 bits that are in error, the likelihood of that codeword being susceptible of correction is quite small. Any improvement in overall decoding performance depends on bits from one or a few correct(ed) non-systematic (207, 187) RS codewords having their confidence levels boosted to help resolve decisions made during PCCC decoding. The parity bits for SISO decoding the outer convolutional coding originate from the X-sub-2 bits stored in the turbo decoder memory, the RAM 25 in the turbo decoding apparatuses of FIGS. 3 and 15. These bits do not change during the course of decoding the M/H-service data from an M/H Group. The outer SISO decoder 33 passes the X-sub-2 bits along without change for symbol interleaving and Gray-to-binary-code re-mapping. After being used in Gray-to-binary-code re-mapping, the X-sub-2 bits are passed along no further, since their like is already temporarily stored in the RAM 25.

Figure 35:
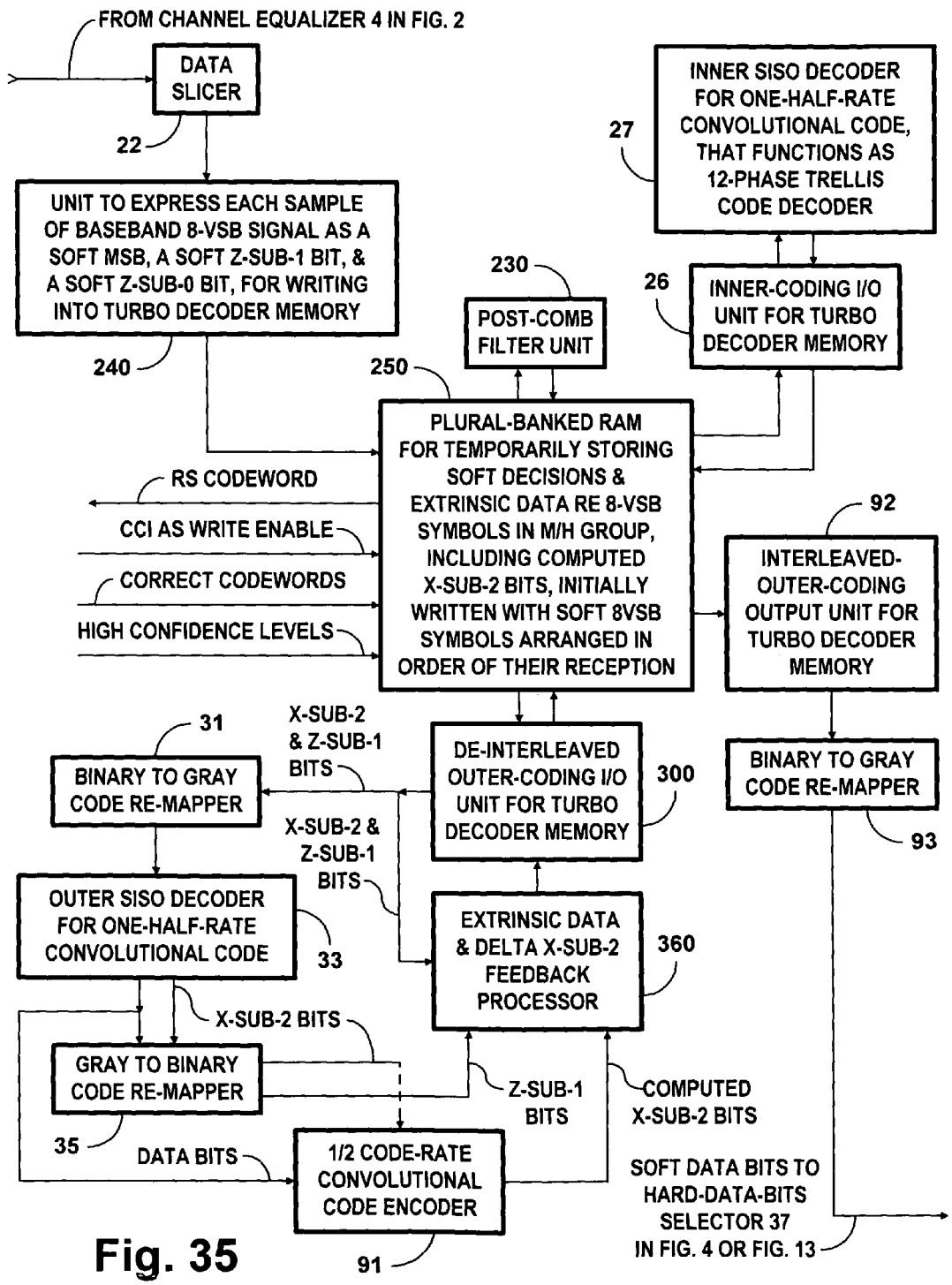
FIG. 35 is a schematic diagram of modifications of the FIG. 3 turbo decoding apparatus, in one of which modifications a modified post-comb filter unit is supplied with additional input signal required for its operation.

FIG. 35 shows modifications to the turbo decoding apparatuses of FIGS. 3 and 15. One of these modifications is a post-comb filter unit 230 that responds to X-sub-2 bits of the non-systematic (207, 187) RS codewords temporarily stored in turbo decoder memory being updated from one cycle of turbo decoding procedure to the next. The post-comb filter unit 230 supplants the post-comb filter 23 of the turbo decoding apparatuses of FIGS. 3 and 15. The post-comb filter unit 230 is not connected to respond to MSBs supplied directly from the data slicer 22. The post-comb filter unit 230 is not involved in the subroutine for initially loading the turbo decoder memory with information concerning the 170 data segments of a most recently received M/H Slot containing an M/H Group of M/H-service samples. Accordingly, another modification in FIG. 35 is a unit 240 that expresses each sample of baseband 8-VSB signal as three soft bits supplied in parallel for initially loading the turbo decoder memory with information concerning the 170 data segments of a most recently received M/H Slot. The unit 240 replaces the unit 24 for expressing each sample of baseband 8-VSB signal as three soft bits supplied in parallel with a respective soft bit of post-comb filter response.

Another modification in FIG. 35 is a RAM 250 that supplants the RAM 25 used as turbo decoding memory in the turbo decoding apparatuses of FIGS. 3 and 15. The RAM 250 has a sixth bank of addressable storage locations for temporarily storing soft delta X-sub-2 bits; this is in addition to first through fourth banks of addressable storage locations similar to the first through fourth banks of addressable storage locations in the RAM 25. The soft delta X-sub-2 bits quantify the changes in the X-sub-2 bits of the non-systematic (207, 187) RS codewords temporarily stored in turbo decoder memory as they are updated from one cycle of turbo decoding procedure to the next. Soft delta X-sub-2 bits, if any, and soft MSBs are read from the sixth and first banks of the RAM 250 to the post-comb filter unit 230 concurrently with soft X-sub-1 bits, soft X-sub-0 bits and any extrinsic data relating to X-sub-1 bits being read to the inner-coding I/O unit 26 from the second, third and fourth banks of the RAM 250. This reading from the RAM 250 is done progressing through the first list of addresses listed in the ROM 81. The post-comb filter unit 230 additively combines the soft delta X-sub-2 bit, if any, and the soft MSB from respective storage locations within the RAM 250 to generate a respective soft adjusted MSB for post-comb filtering. The resulting soft bits of post-comb filter response to the soft adjusted MSBs are written to the fifth bank of addressable storage locations in the RAM 250 immediately, before progressing to the next address listed in the ROM 81. This avoids need for a delay register for the soft bits of post-comb filter response to be written to the RAM 250.

In a further modification the outer-coding I/O unit 30 used in the turbo decoding apparatuses of FIGS. 3 and 15 is replaced in FIG. 35 by a de-interleaved outer-coding input/output unit 300 having the following additional capability. The I/O unit 300 provides for writing soft delta X-sub-2 bits, which have been computed from the results of decoding the outer convolutional coding of the PCCC, to the sixth bank of addressable storage locations in the RAM 250 for temporarily storing the soft delta X-sub-2 bits. In a still further modification the extrinsic data feedback processor 36 of FIGS. 3 and 15 is replaced in FIG. 35 by an extrinsic data and delta X-sub-2 feedback processor 360. The feedback processor 360 differentially combines soft Z-sub-1 bits read from the second bank of addressable storage locations in the RAM 250 with soft Z-sub-1 bits resulting from decoding outer convolutional coding. This generates soft extrinsic data for writing into the fourth bank of addressable storage locations in the RAM 250. Furthermore, the feedback processor 360 differentially combines X-sub-2 bits read from the first bank of addressable storage locations in the RAM 250 with updated X-sub-2 bits computed from the Z-sub-1 bits resulting from decoding outer convolutional coding. This generates soft delta X-sub-2 bits for writing into the sixth bank of addressable storage locations in the RAM 250.

Those soft MSBs not included in the outer convolutional coding of the PCCC in the single M/H Slot will never have respective soft delta X-sub-2 bits associated therewith, so the sixth bank of the RAM 250 can have all-zero data permanently stored in storage locations for the addresses associated with those soft MSBs. Alternatively, those storage locations can temporarily store all-zero data entered during a bulk erasure of the turbo decoder memory contents before an M/H Slot is selected for reception.

FIG. 35 shows a one-half-code-rate convolutional encoder 91 connected for computing updated soft X-sub-2 bits based on the soft data bits recovered by the outer SISO decoder 33, which soft data bits are Gray-coded Z-sub-1 bits. FIG. 35 shows (in dashed line) a connection by which the convolutional encoder 91 receives X-sub-2 bits supplied from the outer SISO decoder 33 via the Gray-to-binary-code re-mapper 35, to be used as a control signal. (X-sub-2 bits from the outer SISO decoder 33 pass through the Gray-to-binary-code re-mapper 35 without modification.) This control signal is used to ascertain that there is no long-term running error in the polarity of convolutional coding performed by the convolutional encoder 91. For example, the updated X-sub-2 bits computed by the convolutional encoder 91 is correlated over a period of time with the original X-sub-2 bits supplied from the outer SISO decoder 33 to determine whether the polarity of each of the twelve phases of the encoding results is correct.

Any error is corrected. The convolutional encoder 91 is connected for supplying the updated X-sub-2 bits it computes to the extrinsic data and delta X-sub-2 feedback processor 360.

FIG. 35 shows another significant modification in the turbo decoding apparatus as shown in either of the FIGS. 3 and 15. Symbol de-interleaving and symbol re-interleaving procedures associated with decoding the outer convolutional coding are subsumed by appropriate addressing into operation of the RAM 250 used as turbo decoder memory. The de-interleaved outer-coding input/output unit 300 is connected to supply the input port of the binary-to-Gray code re-mapper 31 with symbol de-interleaved soft X-sub-2 bits paired with soft Z-sub-1 bits. The output port of the binary-to-Gray-code re-mapper 31 is connected to supply outer convolutional coding to the input port of the outer SISO decoder 33 directly, omitting the symbol de-interleaver 32. The output port of the outer SISO decoder 33 connects to the input port of the Gray-to-binary-code re-mapper 35 directly, omitting the symbol re-interleaver 34. The symbol de-interleaver 32 and the symbol re-interleaver 34 are not subsumed into local memory within the outer SISO decoder 33. Subsuming symbol re-interleaving into the addressing of the RAM 250 avoids the need for a symbol re-interleaver following the output port of the convolutional encoder 91.

Symbol-interleaved Z-sub-1 bits from the outer convolutional coding are not available in the cascade connection of elements 31, 33 and 35 when the symbol de-interleaving and symbol re-interleaving procedures are subsumed into the addressing of the RAM 250. Accordingly, a different arrangement for extracting M/H-service data bits from the turbo decoding apparatus is necessary. In FIG. 35 the extrinsic data and delta X-sub-2 feedback processor 360 is operable for comparing soft Z-sub-1 bits supplied from the output port of the Gray-to-binary-code re-mapper 35 with soft Z-sub-1 bits read from the RAM 250 via the de-interleaved outer-coding I/O unit 300. Such comparison generates extrinsic data concerning those of the soft Z-sub-1 bits that are temporarily stored in the RAM 250 as part of the PCCC used to transmit M/H-service data. The feedback processor 360 is connected to feed this extrinsic data back through the de-interleaved outer-coding output unit 300 to replace any previous extrinsic data that is temporarily stored in selected portions of the RAM 250. This procedure differs from that in the turbo decoding apparatuses of FIGS. 3 and 15 in that the procedure is carried out with the addressing of the RAM 250 selecting addressable storage locations from an address listing of PCCC symbols arranged in symbol de-interleaved order. This, rather than in the order of their original writing into the turbo decoder memory, as in the turbo decoding apparatuses of FIGS. 3 and 15.

The input port of interleaved-outer-coding output circuitry 92 is connected to receive soft Z-sub-1 bits from MHE packets, soft extrinsic data and the hard-decision bits of soft X-sub-2 bits read from the RAM 250. Such reading is part of a subroutine for extracting soft M/H-service data bits from turbo decoder memory, which subroutine is performed just once for each M/H Group that is decoded. Preferably, this subroutine is performed immediately after a final subroutine for decoding the non-systematic (207, 187) RS codewords from the M/H Group. However, such reading can instead be done immediately after the subroutine for decoding the outer convolutional coding of M/H-service samples or immediately after the subroutine for decoding the inner convolutional coding of M/H-service samples interspersed with the trellis coding of main-service samples. The interleaved-outer-coding output circuitry 92 additively combines soft extrinsic data with the soft Z-sub-1 bits from MHE packets to generate adjusted soft Z-sub-1 bits supplied to the input port of a binary-to-Gray-code re-mapper 93 as part of the input signal thereto. The interleaved-outer-coding output circuitry 92 reproduces the hard-decision bits of soft X-sub-2 bits read from the RAM 250, supplying them to the input port of the binary-to-Gray-code re-mapper 93 as the rest of the input signal thereto. The binary-to-Gray-code re-mapper 93 is operable for responding to the hard-decision bits of soft X-sub-2 bits in its input signal to convert the binary-coded soft Z-sub-1 bits from MHE packets in its input signal to Gray-coded soft Z-sub-1 bits from MHE packets in output signal supplied from its output port. Such code conversion completes the subroutine for extracting soft M/H-service data bits from turbo decoder memory in one cycle of turbo decoding. The output port of the binary-to-Gray-code re-mapper 93 is connected to the input port of the hard-data-bits selector 37 that is shown in FIG. 4 or to the input port of the hard-data-bits selector 37 that is shown in FIG. 13.

Figure 36:
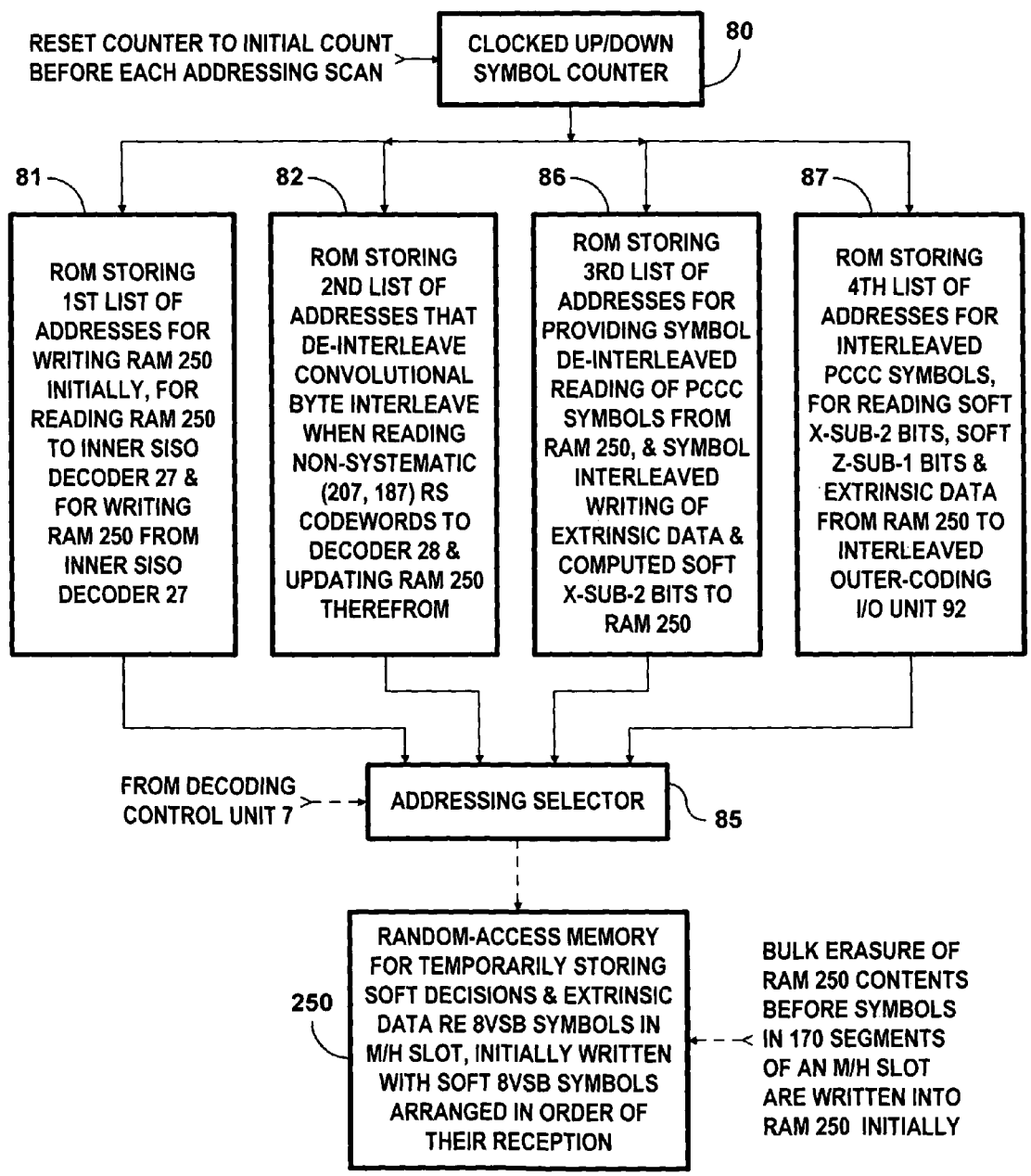
FIG. 36 is a schematic diagram showing a representative arrangement of elements for addressing the random-access memory included among the FIG. 35 modifications of the FIG. 3 turbo decoding apparatus.

FIG. 36 shows how the FIG. 22 arrangement of elements for addressing the random-access memory 25 that turbo decoding apparatuses shown in FIG. 3, FIG. 15 and their variants is modified for addressing the random-access memory 250 included in the FIG. 35 modifications of those turbo decoding apparatuses. FIG. 36 shows an addressing selector 85 for selecting among four addressing lists stored in respective read-only memories (ROMs) 81, 82, 86 and 87 to be used for addressing the RAM 250. FIG. 22 shows the addressing selector 84 for selecting among just three addressing lists stored in respective ROMs 81, 82 and 83 to be used for addressing the RAM 25. The first and second lists of addresses stored in the FIG. 36 ROMs 81 and 82 for addressing the RAM 250 are the same as the first and second lists of addresses stored in the FIG. 22 ROMs 81 and 82 for addressing the RAM 25.

However, the scannings of the first list of addresses stored in the FIG. 36 ROM 81 for addressing the RAM 250 differ in a certain particular from the scannings of the first list of addresses stored in the FIG. 22 ROM 81 for addressing the RAM 25. Filtering by the post-comb filtering unit 230 has to progress in the direction of trellis coding, rather than counter to it. The addressing of the RAM 250 during the initial reading from its second, third and forth banks of addressable storage locations to the inner-coding input/output unit 26 in each cycle of turbo decoding is preferably counter to the direction of trellis coding. If each cycle of turbo decoding includes subsequent reading from those second, third and forth banks of addressable storage locations to the inner-coding input/output unit 26 in the direction of trellis coding, reading of MSBs from the first bank of addressable storage locations in the RAM 250 to the post-comb filtering unit 230 can be done concurrently. If there is no such subsequent reading from the second, third and forth banks of addressable storage locations in the direction of trellis coding, the first list of addresses stored in the ROM 81 is scanned just to support reading of MSBs from the first bank of addressable storage locations in the RAM 250 to the post-comb filtering unit 230. The clocked up/down symbol counter 80 is reset to zero count output before counting up to generate read addresses applied to the ROM 81. This implements scanning of the first list of addresses stored in the ROM 81 in the direction of trellis coding. This scanning is completed before the first list of addresses stored in the ROM 81 is scanned again in the direction of trellis coding. This is done to implement writing back to the second and third banks of addressable storage locations in the RAM 250 from the inner SISO decoder 27 via the inner-coding input/output unit 26. Writing back of the soft bits of post-comb filter unit 230 to the fifth bank of addressable storage locations in the RAM 250 is done concurrently with the writing back to the second and third banks of addressable storage locations in the RAM 250.

In FIG. 36 the ROM 86 stores a third list of addresses for providing symbol de-interleaved reading of PCCC symbols from the RAM 250 and for providing symbol de-interleaved writing of extrinsic data and computed soft X-sub-2 bits to the RAM 250. The third list of addresses stored in the ROM 86 provides for the symbol de-interleaving and symbol re-interleaving associated with the subroutine for decoding the outer convolutional coding of the PCCC'd M/H-service data to be subsumed within the operation of the turbo decoder memory provided by the RAM 250. The third list of addresses stored in the ROM 86 like the third list of addresses stored in the ROM 83 selects just the addressable storage locations in the turbo decoder memory that are associated with a subroutine for decoding the outer convolutional coding of the PCCC'd M/H-service data. However, the order of selection of those addressable storage locations differs in the lists of addresses stored in the ROMs 83 and 86. The third list of addresses stored in the ROM 83 scans the selected addressable storage locations counter to the order they were originally written at the outset of processing the M/H Slot or in theorder they were originally written. This, rather than providing for the symbol de-interleaving and symbol re-interleaving associated with the subroutine for decoding the outer convolutional coding of the PCCC'd M/H-service data to be subsumed within the operation of the turbo decoder memory provided by the RAM 25.

In FIG. 36 the ROM 87 stores a fourth list of addresses for selecting just the addressable storage locations in the turbo decoder memory provided by the RAM 250 that are associated with reading out M/H-service data resulting from turbo decoding procedures. The fourth list of addresses stored in the ROM 87 scans the selected addressable storage locations in the order they were originally written at the outset of processing the M/H Slot.

Figure 37:
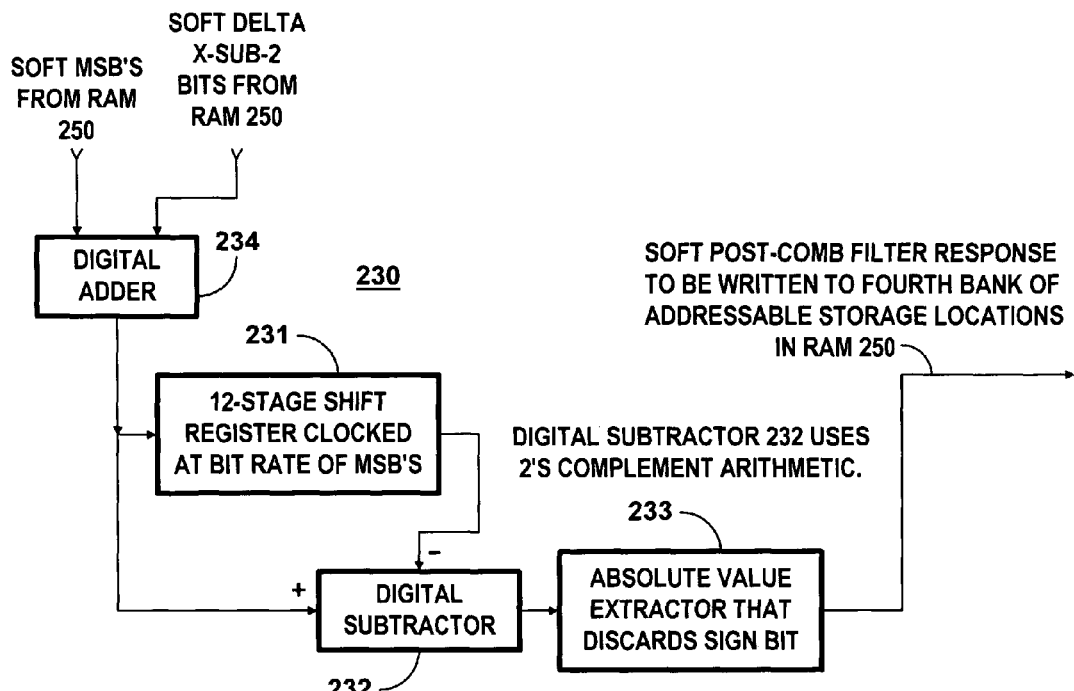
FIG. 37 is a schematic diagram showing a construction of the post-comb filter unit included among the FIG. 35 modifications of the FIG. 3 turbo decoding apparatus.

FIG. 37 shows in detail the modified post-comb filter unit 230 included in the FIG. 35 modifications of the FIG. 3 turbo decoding apparatus. The modified post-comb filter unit 230 includes the shift register 231, the digital subtractor 232 and the absolute value extractor 233 connected as in the post-comb filter unit 23, except for the shift register 231 and the subtractor 232 being connected for receiving input signal differently. The serial input port of the 12-stage shift register 231 and the minuend input port of the two's complement subtractor 232 are connected for receiving input signals from the output port of a digital adder 234 receiving summand input signals read from the RAM 250.

At the beginning of the decoding procedures for an M/H Slot, the addresses of the RAM 250 are initially scanned in accordance with the first list of addresses stored in the ROM 81 shown in FIG. 36. During this initial scan, the unit 240 for expressing each sample of baseband 8-VSB signal as three soft bits writes soft MSBs, soft Z-sub-1 bits, soft Z-sub-0 bits and soft bits of post-comb filter response to the RAM 250. This follows a bulk erasure of the temporarily stored contents of the RAM 250. The subroutine for initially loading the turbo decoder memory with information concerning the 170 data segments of a most recently received M/H Slot containing an M/H Group of M/H-service samples differs from that shown in FIG. 10. The step 305 of post-comb filtering MSBs does not immediately follow the step 304 of expressing each sample of data-slicing results from the data slicer 22 as a soft MSB, a soft Z-sub-1 bit and a soft Z-sub-0 bit. Consequently, the step 306 following the step 305 is modified by omitting the substep of writing soft bits of post-comb filter response to the turbo decoder memory concurrently with writing soft MSBs, soft Z-sub-1 bits and soft Z-sub-0 bits to the turbo decoder memory.

Post-comb filtering MSBs by the post-comb filtering unit 230 in the FIG. 35 turbo decoding apparatus is deferred until the step 308 of reading soft Z-sub-1 bits, soft Z-sub-0 bits and any extrinsic data to the inner-coding I/O unit 26 is performed. Soft MSBs are read from the first bank of addressable storage locations in the RAM 250 as augend input signal to the digital adder 234. Any soft delta X-sub-2 bits temporarily stored in the sixth bank of addressable storage locations in the RAM 250 are read to the digital adder 234 as addend input signal thereto. The reading of the soft MSBs and any soft delta X-sub-2 bits from the first and sixth banks of addressable storage locations in the RAM 250 is subsequent to reading soft Z-sub-1 bits, soft Z-sub-0 bits and any extrinsic data from the second, third and fourth banks of addressable storage locations in the RAM 250 to the inner SISO decoder 27 via the inner-coding I/O unit 26. Each successive soft bit of post-comb filter response generated by the post-comb filtering unit 230 can be immediately written back into the currently addressable storage location in the fifth bank of addressable storage locations in the RAM 250, before the read addressing of the other banks of addressable storage locations changes. Or, as described supra, soft bit of post-comb filter response generated by the post-comb filtering unit 230 can be written back to the fifth bank of addressable storage locations in the RAM 250 concurrently with updating soft Z-sub-1 bits from the inner SISO decoder response being written back to the second bank of addressable storage locations in the RAM 250.

Preferably, the subroutine for initially loading the turbo decoder memory with information concerning the 170 data segments of a most recently received M/H Slot containing an M/H Group of M/H-service samples is directly followed by the initial subroutine for decoding the inner convolutional coding of M/H-service samples interspersed with the trellis coding of main-service samples. Post-comb filter response generated by the post-comb filtering unit 230 during this initial subroutine for decoding the inner convolutional coding will depend solely on the soft MSBs read from the first bank of addressable storage locations in the RAM 250 as augend input signal to the digital adder 234. Bulk erasure of the addressable storage locations in the RAM 250 before its being loaded with soft MSBs, soft Z-sub-1 bits and soft Z-sub-0 bits from the M/H Slot selected for reception empties all the addressable storage locations in the sixth bank of RAM 250 of any non-zero contents. Only all-zero contents are left to be read to the digital adder 234 as addend input signal thereto during the initial cycle of turbo decoding, presuming that post-comb filtering precedes the initial subroutine for decoding the outer convolutional coding of M/H-service samples.

In each subsequent cycle of turbo decoding the PCCC in an M/H Slot, the subroutine for decoding outer convolutional coding in the previous cycle of turbo decoding will have generated soft delta X-sub-2 bits that were written to addressable storage locations in the sixth bank of RAM 250. Accordingly, in respective post-comb filtering procedure performed in each subsequent cycle of turbo decoding the PCCC in an M/H Slot, soft delta X-sub-2 bits of non-zero value are apt to be read from the RAM 250 together with the soft MSBs that are X-sub-2 bits. The digital adder 234 will then receive soft delta X-sub-2 bits of non-zero value as addend input signal to be added to the soft X-sub-2 bits received as augend input signal. The digital adder 234 will respond with soft updated MSBs as sum output signal. The digital adder 234 is connected to supply these soft updated MSBs to the serial input port of the shift register 231 and the minuend input port of the subtractor 232, which together with the absolute value extractor 233 form the remainder of the post-comb filtering unit 230. The post-comb filtering unit 230 generates soft bits of updated post-comb filter response to these soft updated MSBs, which soft bits of updated post-comb filter response are written to the addressable storage locations in the fifth bank of RAM 250. These soft bits of updated post-comb filter response are temporarily stored in the addressable storage locations in the fifth bank of RAM 250, to be used in the subroutine for decoding non-systematic (207, 187) RS codewords performed later in the same cycle of the turbo decoding procedure.

Figure 38:
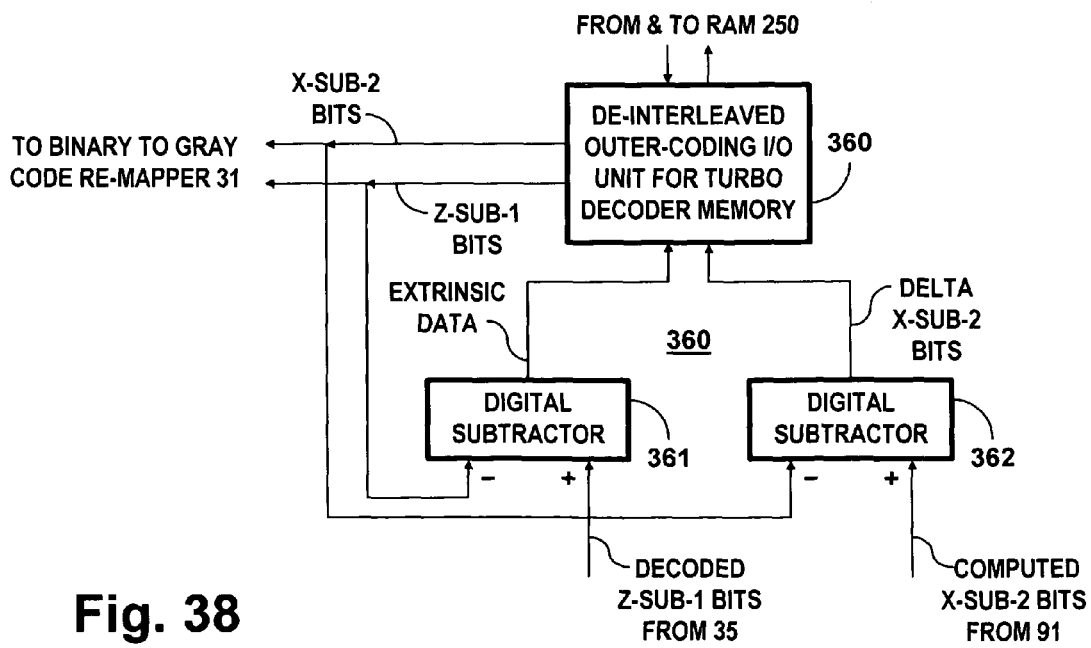
FIG. 38 is a schematic diagram showing a construction of the extrinsic data and delta X-sub-2 feedback processor included among the FIG. 35 modifications of the FIG. 3 turbo decoding apparatus.

FIG. 38 shows a particular construction of the extrinsic data and delta X-sub-2 feedback processor 360 included among the FIG. 35 modifications of the FIG. 3 turbo decoding apparatus. The difference output port of a digital subtractor 361 is connected for supplying extrinsic data to the de-interleaved outer-coding input/output unit 300. The minuend input port of the subtractor 361 is connected for receiving decoded soft Z-sub-1 bits from the output port of the Gray-to-binary code re-mapper 35. The subtrahend input port of the subtractor 361 is connected for receiving soft Z-sub-1 bits read from the second bank of addressable storage locations in the RAM 250, as accessed via the de-interleaved outer-coding input/output unit 300. The difference output port of a digital subtractor 362 is connected for supplying soft delta X-sub-2 bits to the de-interleaved outer-coding input/output unit 300. The minuend input port of the subtractor 362 is connected for receiving soft computed X-sub-2 bits from the output port of the encoder 91 for one-half-rate convolutional code. The subtrahend input port of the subtractor 362 is connected for receiving soft X-sub-2 bits read from the first bank of addressable storage locations in the RAM 250, as accessed via the de-interleaved outer-coding input/output unit 300.

The fourth banks of addressable storage locations in the RAMs 25 and 250 contain many storage locations that are never updated from the all-zero entries made when bulk erasure is done at the beginning of processing an M/H Slot selected for reception. So does the sixth bank of addressable storage locations in the RAM 250. All the storage locations in such a bank of memory can permanently store a bit indicative of whether that addressable storage location is or is not ever to be updated. If the storage location will never be updated, it need not have further capacity for storing a soft bit. If the storage location will be updated, it is provided capacity for temporarily storing a soft bit. When reading from a bank of memory that permanently stores bits indicative of whether addressable storage location will or will not ever be updated, each bit indicative of whether a particular addressable storage location is or is not ever to be updated indicates whether or not a soft bit is concurrently read from that bank of memory. This bit is applied as control bit to a selector that selects the soft bit concurrently read from that bank of memory for processing, if such soft bit is available. If the control bit indicates such soft bit is not available from that bank of memory, the selector is conditioned to supply a hard-wired all-zero soft bit for processing. Such arrangements substantially reduce the size of the turbo decoder memory.

Variants of the modified turbo decoding apparatus shown in FIG. 35 feed X-sub-2 bits, rather than soft delta X-sub-2 bits, back to a post-comb filtering unit more complex in design than the post-comb filtering unit 230. The X-sub-2 bits are fed back using the sixth bank of addressable storage locations in the RAM 250. The post-comb filtering unit then has to include a selector for selecting input signal for post-comb filtering. Selection must be made between the MSBs temporarily stored in the first bank of addressable storage locations in the RAM 250 and the X-sub-2 bits temporarily stored in the sixth bank of addressable storage locations in the RAM 250. Generating control signal for the selector is a bit complicated, although the inclusion of bits in the sixth bank of addressable storage locations in the RAM 250 indicating whether or not they store soft X-sub-2 bits simplifies the task. If the addressable storage locations in that sixth bank are incapable of storing soft X-sub-2 bits, soft MSBs read from the first bank of addressable storage locations in the RAM 250 are selected as input signal for post-comb filtering. Also, soft MSBs read from the first bank of addressable storage locations in the RAM 250 are selected as input signal for post-comb filtering during the initial cycle of turbo decoding an M/H Group. These variants of the turbo decoding apparatus are substantial equivalents to the turbo decoding apparatus modified per FIG. 35 in regard to overall operation, but are less preferred in that the post-comb filtering units are not self-controlled.

The decoding of inner convolutional coding alternates with the decoding of outer convolutional coding in the successive cycles of turbo decoding. U.S. patent application Ser. No. 12/928,186 describes similar one half-rate convolutional coding being used for generating both the inner and outer convolutional coding of the PCCC. Accordingly, M/H receivers can be constructed that replace the inner SISO decoder 27 and the outer SISO decoder 33 with a single SISO decoder appropriately connected. An input/output unit between turbo decoder memory and the single SISO decoder can provide the appropriate connections. Although this input/output unit and its supporting circuitry are somewhat complex in construction and operation, complicating written description of them, they are readily designed by one skilled in the art of digital electronics. Such M/H receivers embody the inventive precepts described above, providing those receivers include decoders for non-systematic (207, 187) RS codewords connected for improving confidence levels of the Z-sub-1 bits from the PCCC of M/H-service data that are supplied to the single SISO decoder during turbo decoding procedures.

An M/H receiver can use a pair of tuners to supply baseband DTV signals to supply respective baseband DTV signals which to select M/H Slots for decoding by a pair of paralleled turbo decoders, each pair like the paralleled turbo decoders 160 and 170 shown in FIG. 27, rather than using a single frequency-agile tuner to supply baseband DTV signal to one pair of paralleled turbo decoders as shown in FIGS. 24, 25, 26 and 27. FIGS. 45, 45A, 45B, 45C, 45D, 45E, 45F, 45G and 45H of U.S. patent application Ser. No. 12/928,186 show the generic structure for such an M/H receiver.

It will be apparent to those skilled in the art that various other modifications and variations can be made in the specifically described apparatus without departing from the spirit or scope of the invention. Accordingly, it is intended that these modifications and variations of the specifically described apparatus be considered to result in further embodiments of the invention, provided they come within the scope of the appended claims and their equivalents.

In the appended claims, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with customary grammar in the American English language.

What is claimed is:

1. A receiver for parallel concatenated convolutionally coded (PCCC) mobile-handheld M/H-service data imbedded in digital television (DTV) signals also conveying main-service data, said DTV signals being transmitted as 8-level vestigial-sideband amplitude-modulated (8-VSB) radio-frequency carrier waves, said PCCC transmissions of M/H-service data intended to be received and decoded by mobile and hand-held receivers collectively referred to as M/H receivers, said DTV signals being (207, 187) Reed-Solomon coded and convolutionally interleaved before being used for 8-VSB modulation, said receiver being an M/H receiver comprising:

a tuner for receiving a selected one of 8-VSB DTV signals broadcast at radio frequencies and converting it to a baseband DTV signal comprising M/H Slots of signal selected from successive data fields of convolutionally byte-interleaved 207-byte data segments;

a data slicer connected for performing 8-level data slicing of successive Nyquist-rate symbols of said baseband DTV signal in said selected M/H Slots to generate a first stream of soft most significant bits (MSBs) of respective ones of said symbols of said baseband DTV signal in said selected M/H Slots, a second stream of soft Z-sub-1 bits that are of intermediate significance in regard to said respective ones of said symbols of said baseband DTV signal in said selected M/H Slots, and a third stream of soft Z-sub-0 bits that are of least significance in regard to said respective ones of said symbols of said baseband DTV signal in said selected M/H Slots;

a post-comb filter unit for generating successive soft bits of post-comb filter response to said MSBs of respective ones of said symbols of said baseband DTV signal in said selected M/H Slots; and turbo decoding apparatus for decoding said parallel concatenated convolutionally coded M/H-service data contained in said baseband DTV signal, said turbo decoding apparatus comprising:

a symbol de-interleaver for outer convolutional coding of said parallel concatenated convolutionally coded M/H-service data conveyed in symbol-interleaved format by said soft MSBs and said soft Z-sub-1 bits within said baseband DTV signal, thus to regenerate outer convolutional coding of said parallel concatenated convolutionally coded M/H-service data;

soft-input/soft-output (SISO) decoding apparatus, said SISO decoding apparatus operable for decoding inner convolutional coding conveyed by said soft Z-sub-1 bits and said soft Z-sub-0 bits within said baseband DTV signal to generate a respective set of soft bits of M/H-service data each cycle of turbo decoding procedure, said SISO decoding apparatus further operable for decoding said regenerated outer convolutional coding of said parallel concatenated convolutionally coded M/H-service data to generate a respective set of soft bits of de-interleaved M/H-service data each cycle of turbo decoding procedure;

a symbol interleaver connected for re-interleaving each of said sets of soft bits of de-interleaved M/H-service data to be processed for providing turbo feedback in said turbo decoding apparatus;

a hard-data-bits selector for selecting hard bits of M/H-service data from a final set of soft bits of M/H-service data generated during each turbo decoding procedure for a respective one of said selected M/H Slots;

Reed-Solomon (RS) decoding apparatus for non-systematic ones of (207, 187) Reed-Solomon codewords conveyed in convolutionally byte-interleaved format within said baseband DTV signal, said RS decoding apparatus operable for correcting erroneous ones of said non-systematic (207, 187) RS codewords insofar as possible and for indicating bits from those of said non-systematic (207, 187) RS codewords said RS decoding apparatus finds to be correct as received or was able to correct;

a generator of high confidence levels to be joined with Z-sub-1 bits from those of said non-systematic (207, 187) RS codewords said RS decoding apparatus finds to be correct as received or was able to correct, thus to form respective soft Z-sub-1 bits with high confidence levels used to replace corresponding Z-sub-1 bits with lower confidence levels for subsequent decoding operations of said SISO decoding apparatus.

2. An M/H receiver as set forth in claim 1, wherein said turbo decoding apparatus is operable to update soft Z-sub-1 bits in said non-systematic ones of (207, 187) Reed-Solomon codewords supplied to said RS decoding apparatus, said updating being done responsive to soft Z-sub-1 bits in decoding results from said SISO decoding apparatus.

3. An M/H receiver as set forth in claim 1 further comprising:
a convolutional encoder for encoding bits of de-interleaved M/H-service data generated by said SISO decoding apparatus, thus to generate computed X-sub-2 bits, said post-comb filter unit further connected for responding to said computed X-sub-2 bits to update said soft bits of post-comb filter response included in said non-systematic (207, 187) RS codewords that said RS decoding apparatus decodes in subsequent cycles of the turbo decoding procedure for the selected M/H Slot.

4. An M/H receiver as set forth in claim 1, suited for receiving PCCC transmissions of M/H-service data in which symbols of the outer convolutional coding have been subjected to Gray-to-binary-code re-mapping, said M/H receiver further comprising:
a binary-to-Gray-code re-mapper connected for re-mapping said outer convolutional coding from natural-binary-code format to Gray-code format before being decoded by said SISO decoding apparatus;
a Gray-to-binary-code re-mapper connected for re-mapping said soft bits of M/H-service data to natural-binary-code format before being processed for providing turbo feedback in said turbo decoding apparatus.

5. An M/H receiver as set forth in claim 1, wherein said SISO decoding apparatus comprises:
an inner SISO decoder connected for decoding said inner convolutional coding conveyed by said soft Z-sub-1 bits and said soft Z-sub-0 bits within said baseband DTV signal, thus to generate said sets of soft bits of M/H-service data; and
an outer SISO decoder connected for decoding said regenerated outer convolutional coding of said parallel concatenated convolutionally coded M/H-service data, thus to generate said sets of soft bits of de-interleaved M/H-service data.

6. An M/H receiver as set forth in claim 1, wherein said turbo decoding apparatus further comprises:
a banked turbo decoder memory having a plurality of banks of addressable storage locations for temporarily storing soft bits, a first of said banks of addressable storage locations adapted for respectively temporarily storing soft MSBs of at least selected ones of said symbols of said baseband DTV signal in one of said selected M/H Slots, a second of said banks of addressable storage locations adapted for respectively temporarily storing soft Z-sub-1 bits of said symbols of said baseband DTV signal in one of said selected M/H Slots, a third of said banks of addressable storage locations adapted for respectively temporarily storing soft Z-sub-0 bits of said symbols of said baseband DTV signal in one of said selected M/H Slots, a fourth of said banks of addressable storage locations adapted for respectively temporarily storing soft extrinsic data regarding soft bits of M/H-service data, and a fifth of said banks of addressable storage locations adapted for respectively temporarily storing soft bits of said post-comb filter response to said MSBs of symbols of said baseband DTV signal in one of said selected M/H Slots;

a unit for writing into said first bank of addressable storage locations for temporary storage therein said first stream of soft MSBs of respective ones of said symbols in each successively selected M/H Slot, for writing into said second bank of addressable storage locations for temporary storage therein said second stream of soft Z-sub-1 bits of respective ones of said symbols in each successively selected M/H Slot, for writing into said third bank of addressable storage locations for temporary storage therein said third stream of soft Z-sub-0 bits of respective ones of said symbols in each successively selected M/H Slot, and for writing into said fifth bank of addressable storage locations for temporary storage therein successive soft bits of post-comb filter response to said soft MSBs of respective ones of said symbols in each successively selected M/H Slot;

an inner-coding input/output unit for said banked turbo decoder memory, said inner-coding input/output unit operable for reading soft Z-sub-1 bits and corresponding soft extrinsic data if any from said second and said fourth banks of addressable storage locations in said banked turbo decoder memory concurrently with reading soft Z-sub-0 bits from said third bank of addressable storage locations in said banked turbo decoder memory, said inner-coding input/output unit further operable for combining soft Z-sub-1 bits and corresponding soft extrinsic data to generate adjusted Z-sub-1 bits supplied together with said soft Z-sub-0 bits read from said banked turbo decoder memory to said SISO decoding apparatus as inner convolutional coding to be decoded, said inner-coding input/output unit further operable for over-writing soft Z-sub-1 bits temporarily stored in said second bank of addressable storage locations with soft Z-sub-1 bits that result from said SISO decoding apparatus decoding said inner convolutional coding;

apparatus for reading to said RS decoding apparatus from said second and fifth banks of said banked turbo decoder memory successive non-systematic ones of (207, 187) Reed-Solomon codewords within each successively selected M/H Slot of said baseband DTV signal and for writing said soft Z-sub-1 bits with high confidence levels back to said second bank of said banked turbo decoder memory for updating its contents;

an outer-coding input/output unit for said banked turbo decoder memory, said outer-coding input/output unit operable for reading selected ones of said soft MSBs from said first bank of addressable storage locations in said banked turbo decoder memory concurrently with reading selected ones of said soft Z-sub-1 bits from said second bank of addressable storage locations in said banked turbo decoder memory, said selected ones of said soft MSBs and said selected ones of said soft Z-sub-1 bits read from said banked turbo decoder memory being selected so as to obtain said symbol-interleaved outer convolutional coding for de-interleaving by said symbol de-interleaver to regenerate said outer convolutional coding for decoding by said SISO decoding apparatus, said outer-coding input/output unit operable for writing extrinsic data concerning said soft bits of M/H-service data into said fourth bank of addressable storage locations in said banked turbo decoder memory; and an extrinsic data feedback processor for differentially combining said selected ones of said soft Z-sub-1 bits read from said banked turbo decoder memory with soft M/H-service data bits decoded from said outer convolutional coding and re-interleaved by said symbol interleaver, thus to generate said extrinsic data concerning said soft bits of M/H-service data that said outer-coding input/output unit is operable for writing into said fourth bank of addressable storage locations in said banked turbo decoder memory.

7. An M/H receiver as set forth in claim 6, suited for receiving PCCC transmissions of M/H-service data in which symbols of the outer convolutional coding have been subjected to Gray-to-binary-code re-mapping, said M/H receiver further comprising:

a binary-to-Gray-code re-mapper connected for re-mapping symbols of said symbol-interleaved outer convolutional coding from natural-binary-code format to Gray-code format before being de-interleaved by said symbol de-interleaver;

a Gray-to-binary-code re-mapper connected for re-mapping said soft bits of M/H-service data decoded by said SISO decoding apparatus to natural-binary-code format after being re-interleaved by said symbol interleaver and before said selected ones of said soft Z-sub-1 bits read from said banked turbo decoder memory are differentially combined therewith by said extrinsic data feedback processor.

8. An M/H receiver as set forth in claim 7, wherein said SISO decoding apparatus comprises:

an inner SISO decoder connected for decoding said inner convolutional coding composed of adjusted Z-sub-1 bits supplied together with said soft Z-sub-0 bits from said inner-coding input/output unit for said banked turbo decoder memory; and an outer SISO decoder connected for decoding said outer convolutional coding as de-interleaved by said symbol de-interleaver.

9. An M/H receiver as set forth in claim 7, wherein said hard-data-bits selector is connected for selecting hard bits of M/H-service data from a final set of soft bits of M/H-service data for said slot selected for reception, as supplied from said binary-to-Gray-code re-mapper.

10. An M/H receiver as set forth in claim 7, wherein said hard-data-bits selector is connected for selecting hard bits of M/H-service data from said final set of soft bits of M/H-service data for said slot selected for reception, as supplied from said symbol interleaver.

11. An M/H receiver as set forth in claim 1, wherein said turbo decoding apparatus further comprises:

a banked turbo decoder memory having a plurality of banks of addressable storage locations for temporarily storing soft bits, a first of said banks of addressable storage locations adapted for respectively temporarily storing soft MSBs of at least selected ones of said symbols of said baseband DTV signal in one of said selected M/H Slots, a second of said banks of addressable storage locations adapted for respectively temporarily storing soft Z-sub-1 bits of said symbols of said baseband DTV signal in one of said selected M/H Slots, a third of said banks of addressable storage locations adapted for respectively temporarily storing soft Z-sub-0 bits of said symbols of said baseband DTV signal in one of said selected M/H Slots, a fourth of said banks of addressable storage locations adapted for respectively temporarily storing soft extrinsic data regarding soft bits of M/H-service data, and a fifth of said banks of addressable storage locations adapted for respectively temporarily storing soft bits of said post-comb filter response to said MSBs of symbols of said baseband DTV signal in one of said selected M/H Slots;

a unit for writing into said first bank of addressable storage locations for temporary storage therein said first stream of soft MSBs of respective ones of said symbols in each successively selected M/H Slot, for writing into said second bank of addressable storage locations for temporary storage therein said second stream of soft Z-sub-1 bits of respective ones of said symbols in each successively selected M/H Slot, for writing into said third bank of addressable storage locations for temporary storage therein said third stream of soft Z-sub-0 bits of respective ones of said symbols in each successively selected M/H Slot, and for writing into said fifth bank of addressable storage locations for temporary storage therein successive soft bits of post-comb filter response to said soft MSBs of respective ones of said symbols in each successively selected M/H Slot;

an inner-coding input/output unit for said banked turbo decoder memory, said inner-coding input/output unit operable for reading soft Z-sub-1 bits and corresponding soft extrinsic data if any from said second and said fourth banks of addressable storage locations in said banked turbo decoder memory concurrently with reading soft Z-sub-0 bits from said third bank of addressable storage locations in said banked turbo decoder memory, said inner-coding input/output unit further operable for combining soft Z-sub-1 bits and corresponding soft extrinsic data to generate adjusted Z-sub-1 bits supplied together with said soft Z-sub-0 bits read from said banked turbo decoder memory to said SISO decoding apparatus as inner convolutional coding to be decoded, said inner-coding input/output unit further operable for over-writing soft Z-sub-1 bits temporarily stored in said second bank of addressable storage locations with soft Z-sub-1 bits that result from said SISO decoding apparatus decoding said inner convolutional coding;

apparatus for reading to said RS decoding apparatus from said second and fifth banks of said banked turbo decoder memory successive non-systematic ones of (207, 187) Reed-Solomon codewords within each successively selected M/H Slot of said baseband DTV signal and for writing said soft Z-sub-1 bits with high confidence levels back to said second bank of said banked turbo decoder memory for updating its contents;

a de-interleaved outer-coding input/output unit for said banked turbo decoder memory, said de-interleaved outer-coding input/output unit operable for reading selected ones of said soft MSBs from said first bank of addressable storage locations in said banked turbo decoder memory concurrently with reading selected ones of said soft Z-sub-1 bits from said second bank of addressable storage locations in said banked turbo decoder memory, said selected ones of said soft MSBs and said selected ones of said soft Z-sub-1 bits read from said banked turbo decoder memory being selected so as to obtain outer convolutional coding for decoding by said SISO decoding apparatus, said de-interleaved outer-coding input/output unit operable for writing extrinsic data concerning said soft bits of M/H-service data into said fourth bank of addressable storage locations in said banked turbo decoder memory; and an extrinsic data feedback processor for differentially combining said selected ones of said soft Z-sub-1 bits read from said banked turbo decoder memory with soft M/H-service data bits decoded from said outer convolutional coding by said SISO decoding apparatus, thus to generate said extrinsic data concerning said soft bits of M/H-service data that said de-interleaved outer-coding input/output unit is operable for writing into said fourth bank of addressable storage locations in said banked turbo decoder memory so as to be symbol re-interleaved.

12. An M/H receiver as set forth in claim 11, suited for receiving PCCC transmissions of M/H-service data in which symbols of the outer convolutional coding have been subjected to Gray-to-binary-code re-mapping, said M/H receiver further comprising:

a first binary-to-Gray-code re-mapper connected for re-mapping symbols of said outer convolutional coding from natural-binary-code format to Gray-code format before being decoded by said SISO decoding apparatus;

a Gray-to-binary-code re-mapper connected for re-mapping said soft bits of M/H-service data decoded by said SISO decoding apparatus to natural-binary-code format before said selected ones of said soft Z-sub-1 bits read from said banked turbo decoder memory are differentially combined therewith by said extrinsic data feedback processor;

an interleaved outer-coding output unit for said banked turbo decoder memory, said interleaved outer-coding output unit operable for reading selected MSBs from said first bank of addressable storage locations in said banked turbo decoder memory concurrently with reading selected ones of said soft Z-sub-1 bits from said second bank of addressable storage locations in said banked turbo decoder memory, said reading from said first and second banks of said banked turbo decoder memory to said interleaved outer-coding output unit being performed at the conclusion of turbo decoding procedures for the slot selected for reception to supply symbol-interleaved outer convolutional coding from said interleaved outer-coding output unit as its output signal; and a second binary-to-Gray-code re-mapper connected for re-mapping said output signal of said interleaved outer-coding output unit from natural-binary-code format to Gray-code format, said second binary-to-Gray-code re-mapper further connected for supplying re-mapped soft Z-sub-1 bits to said hard-data-bits selector, which is operable for selecting hard bits of M/H-service data from said re-mapped soft Z-sub-1 bits.

13. An M/H receiver as set forth in claim 12, wherein said SISO decoding apparatus comprises:

an inner SISO decoder connected for decoding said inner convolutional coding, as conveyed by said adjusted Z-sub-1 bits supplied together with said soft Z-sub-0 bits from said inner-coding input/output unit for said banked turbo decoder memory; and an outer SISO decoder connected for decoding symbols of said outer convolutional coding as symbol de-interleaved and re-mapped by said first binary-to-Gray-code re-mapper.

14. An M/H receiver as set forth in claim 1, wherein said post-comb filter unit is operable for generating successive soft bits of post-comb filter response to said MSBs of respective ones of said symbols of said baseband DTV signal in said selected M/H Slots as updated by soft computed X-sub-2 bits each cycle of turbo decoding procedure, and wherein said turbo decoding apparatus further comprises:

a banked turbo decoder memory having a plurality of banks of addressable storage locations for temporarily storing soft bits, a first of said banks of addressable storage locations adapted for respectively temporarily storing soft MSBs of at least selected ones of said symbols of said baseband DTV signal in one of said selected M/H Slots, a second of said banks of addressable storage locations adapted for respectively temporarily storing soft Z-sub-1 bits of said symbols of said baseband DTV signal in one of said selected M/H Slots, a third of said banks of addressable storage locations adapted for respectively temporarily storing soft Z-sub-0 bits of said symbols of said baseband DTV signal in one of said selected M/H Slots, a fourth of said banks of addressable storage locations adapted for respectively temporarily storing soft extrinsic data regarding soft bits of M/H-service data, a fifth of said banks of addressable storage locations adapted for respectively temporarily storing soft bits of said post-comb filter response to said MSBs of symbols of said baseband DTV signal in one of said selected M/H Slots, and a sixth of said banks of addressable storage locations adapted for respectively temporarily storing soft delta X-sub-2 bits;

a unit for writing into said first bank of addressable storage locations for temporary storage therein said first stream of soft MSBs of respective ones of said symbols in each successively selected M/H Slot, for writing into said second bank of addressable storage locations for temporary storage therein said second stream of soft Z-sub-1 bits of respective ones of said symbols in each successively selected M/H Slot, and for writing into said third bank of addressable storage locations for temporary storage therein said third stream of soft Z-sub-0 bits of respective ones of said symbols in each successively selected M/H Slot;

an inner-coding input/output unit for said banked turbo decoder memory, said inner-coding input/output unit operable for reading soft Z-sub-1 bits and corresponding soft extrinsic data if any from said second and said fourth banks of addressable storage locations in said banked turbo decoder memory concurrently with reading soft Z-sub-0 bits from said third bank of addressable storage locations in said banked turbo decoder memory, said inner-coding input/output unit further operable for combining soft Z-sub-1 bits and corresponding soft extrinsic data to generate adjusted Z-sub-1 bits supplied together with said soft Z-sub-0 bits read from said banked turbo decoder memory to said SISO decoding apparatus as inner convolutional coding to be decoded, said inner-coding input/output unit further operable for over-writing soft Z-sub-1 bits temporarily stored in said second bank of addressable storage locations with soft Z-sub-1 bits that result from said SISO decoding apparatus decoding said inner convolutional coding;

apparatus for reading to said RS decoding apparatus from said second and fifth banks of said banked turbo decoder memory successive non-systematic ones of (207, 187) Reed-Solomon codewords within each successively selected M/H Slot of said baseband DTV signal and for writing said soft Z-sub-1 bits with high confidence levels back to said second bank of said banked turbo decoder memory for updating its contents;

a de-interleaved outer-coding input/output unit for said banked turbo decoder memory, said de-interleaved outer-coding input/output unit operable for reading selected ones of said soft MSBs from said first bank of addressable storage locations in said banked turbo decoder memory concurrently with reading selected ones of said soft Z-sub-1 bits from said second bank of addressable storage locations in said banked turbo decoder memory, said selected ones of said soft MSBs and said selected ones of said soft Z-sub-1 bits read from said banked turbo decoder memory being selected so as to obtain outer convolutional coding for decoding by said SISO decoding apparatus, said de-interleaved outer-coding input/output unit operable for writing extrinsic data concerning said soft bits of M/H-service data into said fourth bank of addressable storage locations in said banked turbo decoder memory, said de-interleaved outer-coding input/output unit further operable for writing soft delta X-sub-2 bits into said sixth bank of addressable storage locations in said banked turbo decoder memory;

an extrinsic data feedback processor for differentially combining said selected ones of said soft Z-sub-1 bits read from said banked turbo decoder memory with soft M/H-service data bits decoded from said outer convolutional coding by said SISO decoding apparatus, thus to generate said extrinsic data concerning said soft bits of M/H-service data that said de-interleaved outer-coding input/output unit is operable for writing into said fourth bank of addressable storage locations in said banked turbo decoder memory;

a one-half-rate convolutional code encoder, connected for generating soft computed X-sub-2 bits responsive to Z-sub-1 bits decoded from said outer convolutional coding by said SISO decoding apparatus; and a delta X-sub-2 feedback processor for differentially combining said selected ones of said soft MSBs read from said first bank of addressable storage locations in said turbo decoder memory with said soft computed X-sub-2 bits to generate said soft delta X-sub-2 bits that said de-interleaved outer-coding input/output unit is operable for writing into said sixth bank of addressable storage locations in said banked turbo decoder memory.

15. An M/H receiver as set forth in claim 14, suited for receiving PCCC transmissions of M/H-service data in which symbols of the outer convolutional coding have been subjected to Gray-to-binary-code re-mapping, said M/H receiver further comprising:

a first binary-to-Gray-code re-mapper connected for re-mapping symbols of said outer convolutional coding from natural-binary-code format to Gray-code format before being decoded by said SISO decoding apparatus;

a Gray-to-binary-code re-mapper connected for re-mapping said soft bits of M/H-service data decoded by said SISO decoding apparatus to natural-binary-code format before said selected ones of said soft Z-sub-1 bits read from said banked turbo decoder memory are differentially combined therewith by said extrinsic data feedback processor;

an interleaved outer-coding output unit for said banked turbo decoder memory, said interleaved outer-coding output unit operable for reading selected MSBs from said first bank of addressable storage locations in said banked turbo decoder memory concurrently with reading selected ones of said soft Z-sub-1 bits from said second bank of addressable storage locations in said banked turbo decoder memory, said reading from said first and second banks of said banked turbo decoder memory to said interleaved outer-coding output unit being performed at the conclusion of turbo decoding procedures for the slot selected for reception to supply symbol-interleaved outer convolutional coding from said interleaved outer-coding output unit as its output signal; and a second binary-to-Gray-code re-mapper connected for re-mapping said output signal of said interleaved outer-coding output unit from natural-binary-code format to Gray-code format, said second binary-to-Gray-code re-mapper further connected for supplying re-mapped soft Z-sub-1 bits to said hard-data-bits selector, which is operable for selecting hard bits of M/H-service data from said re-mapped soft Z-sub-1 bits.

16. An M/H receiver as set forth in claim 15, wherein said SISO decoding apparatus comprises:

an inner SISO decoder connected for decoding said inner convolutional coding, as conveyed by said adjusted Z-sub-1 bits supplied together with said soft Z-sub-0 bits from said inner-coding input/output unit for said banked turbo decoder memory; and an outer SISO decoder connected for decoding symbols of said outer convolutional coding as symbol de-interleaved and re-mapped by said first binary-to-Gray-code re-mapper.

17. A receiver for parallel concatenated convolutionally coded (PCCC) mobile-handheld M/H-service data imbedded in digital television (DTV) signals also conveying main-service data, said DTV signals being transmitted as 8-level vestigial-sideband amplitude-modulated (8-VSB) radio-frequency carrier waves, said PCCC transmissions of M/H-service data intended to be received and decoded by mobile and hand-held receivers collectively referred to as M/H receivers, said receiver being an M/H receiver comprising:

a tuner for receiving a selected one of 8-VSB DTV signals broadcast at radio frequencies and converting it to a baseband DTV signal comprising M/H Slots of signal selected from successive data fields of convolutionally byte-interleaved 207-byte data segments;

a data slicer connected for performing 8-level data slicing of successive Nyquist-rate symbols of said baseband DTV signal in said selected M/H Slots to generate a first stream of soft most significant bits (MSBs) of respective ones of said symbols of said baseband DTV signal in said selected M/H Slots, a second stream of soft Z-sub-1 bits that are of intermediate significance in regard to said respective ones of said symbols of said baseband DTV signal in said selected M/H Slots, and a third stream of soft Z-sub-0 bits that are of least significance in regard to said respective ones of said symbols of said baseband DTV signal in said selected M/H Slots; and turbo decoding apparatus for decoding said parallel concatenated convolutionally coded M/H-service data contained in said baseband DTV signal, said turbo decoding apparatus comprising:

a symbol de-interleaver for outer convolutional coding of said parallel concatenated convolutionally coded M/H-service data conveyed in symbol-interleaved format by said soft MSBs and said soft Z-sub-1 bits within said baseband DTV signal, thus to regenerate outer convolutional coding of said parallel concatenated convolutionally coded M/H-service data;

soft-input/soft-output (SISO) decoding apparatus, said SISO decoding apparatus operable for decoding inner convolutional coding conveyed by said soft Z-sub-1 bits and said soft Z-sub-0 bits within said baseband DTV signal to generate a respective set of soft bits of M/H-service data each cycle of turbo decoding procedure, said SISO decoding apparatus further operable for decoding said regenerated outer convolutional coding of said parallel concatenated convolutionally coded M/H-service data to generate a respective set of soft bits of de-interleaved M/H-service data each cycle of turbo decoding procedure;

a symbol interleaver connected for re-interleaving each of said sets of soft bits of de-interleaved M/H-service data to be processed for providing turbo feedback in said turbo decoding apparatus;

a hard-data-bits selector for selecting hard bits of M/H-service data from a final set of soft bits of M/H-service data generated during each turbo decoding procedure for a respective one of said selected M/H Slots;

a banked turbo decoder memory having a plurality of banks of addressable storage locations for temporarily storing soft bits, a first of said banks of addressable storage locations adapted for respectively temporarily storing soft MSBs of at least selected ones of said symbols of said baseband DTV signal in one of said selected M/H Slots, a second of said banks of addressable storage locations adapted for respectively temporarily storing soft Z-sub-1 bits of said symbols of said baseband DTV signal in one of said selected M/H Slots, a third of said banks of addressable storage locations adapted for respectively temporarily storing soft Z-sub-0 bits of said symbols of said baseband DTV signal in one of said selected M/H Slots, and a fourth of said banks of addressable storage locations adapted for respectively temporarily storing soft extrinsic data regarding soft bits of M/H-service data;

a unit for writing into said first bank of addressable storage locations for temporary storage therein said first stream of soft MSBs of respective ones of said symbols in each successively selected M/H Slot, for writing into said second bank of addressable storage locations for temporary storage therein said second stream of soft Z-sub-1 bits of respective ones of said symbols in each successively selected M/H Slot, and for writing into said third bank of addressable storage locations for temporary storage therein said third stream of soft Z-sub-0 bits of respective ones of said symbols in each successively selected M/H Slot;

an inner-coding input/output unit for said banked turbo decoder memory, said inner-coding input/output unit operable for reading soft Z-sub-1 bits and corresponding soft extrinsic data if any from said second and said fourth banks of addressable storage locations in said banked turbo decoder memory concurrently with reading soft Z-sub-0bits from said third bank of addressable storage locations in said banked turbo decoder memory, said inner-coding input/output unit further operable for combining soft Z-sub-1 bits and corresponding soft extrinsic data to generate adjusted Z-sub-1bits supplied together with said soft Z-sub-0 bits read from said banked turbo decoder memory to said SISO decoding apparatus as inner convolutional coding to be decoded, said inner-coding input/output unit further operable for over-writing soft Z-sub-1 bits temporarily stored in said second bank of addressable storage locations with soft Z-sub-1 bits that result from said SISO decoding apparatus decoding said inner convolutional coding;

an outer-coding input/output unit for said banked turbo decoder memory, said outer-coding input/output unit operable for reading selected ones of said soft MSBs from said first bank of addressable storage locations in said banked turbo decoder memory concurrently with reading selected ones of said soft Z-sub-1 bits from said second bank of addressable storage locations in said banked turbo decoder memory, said selected ones of said soft MSBs and said selected ones of said soft Z-sub-1 bits read from said banked turbo decoder memory being selected so as to obtain said symbol-interleaved outer convolutional coding for de-interleaving by said symbol de-interleaver to regenerate said outer convolutional coding for decoding by said SISO decoding apparatus, said outer-coding input/output unit operable for writing extrinsic data concerning said soft bits of M/H-service data into said fourth bank of addressable storage locations in said banked turbo decoder memory; and an extrinsic data feedback processor for differentially combining said selected ones of said soft Z-sub-1 bits read from said banked turbo decoder memory with soft M/H-service data bits decoded from said outer convolutional coding and re-interleaved by said symbol interleaver, thus to generate said extrinsic data concerning said soft bits of M/H-service data that said outer-coding input/output unit is operable for writing into said fourth bank of addressable storage locations in said banked turbo decoder memory.

18. An M/H receiver as set forth in claim 17, suited for receiving PCCC transmissions of M/H-service data in which symbols of the outer convolutional coding have been subjected to Gray-to-binary-code re-mapping, said M/H receiver further comprising:

a binary-to-Gray-code re-mapper connected for re-mapping symbols of said symbol-interleaved outer convolutional coding from natural-binary-code format to Gray-code format before being de-interleaved by said symbol de-interleaver;

a Gray-to-binary-code re-mapper connected for re-mapping said soft bits of M/H-service data decoded by said SISO decoding apparatus to natural-binary-code format after being re-interleaved by said symbol interleaver and before said selected ones of said soft Z-sub-1 bits read from said banked turbo decoder memory are differentially combined therewith by said extrinsic data feedback processor.

19. An M/H receiver as set forth in claim 18, wherein said hard-data-bits selector is connected for selecting hard bits of M/H-service data from a final set of soft bits of M/H-service data for said slot selected for reception, as supplied from said binary-to-Gray-code re-mapper.

20. An M/H receiver as set forth in claim 18, wherein said hard-data-bits selector is connected for selecting hard bits of M/H-service data from said final set of soft bits of M/H-service data for said slot selected for reception, as supplied from said symbol interleaver.

21. A receiver for parallel concatenated convolutionally coded (PCCC) mobile-handheld M/H-service data imbedded in digital television (DTV) signals also conveying main-service data, said DTV signals being transmitted as 8-level vestigial-sideband amplitude-modulated (8-VSB) radio-frequency carrier waves, said PCCC transmissions of M/H-service data intended to be received and decoded by mobile and hand-held receivers collectively referred to as M/H receivers, said receiver being an M/H receiver comprising:

a tuner for receiving a selected one of 8-VSB DTV signals broadcast at radio frequencies and converting it to a baseband DTV signal comprising M/H Slots of signal selected from successive data fields of convolutionally byte-interleaved 207-byte data segments;

a data slicer connected for performing 8-level data slicing of successive Nyquist-rate symbols of said baseband DTV signal in said selected M/H Slots to generate a first stream of soft most significant bits (MSBs) of respective ones of said symbols of said baseband DTV signal in said selected M/H Slots, a second stream of soft Z-sub-1 bits that are of intermediate significance in regard to said respective ones of said symbols of said baseband DTV signal in said selected M/H Slots, and a third stream of soft Z-sub-0 bits that are of least significance in regard to said respective ones of said symbols of said baseband DTV signal in said selected M/H Slots; and turbo decoding apparatus for decoding said parallel concatenated convolutionally coded M/H-service data contained in said baseband DTV signal, said turbo decoding apparatus comprising:

a banked turbo decoder memory having a plurality of banks of addressable storage locations for temporarily storing soft bits, a first of said banks of addressable storage locations adapted for respectively temporarily storing soft MSBs of at least selected ones of said symbols of said baseband DTV signal in one of said selected M/H Slots, a second of said banks of addressable storage locations adapted for respectively temporarily storing soft Z-sub-1 bits of said symbols of said baseband DTV signal in one of said selected M/H Slots, a third of said banks of addressable storage locations adapted for respectively temporarily storing soft Z-sub-0 bits of said symbols of said baseband DTV signal in one of said selected M/H Slots, and a fourth of said banks of addressable storage locations adapted for respectively temporarily storing soft extrinsic data regarding soft bits of M/H-service data;

a unit for writing into said first bank of addressable storage locations for temporary storage therein said first stream of soft MSBs of respective ones of said symbols in each successively selected M/H Slot, for writing into said second bank of addressable storage locations for temporary storage therein said second stream of soft Z-sub-1 bits of respective ones of said symbols in each successively selected M/H Slot, and for writing into said third bank of addressable storage locations for temporary storage therein said third stream of soft Z-sub-0 bits of respective ones of said symbols in each successively selected M/H Slot;

an inner-coding input/output unit for said banked turbo decoder memory, said inner-coding input/output unit operable for reading soft Z-sub-1 bits and corresponding soft extrinsic data if any from said second and said fourth banks of addressable storage locations in said banked turbo decoder memory concurrently with reading soft Z-sub-0 bits from said third bank of addressable storage locations in said banked turbo decoder memory, said inner-coding input/output unit further operable for combining soft Z-sub-1 bits and corresponding soft extrinsic data to generate adjusted Z-sub-1 bits supplied together with said soft Z-sub-0 bits read from said banked turbo decoder memory to said SISO decoding apparatus as inner convolutional coding to be decoded, said inner-coding input/output unit further operable for over-writing soft Z-sub-1 bits temporarily stored in said second bank of addressable storage locations with soft Z-sub-1 bits that result from said SISO decoding apparatus decoding said inner convolutional coding;

a de-interleaved outer-coding input/output unit for said banked turbo decoder memory, said de-interleaved outer-coding input/output unit operable for reading selected ones of said soft MSBs from said first bank of addressable storage locations in said banked turbo decoder memory concurrently with reading selected ones of said soft Z-sub-1 bits from said second bank of addressable storage locations in said banked turbo decoder memory, said selected ones of said soft MSBs and said selected ones of said soft Z-sub-1 bits read from said banked turbo decoder memory being selected so as to obtain outer convolutional coding for decoding by said SISO decoding apparatus, said de-interleaved outer-coding input/output unit operable for writing extrinsic data concerning said soft bits of M/H-service data into said fourth bank of addressable storage locations in said banked turbo decoder memory; and an extrinsic data feedback processor for differentially combining said selected ones of said soft Z-sub-1 bits read from said banked turbo decoder memory with soft M/H-service data bits decoded from said outer convolutional coding by said SISO decoding apparatus, thus to generate said extrinsic data concerning said soft bits of M/H-service data that said de-interleaved outer-coding input/output unit is operable for writing into said fourth bank of addressable storage locations in said banked turbo decoder memory so as to be symbol re-interleaved.

22. An M/H receiver as set forth in claim 21, suited for receiving PCCC transmissions of M/H-service data in which symbols of the outer convolutional coding have been subjected to Gray-to-binary-code re-mapping, said M/H receiver further comprising:

a first binary-to-Gray-code re-mapper connected for re-mapping symbols of said outer convolutional coding from natural-binary-code format to Gray-code format before being decoded by said SISO decoding apparatus;

a Gray-to-binary-code re-mapper connected for re-mapping said soft bits of M/H-service data decoded by said SISO decoding apparatus to natural-binary-code format before said selected ones of said soft Z-sub-1 bits read from said banked turbo decoder memory are differentially combined therewith by said extrinsic data feedback processor;

an interleaved outer-coding output unit for said banked turbo decoder memory, said interleaved outer-coding output unit operable for reading selected MSBs from said first bank of addressable storage locations in said banked turbo decoder memory concurrently with reading selected ones of said soft Z-sub-1 bits from said second bank of addressable storage locations in said banked turbo decoder memory, said reading from said first and second banks of said banked turbo decoder memory to said interleaved outer-coding output unit being performed at the conclusion of turbo decoding procedures for the slot selected for reception to supply symbol-interleaved outer convolutional coding from said interleaved outer-coding output unit as its output signal; and a second binary-to-Gray-code re-mapper connected for re-mapping said output signal of said interleaved outer-coding output unit from natural-binary-code format to Gray-code format, said second binary-to-Gray-code re-mapper further connected for supplying re-mapped soft Z-sub-1 bits to said hard-data-bits selector, which is operable for selecting hard bits of M/H-service data from said re-mapped soft Z-sub-1 bits.

23. An M/H receiver as set forth in claim 22, wherein said SISO decoding apparatus comprises:

an inner SISO decoder connected for decoding said inner convolutional coding, as conveyed by said adjusted $Z$-sub-1 bits supplied together with said soft $Z$-sub-0 bits from said inner-coding input/output unit for said banked turbo decoder memory; and an outer SISO decoder connected for decoding symbols of said outer convolutional coding as symbol de-interleaved and re-mapped by said first binary-to-Gray-code re-mapper.

* * * * *